United States Patent
Ooishi

(10) Patent No.: US 6,404,258 B2
(45) Date of Patent: Jun. 11, 2002

(54) DELAY CIRCUIT HAVING LOW OPERATING ENVIRONMENT DEPENDENCY

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/735,635

(22) Filed: Dec. 14, 2000

(30) Foreign Application Priority Data

May 26, 2000 (JP) ........................................ 2000-156102

(51) Int. Cl.[7] .............................................. H03H 11/26
(52) U.S. Cl. ........................................ 327/278; 327/264
(58) Field of Search ................................ 327/264, 268, 327/270, 272, 271, 276, 277, 278, 281, 283, 288, 290, 111, 112, 161

(56) References Cited

U.S. PATENT DOCUMENTS

| | | | | |
|---|---|---|---|---|
| 5,220,216 A | * | 6/1993 | Woo | 327/278 |
| 5,739,707 A | * | 4/1998 | Barraclough | 327/112 |
| 5,770,960 A | * | 6/1998 | Iadanza et al. | 327/281 |
| 5,783,956 A | * | 7/1998 | Ooishi | 327/276 |
| 5,949,292 A | * | 9/1999 | Fahrenbruch et al. | 327/278 |
| 5,973,533 A | * | 10/1999 | Nagaoka | 327/263 |
| 6,054,885 A | * | 4/2000 | Ooishi et al. | 327/291 |

FOREIGN PATENT DOCUMENTS

| | | |
|---|---|---|
| JP | 7-154221 | 6/1995 |
| JP | 8-70241 | 3/1996 |

* cited by examiner

*Primary Examiner*—Toan Tran
*Assistant Examiner*—Linh Nguyen
(74) *Attorney, Agent, or Firm*—McDermott, Will & Emery

(57) ABSTRACT

In the delay circuit of an inverter chain, the change in the output node of an inverter circuit is suppressed until the voltage of the output node or the output signal of another inverter circuit located downstream by an odd number of stages is inverted in logic. Thus, the delay circuit having a constant delay time regardless of the operating environment such as the power-supply voltage and the operating temperature can be implemented.

7 Claims, 30 Drawing Sheets

THIS PORTION MAY BE A SINGLE DELAY STAGE

THIS PORTION MAY BE A SINGLE DELAY STAGE

FIG. 45
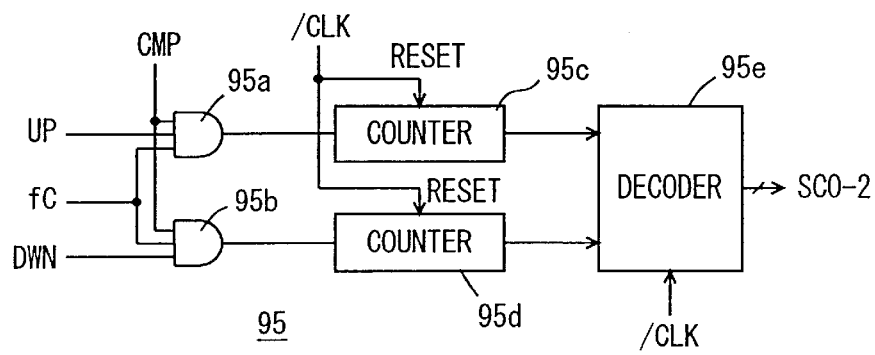
FIG. 46
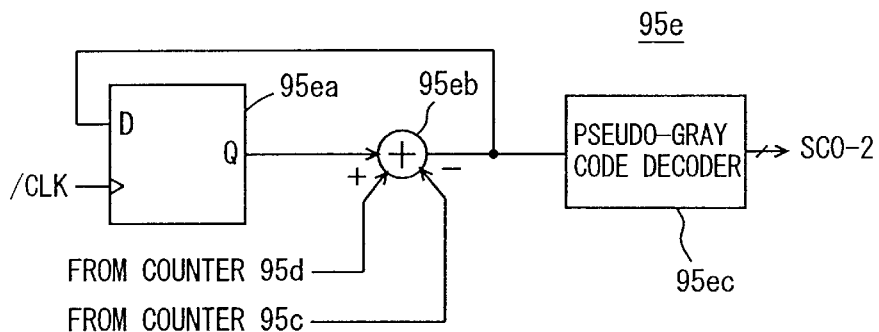
FIG. 47
| | 0 | 1 | 2 | 3 | 4 | 5 | 6 | 7 | 8 | 9 |
|---|---|---|---|---|---|---|---|---|---|---|
| SC0 | 0 | (1) | (1) | (1) | 0 | 1 | 0 | 1 | 0 | 1 |
| SC1 | 0 | 0 | 1 | 0 | (1) | (1) | 0 | 0 | (1) | (1) |
| SC2 | 0 | 0 | 0 | 1 | (1) | (1) | (1) | (1) | (1) | (1) |
| SC3 | 0 | 0 | 0 | 0 | 0 | 0 | (1) | (1) | (1) | (1) |
| SC4 | 0 | 0 | 0 | 0 | 0 | 0 | 0 | 0 | 0 | 0 |
CURRENT INCREASE ↓
↑ DEFAULT VALUE FIG. 49
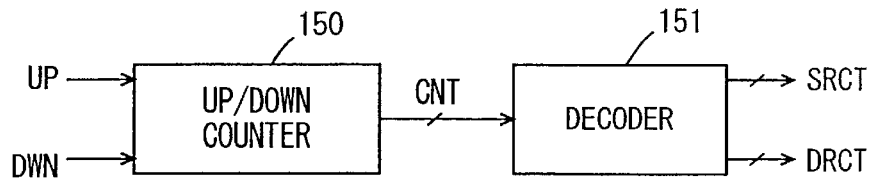
95
FIG. 50
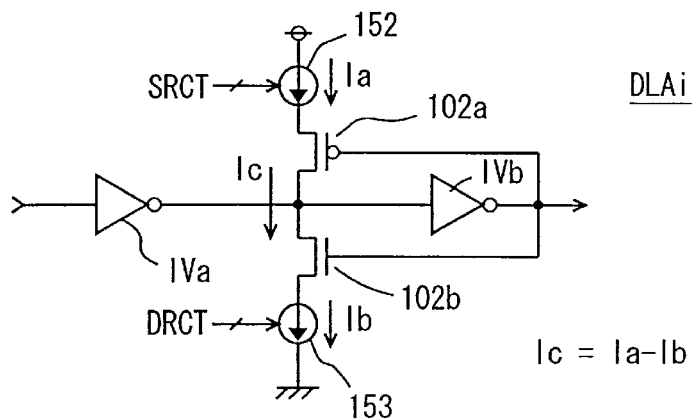
$Ic = Ia - Ib$
FIG. 51
| CNT | SRCT | DRCT |
|---|---|---|
| 0 0 0 0 | 0 0 0 0 | 0 0 0 0 |
| 0 0 0 1 | 0 0 1 0 | 0 0 0 1 |
| 0 0 1 0 | 0 1 1 0 | 0 1 0 1 |
| 0 0 1 1 | 0 1 0 0 | 0 0 0 1 |
| 0 1 0 0 | 1 1 0 0 | 1 0 0 0 |
| 0 1 0 1 | 1 1 1 0 | 1 0 0 1 |
| 0 1 1 0 | 1 0 1 0 | 0 1 1 0 |
| 0 1 1 1 | 1 0 0 0 | 0 0 0 1 |
| 1 0 0 0 | 1 0 0 0 | 0 0 0 0 |
| 1 0 0 1 | 1 0 1 0 | 0 0 0 1 |
| 1 0 1 0 | 1 1 1 0 | 0 1 0 0 |
| 1 0 1 1 | 1 1 0 0 | 0 0 0 1 |
| 1 1 0 0 | 1 1 0 0 | 0 0 0 0 |
| 1 1 0 1 | 1 1 0 1 | 0 0 0 0 |
| 1 1 1 0 | 1 1 1 1 | 0 0 0 1 |
| 1 1 1 1 | 1 1 1 1 | 0 0 0 0 |

DELAY CIRCUIT HAVING LOW OPERATING ENVIRONMENT DEPENDENCY

BACKGROUND OF THE INVENTION

1. Field of the Invention

The present invention relates to a delay circuit, and more specifically, to a delay circuit that has a low dependence on the operating environment such as a power-supply voltage and an operating temperature.

2. Description of the Background Art

In a semiconductor device, delay circuits are used in various portions in order to delay the signals by prescribed period of time. A delay circuit is used for such purpose as adjusting the timing of a signal. For instance, a delay circuit is used as follows in a processing system including a clock synchronous semiconductor memory device that performs signal/data transfer in synchronization with a clock signal. Normally, in a processing system, the distance between a processor (or a memory controller) and the respective clock synchronous semiconductor memory devices varies from device to device. If the clock signal is a common clock signal such as a system clock, the timing, relative to the clock signal, at which a signal/data from a semiconductor memory device arrives at the processor varies depending on the distance between each semiconductor memory device and the processor (or the memory controller). In order to match the arrival timing of the signal/data relative to the clock signal throughout all the semiconductor memory devices by compensating for the time difference in the arrival timing, a delay circuit such as one called vernier is employed within the semiconductor memory devices. Using this vernier, the output timings of the signal/data is adjusted so as to match the timings of the signal arrival at the processor (or the memory controller) among semiconductor memory devices.

FIG. 55 is a diagram representing an example of the arrangement of a conventional delay circuit. In FIG. 55, the delay circuit includes an inverter circuit 900 for inverting an input signal IN and transmitting the inverted signal onto an internal node 901, an inverter circuit 903 for inverting the signal on node 901 to produce an output signal OUT, and a capacitance element 902 connected between node 901 and a ground node.

Inverter circuits 900 and 903 have an identical CMOS arrangement, and the arrangement of inverter circuit 900 is representatively shown in FIG. 55. Inverter circuit 900 includes a P-channel MOS transistor (insulated gate type field effect transistor) PQ connected between a power-supply node and node 901 and receiving input signal IN at a gate, and an N-channel MOS transistor NQ connected between node 901 and a ground node and receiving input signal IN at a gate. These MOS transistors PQ and NQ have a resistance R when made conductive.

As shown in FIG. 56, when input signal IN is at a logic low or "L" level, node 901 is at a logic high or "H" level, and an electrode node, connected to node 901, of capacitance element 902 is charged to the power-supply voltage level. At this time, output signal OUT is at the L level.

When input signal IN rises to the H level, P-channel MOS transistor PQ transitions to the off state, while N-channel MOS transistor NQ attains the on state so that the accumulated charges in node 901 are discharged through MOS transistor NQ. The discharging rate of node 901 is determined by the capacitance value C of capacitance element 902 and the on-resistance (channel resistance when made conductive) R of MOS transistor NQ. When the voltage level of node 901 exceeds the input logic threshold voltage of inverter 903, output signal OUT rises from the L level to the H level.

On the other hand, when input signal IN falls from the H level to the L level, capacitance element 902 is charged via P-channel MOS transistor PQ. The rate at which the voltage level of node 901 rises is determined by the on-resistance R of MOS transistor PQ and capacitance value C of capacitance element 902. When the voltage level of node 901 exceeds the input logic threshold voltage of inverter 903, output signal OUT falls from the H level to the L level.

Thus, the time constant R·C determined by capacitance value C of capacitance element 902 and the on-resistances R of MOS transistors PQ and NQ determines the charging/discharging rate of node 901, and the delay time $\tau$ of output signal OUT relative to input signal IN is determined depending on the charging/discharging rate of node 901.

In the arrangement of the delay circuit shown in FIG. 55, the delay time is determined by the on-resistances R of MOS transistors PQ and NQ and capacitance value C of capacitance element 902. The on-resistances R of MOS transistors PQ and NQ, however, depend on the power-supply voltage Vcc. In other words, in the case of the N-channel MOS transistor NQ, although the on-resistance R is the smallest when its gate voltage is at power-supply voltage Vcc in operation, the on-resistance itself depends on its gate to source voltage (the channel inversion layer attains a deeper on state as the gate to source voltage becomes larger). On the other hand, in the case of the P-channel MOS transistor PQ, the on-resistance R is the smallest when input signal IN is at the L level (the ground voltage level) in operation. The on-resistance of P-channel MOS transistor PQ also is dependent on the gate to source voltage, and thus, is dependent on the power-supply voltage Vcc.

There is a permissible range of ±5%, for instance, for the power-supply voltage Vcc. When exact precision is not required for delay time $\tau$, this permissible range of the power-supply voltage does not cause a significant problem. The timing adjustment in a semiconductor device operating at a high speed, however, requires the precision on the order of ns (nano seconds) for delay time $\tau$. In this case, the dependency of delay time $\tau$ on power-supply voltage Vcc cannot be neglected, and it becomes impossible to ensure the accurate internal operation even when the power-supply voltage Vcc is within its permissible range.

In addition, on-resistances R of MOS transistors PQ and NQ also depend on the operating temperature such that, in general, the on-resistances R becomes lower when the operating temperature rises.

Particularly, when the semiconductor device operates in synchronization with a clock signal as in the case of a clock synchronous semiconductor memory device, the internal timing must be matched accurately. The accurate internal operation, however, cannot be ensured if the delay time of the delay circuit fluctuates according to the fluctuation of the operating environment such as the power-supply voltage and the operating temperature.

SUMMARY OF THE INVENTION

An object of the present invention is to provide a delay circuit that has a low dependence on the fluctuation of the operating environment.

Another object of the present invention is to provide a delay circuit with suppressed fluctuation of the delay time regardless of the fluctuation of the operating environment.

A still another object of the present invention is to provide a delay circuit of high precision that is used for the timing adjustment of internal signals such as an internal clock signal and an internal control signal in a clock synchronous semiconductor memory device.

According to a first aspect of the present invention, the delay circuit includes a drive circuit for driving an output node according to a first input signal. The voltage level of the output signal from this drive circuit changes between a first voltage level and a second voltage level.

According to the first aspect of the present invention, the delay circuit further includes a capacitance element, a delay control circuit coupled between the output node and the capacitance element for isolating the capacitance element from the output node when a signal on the output node is between a first voltage level and a prescribed voltage level between the first voltage level and a second voltage level and for coupling the capacitance element to the output node when the signal on the output node is between the prescribed voltage level and the second voltage level, and an auxiliary drive circuit for driving the output node in a direction opposite to the potential driven direction of the output node by the drive circuit according to a second input signal leading in phase relative to the first input signal when activated. The auxiliary drive circuit is rendered active in response to the signal on the output node, and is rendered inactivate when the signal on the output node is between the first voltage level and the prescribed voltage level.

According to a second aspect of the present invention, the semiconductor circuit device includes a reference voltage generating circuit for generating a reference voltage onto an output node, and a gate circuit that has a power-supply transistor for supplying an operating current according to the reference voltage and generates an output signal according to an input signal. The reference voltage generating circuit includes a first resistance element connected between a first power-source node and a reference voltage output node, a second resistance element connected between the output node and an internal node, a first variable conductance element connected between a first input node and a second power-source node and having a conductance that changes according to the voltage of the reference voltage output node, and a second variable conductance element coupled between the reference voltage output node and the second power-source node and having its conductance change according to the voltage of the internal node.

According to a third aspect of the present invention, the delay circuit includes a plurality of cascaded inverter circuits and a plurality of auxiliary circuits each provided to a corresponding one of the output nodes of the plurality of inverter circuits and each for driving an output node of a corresponding inverter circuit in response to an output signal of an inverter circuit located downstream by an odd number of stages from the corresponding inverter circuit.

According to a fourth aspect of the present invention, the delay circuit includes a first inverter, a second inverter for inverting an output signal from the first inverter and a variable current source for supplying, to an output node of the first inverter, a current in a direction preventing the change of the output signal of the first inverter in response to an output signal from the second inverter. The variable current source includes a plurality of current supplying elements connected in parallel with one another. The plurality of current supplying elements are selectively rendered conductive by a control signal in the pseudo-gray code notation. In the pseudo-gray code notation, the values of the same digit of at least one bit are held at "1" in any two successive numeric values.

In the delay circuit, accurate delay time can be set by suppressing the change of the output signal from a delay inverter circuit of a preceding stage until the output signal from the inverter delay circuit of a succeeding stage is inverted in logic.

Moreover, the operating current of the delay circuit is determined by the reference voltage and the current of the output node is bypassed by the first and second variable conductance elements so that the fluctuation of the reference voltage in the fluctuation of the power-supply voltage can be suppressed. Accordingly, the operating current of the delay circuit can be made constant despite the fluctuation of the power-supply voltage so that the fluctuation of the delay time due to the fluctuation of the power-supply voltage can be suppressed.

In addition, a control signal of the pseudo-gray code notation is employed to control a variable current source transistor so that a significant current change can be prevented, and thus, the adjustment time in the delay time adjustment operation can be shortened. Moreover, the pseudo-gray code notation allows the previous current control state to be partially maintained. Consequently, the variable current source transistors are prevented from entering the off state all at the same time, which leads to preventing a rapid current change, and thus, the delay time adjustment can be performed in a stable manner.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 45 is a schematic representation of an arrangement of a current control circuit shown in FIG. 37.

FIG. 46 is a diagram showing an example of an arrangement of a decoder shown in FIG. 45.

FIG. 47 is a diagram showing the truth table of a pseudo-gray code decoder shown in FIG. 46.

FIG. 49 is a schematic representation of an arrangement of a second modification of the third embodiment of the present invention.

FIG. 50 is a schematic representation of an arrangement of a delay stage that has the current controlled by output signal of a decoder shown in FIG. 49.

FIG. 51 is a diagram showing, in a table, the truth values of a decode operation of the decoder shown in FIG. 49.

DESCRIPTION OF THE PREFERRED EMBODIMENTS

First Embodiment

Figure 1:
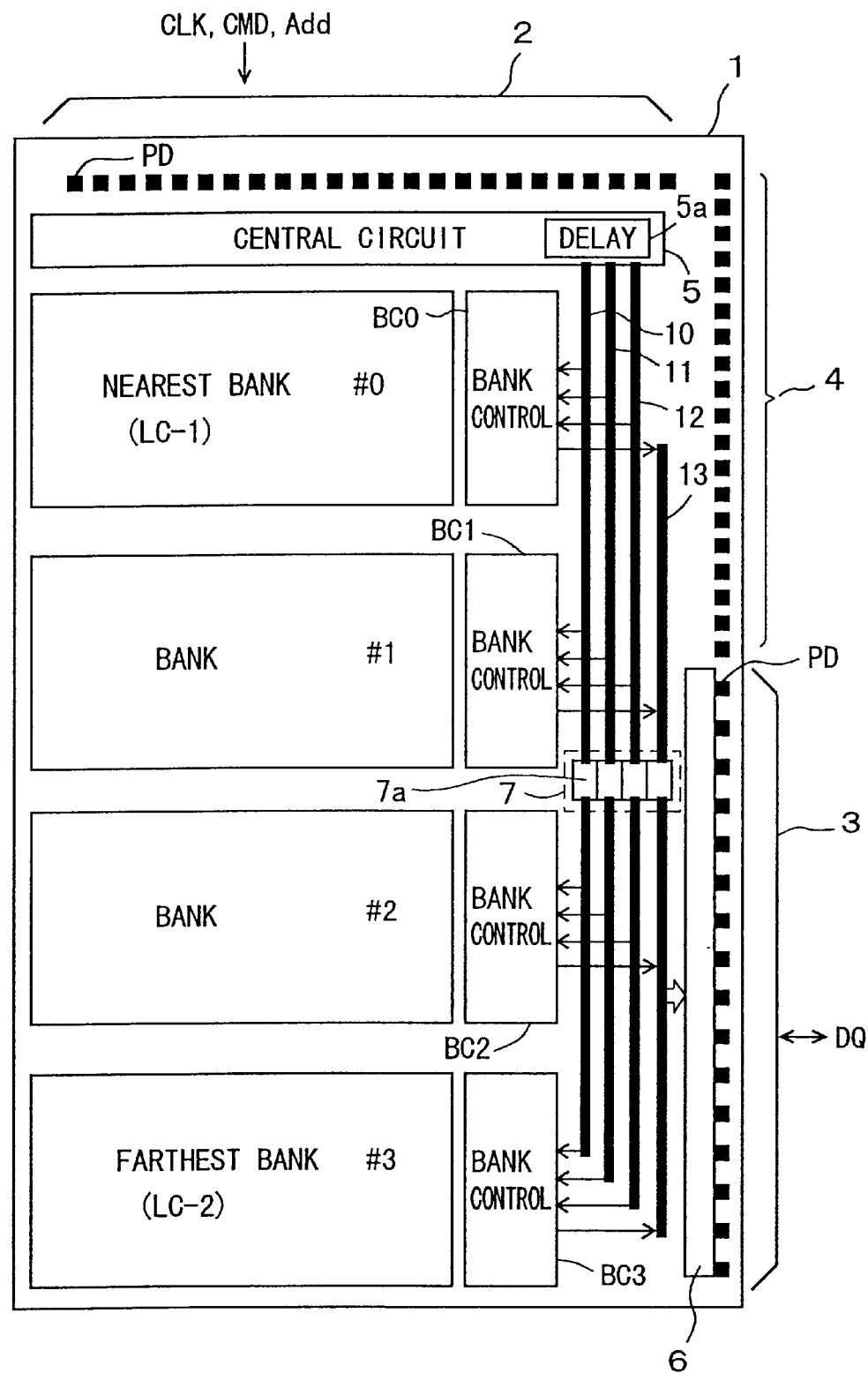
FIG. 1 is a schematic representation of an overall arrangement of a semiconductor device according to a first embodiment of the present invention.

FIG. 1 is a schematic representation of an overall arrangement of a semiconductor device according to the first embodiment of the present invention. In FIG. 1, a semiconductor device 1 has a rectangular shape and includes pads PD that are arranged along one shorter side and one longer side of the rectangle. To a peripheral pad group 2 that includes pads PD arranged in alignment in a direction of the shorter side, a clock signal CLK, a command CMD for designating an operating mode, an address signal Add for designating a memory cell location, and the like are externally applied.

Of the pads disposed along the longer side, a DQ-related pad group 3 that includes pads PD disposed in the lower half of the figure of the longer side performs inputting/outputting of data DQ.

Semiconductor device 1 includes a plurality of banks #0 to #3. A central circuit 5 for receiving a control signal and the clock signal from an outside via peripheral pad group 2 is disposed close to bank #0, and an input/output control circuit 6 is disposed facing DQ-related pad group 3.

Central circuit 5 includes a delay circuit 5a for reducing the skew of internal signals (internal operating mode instruction signal and an address signal) relative to external clock signal CLK and for generating an internal clock signal and an internal control signal in synchronization with the external clock signal CLK. A clock bus 10 for transmitting the internal clock signal, a command bus 11 for transmitting a command for instructing an internal operating mode, and an address bus 12 for transmitting address signal such as a bank address and row and column addresses, all applied in common to banks #0 to #3, are coupled to this delay circuit 5a. In addition, a data bus 13 for transferring internal data is disposed in common to banks #0 to #3 and is coupled to input/output control circuit 6.

A repeater 7 is provided in a region approximately in the center of each of buses 10 to 13 (the region between bank #1 and bank #2). Repeater 7 includes for each bus, a repeat circuit 7a that includes a delay circuit for reducing the skew of an internal signal for each bank. By providing repeater 7, a small amplitude signal is internally transferred at a high speed, while at the same time, the skew of the internal signal relative to the internal clock signal in each bank is reduced by the delay circuit in repeat circuit 7a of repeater 7.

Bank control circuits BC0 to BC3 are provided corresponding to the respective banks #0 to #3. Each of these bank control circuits BC0 to BC3 is activated when designated by a bank address applied via address bus 12, and performs row access and column access operations for the corresponding bank. Here, a row access operation is an operating mode in which row select-related operations are performed, and a column access operation is an operating mode in which column select-related operations are performed, including data write and read operations.

Bank #0 is the "closest bank" closest to central circuit 5, and bank #3 is the "farthest bank" located farthest away from central circuit 5. From central circuit 5, signals are transmitted via delay circuit 5a and buses 10 to 12 from closest bank #0 toward farthest bank #3. Data read from closest bank #0 and bank #1 are transmitted via data bus 13 and repeater 7 to input/output control circuit 6 having the delay adjusting function. Read data from bank #2 and farthest bank #3 are applied via data bus 13 to input/output control circuit 6.

Figure 2:
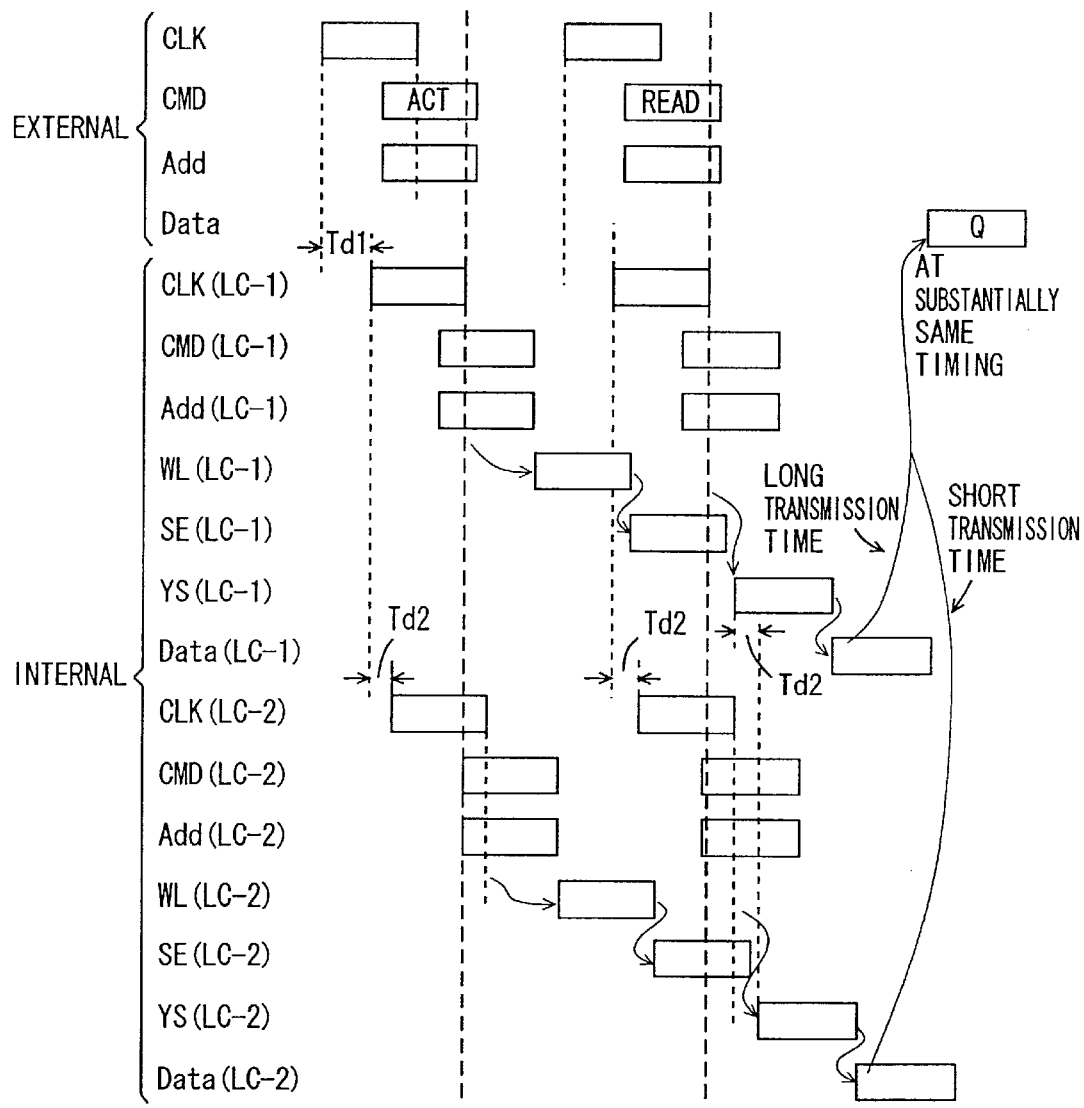
FIG. 2 is a sequence chart showing the signal changes in a data read of the semiconductor device shown in FIG. 1.

The timing deviation due to the variation in line capacitance and the like caused by the variation in the process parameters and such in the manufacturing process is adjusted by effecting a delay time adjustment with delay circuit 5a, repeater 7, and input/output control circuit 6 so as to reduce the skew of internal signals/data. Now, the data read operation of semiconductor device 1 shown in FIG. 1 will be described with reference to the timing chart shown in FIG. 2. In FIG. 2, the active period or the definite period of each signal is shown by a rectangle in the chart. In addition, in FIG. 2, signals for closest bank #0 and signals for farthest bank #3 are denoted by reference characters "LC-1" and "LC-2," respectively.

In FIG. 2, an active command ACT instructing the row access and an address signal (including a bank address) Add are applied to central circuit 5 via peripheral pad group 2 in synchronization with external clock signal CLK. In central circuit 5, delay circuit 5a buffers clock signal CLK, command CMD, and address signal Add (i.e., the delay circuit delays them and generates internal signals in synchronization with external clock signal CLK) and transmits the generated signals on clock bus 10, command bus 11, and address bus 12. Signals to be applied on buses 11 and 12 are taken into delay circuit 5a in synchronization with the internal clock signal generated in synchronization with external clock signal CLK and are buffered by delay circuit 5a. A clock signal CLK (LC-1) for closest bank #0 on clock bus 10 has a delay time Td1 relative to external clock signal CLK.

Consequently, a command CMD (LC-1) and an address signal Add (LC-1) for closest bank #0 each have a delay time Td1 relative to command CMD and address signal Add from outside. When closest bank #0 is designated, the word line selecting operation is performed according to the active command ACT, and a corresponding word line WL (LC-1) is driven to the selected state. FIG. 2 shows the period from the time at which word line WL (LC-1) is selected until it becomes stable in its selected state. When the word line is selected, a sense amplifier activating signal SE (LC-1) is then activated so that sensing, amplification, and latching of data of the memory cell connected to word line WL (LC-1) are performed.

In closest bank #0, command CMD (LC-1) is taken in and decoded according to an internal clock signal CLK (LC-1).

Then, a read command READ instructing a data read is supplied together with address signal Add in synchronization with external clock signal CLK. When closest bank #0 is designated, a column select signal YS (LC-1) is driven to the selected state in response to read command READ, and the memory cell data Data (LC-1) on the column selected by column select signal YS (LC-1) is applied via data bus 13 and repeater 7 to input/output control circuit 6. Thereafter, input/output control circuit 6 outputs, in synchronization with the internal clock signal, the data transmitted via data bus 13.

When farthest bank #3 is designated, since the internal clock signal is transmitted over the entire length of clock bus 10 to farthest bank #3, an internal clock signal CLK (LC-2) for farthest bank #3 has a delay time of time Td1+Td2 relative to the external clock signal (an internal clock signal generated by central circuit 5). According to internal clock signal CLK (LC-2), in farthest bank #3, a bank control circuit BC3 takes in a command CMD (LC-2) and an address signal Add (LC-2) that are provided and performs the decode operation. Thus, after the propagation delay time Td1+Td2 of buses 10 to 12 from the word line selection in closest bank #0, a word line WL (LC-2) is driven to the selected state in farthest bank #3, and thereafter, a sense amplifier activating signal SE (LC-2) is driven to the selected state. Then, when read command READ is supplied, a column select operation is performed according to a concurrently applied address signal Add (LC-2). A column select signal YS (LC-2) is driven to the selected state, and the memory cell data on the selected column is transmitted via bank control circuit BC3 onto data bus 13 and then to input/output control circuit 6.

Thus, when the data is read from bank control circuit BC3, the output timing of data Data (LC-2) is delayed by time Td2 relative to the output timing of read data Data (LC-1) of closest bank #0. Input/output control circuit 6 is disposed facing farthest bank #3 so that the data read from farthest bank #3 need not be transmitted over the entire length of data bus 13. In other words, read data from closest bank #0 and from farthest bank #3 arrive at input/output control circuit 6 substantially at the same timing, and can be output as read data Q in synchronization with the external clock signal (or the internal clock signal). Thus, simply preventing the skew between the signals, that is generated due to the variation in the delay caused by interconnection lines and the like, in delay circuit 5a and repeater 7 allows data Q to be output outside at substantially the same timing regardless of the locations of the banks. The same holds for banks #1 and #2.

Figure 3:
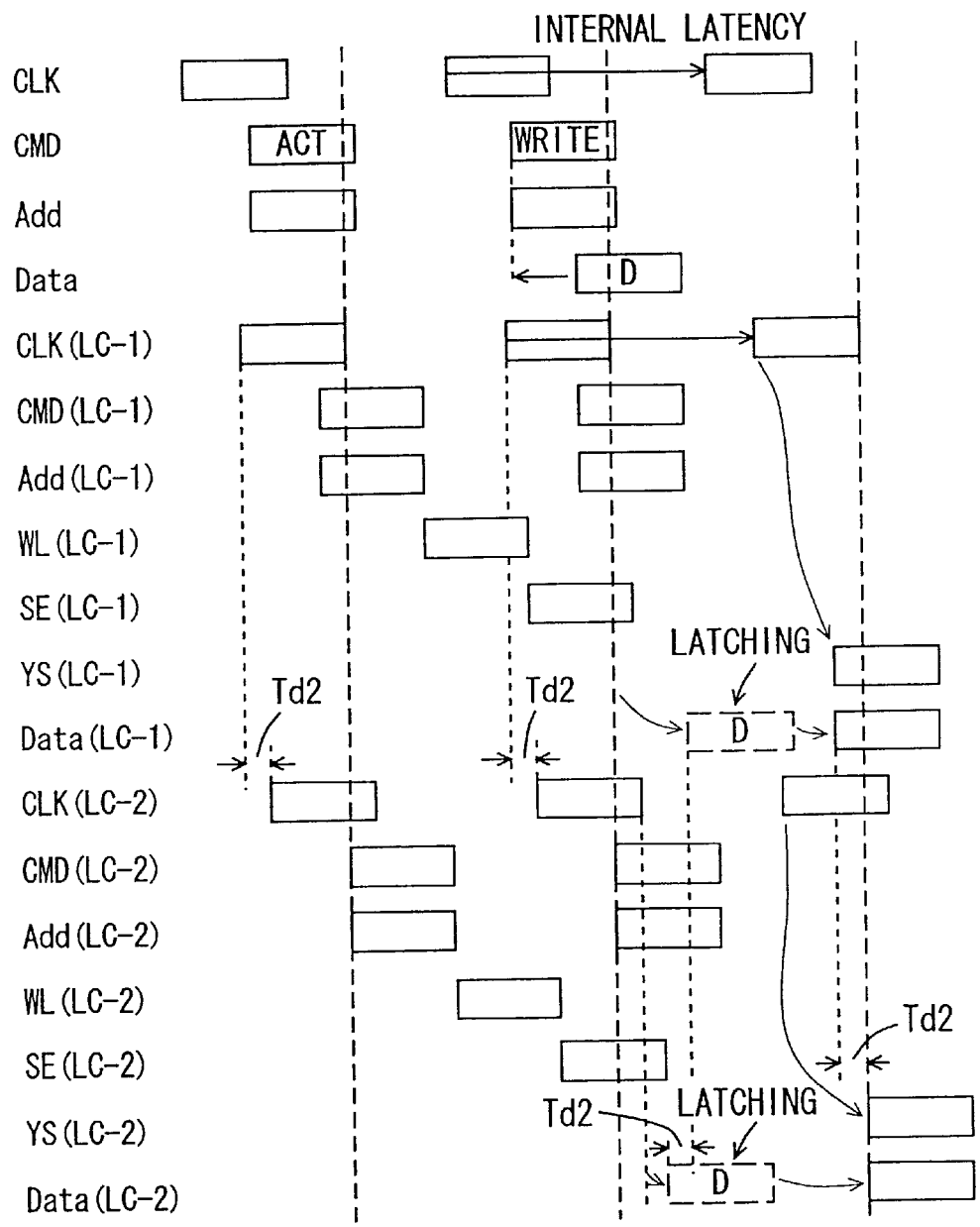
FIG. 3 is a sequence chart showing the signal changes in a data write operation of the semiconductor device shown in FIG. 1.

Now, the data write operation of the semiconductor device shown in FIG. 1 will be described with reference to FIG. 3. In the data write, the operation in the row access of performing the row selection is the same as that in the data read, and an active command ACT is applied together with an address signal Add. Between closest bank #0 and farthest bank #3, there is a time difference of time Td2 in the timing at which the row access is started.

In data write, a write command WRITE is supplied together with an address signal Add, and write data Data also is applied externally. Here, as shown in FIG. 3, the timing at which write data D is externally applied is made different from that of command CMD and address signal Add. The operation in the double data rate operation or the packet transfer operation is presupposed and data D detected at the rising edge and the falling edge of external clock signal CLK is internally transferred. In this case, data transferred from outside at both the rising edge and the falling edge are generated in parallel internally so that the timing at which the data is generated internally is delayed a little relative to command WRITE and address signal Add supplied in synchronization with external clock signal CLK. Data D may be applied at the same time as command CMD.

The timing relations between internal clock signals CLK (LC-1) and CLK (LC-2), commands CMD (LC-1) and CMD (LC-2), and addresses Add (LC-1) and Add (LC-2) with respect to closest bank #0 and farthest bank #3 are the same as those in row access. In the data write, however, there exists a time difference, or an internal latency, before data is actually written into the selected memory cell. In other words, the data applied from outside is written into the selected memory cell in a prescribed sequence after a certain time period. This corresponds to a certain time period (column latency) that exists before a selected memory cell data is read outside in a data read.

Write data D applied from DQ-related pad group 3 is transmitted to closest bank #0 via data bus 13 and repeater 7, while it is transmitted to farthest bank #3 simply via data bus 13. Thus, in this case, write data D arrives at farthest bank #3 faster by time Td2 than the write data arriving at closest bank #0 (assuming that data bus 13 is a bi-directional data bus, and the propagation delay time is the same in both directions). The write data are latched into closest bank #0 and farthest bank #3 in response to commands CMD (LC-1) and CMD (LC-2), respectively.

After the internal latency has elapsed, a column select operation is performed according to internal clock signals CLK (LC-1) and CLK (LC-2) to write the data. The column select timing in closest bank #0 is faster than the column select timing of farthest bank #3 by time Td2. Write data D, however, are already latched into banks #0 and #3 prior to the data write so that the data write operation can be performed at an accurate timing without being adversely affected by the propagation delay of the write data regardless of the positions of the banks.

In addition, by activating column select lines YS (LC-1) and YS (LC-2) according to the internal latency, the activating timing (in each bank) of each of internal write data D and the column select lines can be matched, and thus, the internal write data can be activated at the same timing and can be written into the selected memory cell in each of banks #0 to #3 regardless of the difference in the distance to central circuit 5 and data input/output pad group 3. Thus, the operating timing margin in each of the banks can be made equal so that the stable operation of each bank can be ensured.

Figure 4:
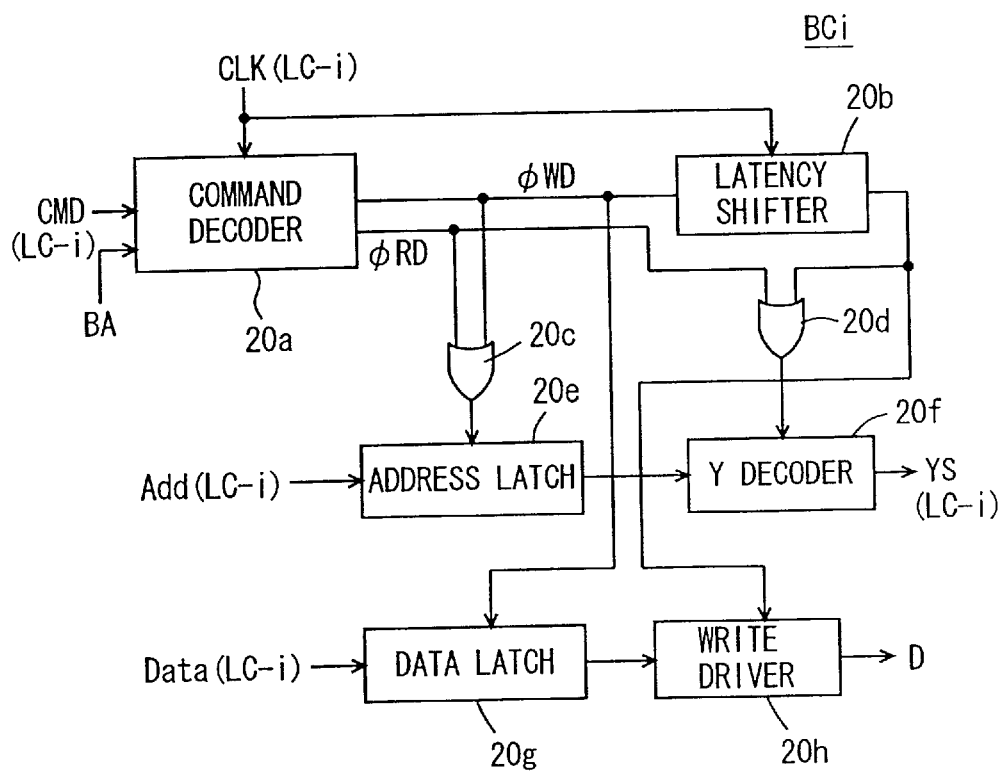
FIG. 4 is a schematic representation of an arrangement of a bank control circuit shown in FIG. 1.

FIG. 4 is a schematic representation of an arrangement of a portion related to a data write in bank control circuits BC0 to BC3 shown in FIG. 1. Since the arrangement of the portion related to the data write operation is the same for all bank control circuits BC0 to BC3, FIG. 4 representatively shows a bank control circuit BCi. Here, i equals one of 0 to 3.

As shown in FIG. 4, bank control circuit BCi includes a command decoder 20a for receiving an internal command CMD (LC-i) and a bank address signal BA and for performing a decode operation in synchronization with an internal clock signal CLK (LC-i) and selectively activating a read operation instruction signal φRD and a write operation instruction signal φWD, a latency shifter 20b for shifting write operation instruction signal φWD by the clock numbers of the internal latency in synchronization with internal command CMD (LC-i), an OR circuit 20c for receiving read operation instruction signal φRD and write operation instruction signal φWD, an OR circuit 20d for receiving read operation instruction signal φRD and an output signal from latency shifter 20b, an address latch 20e for latching an internal address signal Add (LC-i) according to an output signal from OR circuit 20c, a Y decoder 20f for decoding an internal column address signal output from address latch 20e according to an output signal from OR circuit 20d to generate a column select signal YS (LC-i), a data latch 20g for latching internal write data Data (LC-i) in response to write operation instruction signal φWD from command decoder 20a, and a write driver 20h activated according to an output signal from latency shifter 20b for driving an internal data bus (not shown) according to an output signal from data latch 20g.

Command decoder 20a includes a latch circuit for latching bank address signal BA in synchronization with internal clock signal CLK (LC-i). The latching timing of the bank address signal is set faster than the latching timing of address latch 20e, since a command decoder is provided in each of bank control circuits BC0 to BC3 and each command decoder decodes an internal command. In an alternative arrangement in which the bank address signal is decoded and only the command for the corresponding bank is activated in central circuit 5, a bank designating signal is applied to command decoder 20a instead of bank address signal BA.

When read operation instruction signal φRD or write operation instruction signal φWD from command decoder 20a is activated, the corresponding internal address signal Add (LC-i) is latched. Thus, when a column access is instructed, address latch 20e latches internal address signal Add (LC-i). Latency shifter 20b performs the shifting operation in synchronization with internal clock signal CLK (LC-i) by the clock numbers of the internal latency so that the timing at which the output signal from latency shifter 20b is made definite differs from bank to bank (due to the deviation in the phase of internal clock signal CLK (LC-i).

In a data read operation, Y decoder 20f is rendered active according to read operation instruction signal φRD to drive column select signal YS (LC-i) to the selected state. On the other hand, in a write operation, Y decoder 20f drives column select signal YS (LC-i) to the selected state in response to the delayed write operation instruction signal φWD from command decoder 20a. In other words, in the data write operation, the timing at which the operation of Y decoder 20f is started is delayed by the clock numbers of the internal latency when compared with the data read operation.

Data latch 20g latches the applied data Data (LC-i) according to write operation instruction signal φWD from command decoder 20a so that, by the time write driver 20h is activated in response to the output signal from latency shifter 20b, data latch 20g latches the write data. The activation timing of write driver 20h and Y decoder 20f are the same, and thus, the timings at which the column select line and the internal data line are driven can be made identical. As a result, the column select and the data write can be matched in timing regardless of the position of each bank within the semiconductor device, and the stable operation is ensured without taking into consideration the timing margin in each bank.

Y decoder 20f may be activated, before the end of internal latency according to write operation instruction signal φWD from command decoder 20a, to drive column select line YS (LC-i) to the selected state. In this case, Y decoder 20f is in the active state while write driver 20h is activated and internal write data D is transmitted to the selected memory cell column, and after the inactivation of write driver 20h, the selected memory cell column is driven to the non-selected state. Thus, in this case, the data can be written into the selected memory cell column with sufficient margin (there is no need to consider the timing margin). In this case, however, the internal latency must be set to such number of cycles that next column select operation is not adversely affected, or data latch 20g must be provided with the capability of latching the data successively in a first-in, first-out (FIFO) mode (when the internal latency is long). Write operation instruction signal φWD and read operation instruction signal φRD may be maintained in the active state for the "burst length period" (the Y decoder and the write driver are activated in synchronization with the corresponding internal clock signal).

First Modification

Figure 5:
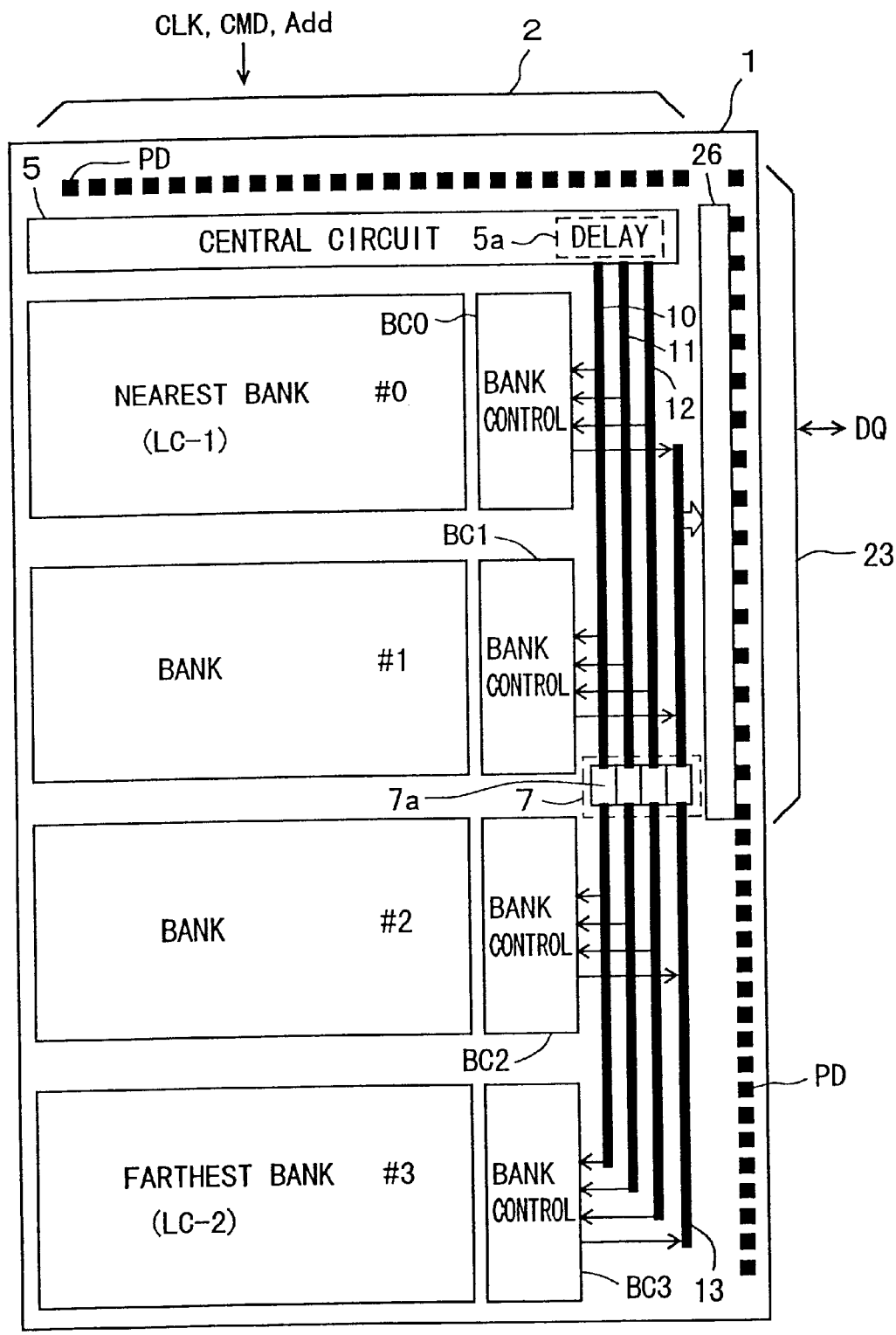
FIG. 5 is a schematic representation of another arrangement of the semiconductor device according to the first embodiment of the present invention.

FIG. 5 is a schematic representation of an arrangement of a first modification to the first embodiment of the present invention. Like the arrangement shown in FIG. 1, a semiconductor device 1 shown in FIG. 5 includes banks #0 to #3, bank control circuits BC0 to BC3, a central circuit 5, a clock bus 10, a command bus 11, an address bus 12, and a data bus 13. The clock bus 10 has a folded bus structure in which local clock signal used in each of banks #0 to #3 is transferred and applied to an input/output control circuit 26.

Central circuit 5 is disposed near bank #0, and a clock signal CLK, a command CMD, and an address signal Add are applied to pad PD disposed in the vicinity of central circuit 5. The arrangement of a peripheral pad group 2 and central circuit 5 is the same as that shown in FIG. 1. Central circuit 5 buffers and adjusts the skews of signals applied via peripheral pad group 2 by a delay circuit 5a for transference to clock bus 10, command bus 11, and address bus 12.

On the other hand, of the pads disposed along the longer side of semiconductor device 1, pads PD located on the upper side of FIG. 5 are used as a DQ-related pad group 23 for transferring data DQ. Input/output control circuit 26 is disposed facing DQ-related pad group 23, and is coupled to data bus 13. Pads PD arranged on the lower side of the longer side include a pad for evaluation (for testing), a power-supply pad, and the like.

Bank #0 is closest to central circuit 5, and bank #3 is disposed farthest away from central circuit 5. Input/output control circuit 26 is disposed facing bank #0, and bank #3 is located farthest away from input/output control circuit 26. Thus, in an internal access to banks #0 and #3, necessary internal signals (a command and an address signal) and data are transferred via buses 10 to 13, and the skews among the signals are reduced by delay circuit 5a, a repeater 7, and input/output control circuit 26. Thus, in the arrangement shown in FIG. 5, signals (a command and an address signal) arrive the fastest at bank #0, and the propagation distance of the data thereto also becomes the shortest. On the contrary, the propagation distance to bank #3 becomes the longest for both the signals and the data. In this case, in a data read, the skews between the signals alone are reduced by delay circuit 5a and repeater 7, and the data is output with the signal delay preserved.

In the write operation, the direction of transmission of internal signals and data are the same in each of banks #0 to #3 and the signals/data match in phase in each bank so that the operating margin can be enlarged in the write operation. The operation in a data read and a data write of the semiconductor device shown in FIG. 5 will be described briefly below.

Figure 6:
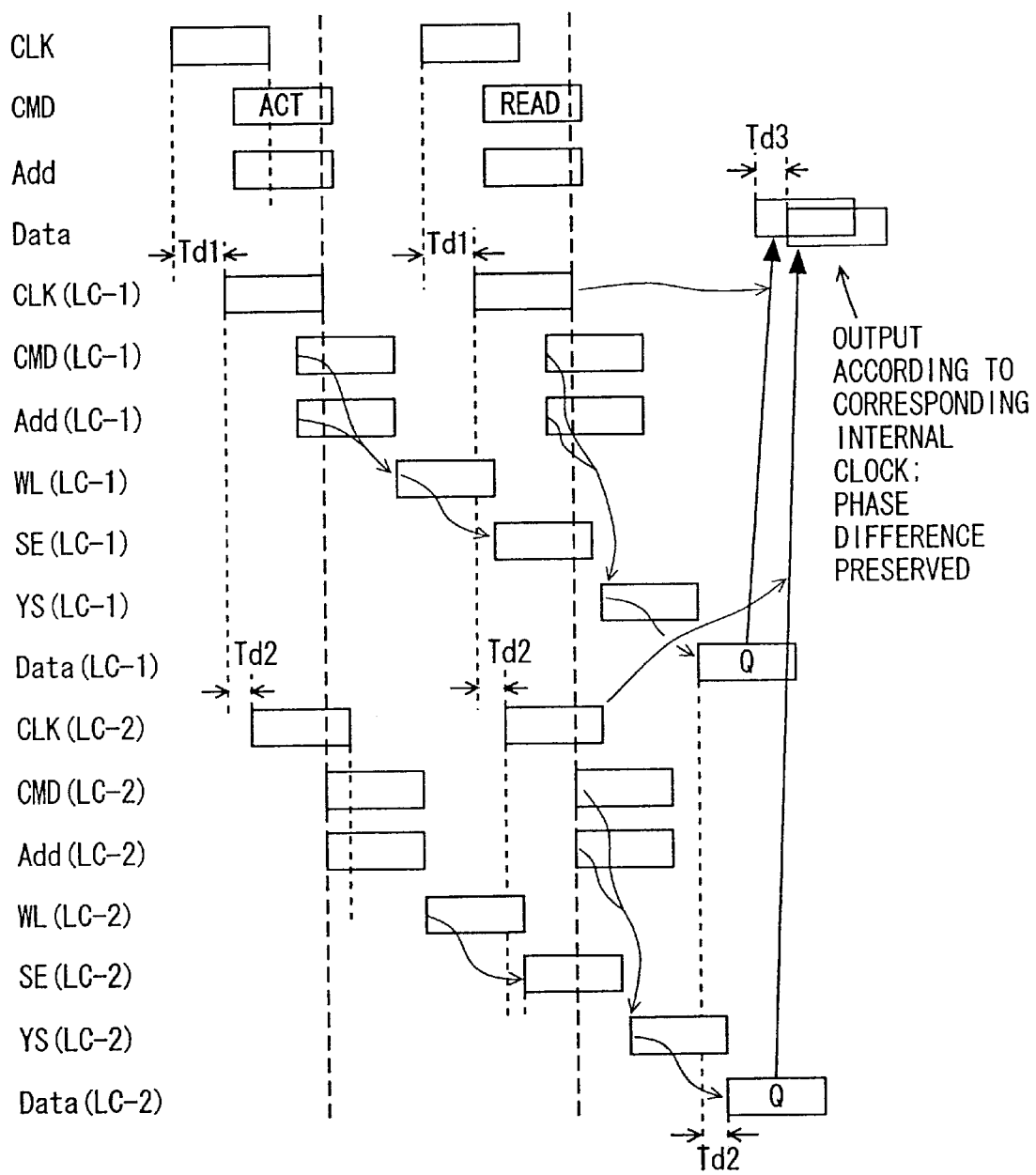
FIG. 6 is a sequence chart showing the signal changes in a data read operation of the semiconductor device shown in FIG. 1.

First, the operation in a data read of semiconductor device 1 shown in FIG. 5 will be described with reference to FIG. 6. An active command ACT instructing a row access is applied as a command CMD from outside. Active command ACT, an external clock signal CLK and an address signal Add are adjusted in phase by delay circuit 5a in central circuit 5, and thereafter, are transmitted to bank #0 or bank #3. When closest bank #0 is designated, the row select operation is performed by a bank control circuit BC0 according to an internal clock signal CLK (LC-1) and a command CMD (LC-1) after a delay time Td1. In this case, a corresponding word line WL (LC-1) is selected according to an address signal Add (LC-1), and then, a sense amplifier activating signal SE (LC-1) is rendered active. Here, FIG. 6 shows the periods during which a word line WL and a sense amplifier activating signal SE are respectively driven to the active state. The selected bank maintains its active state until a precharge command is applied. FIG. 6 indicates the minimum required activation period of each signal for the purpose of illustrating the timing relations.

When farthest bank #3 is designated, a command CMD (LC-2) and an address signal Add (LC-2) are taken in and decoded according to an internal clock signal CLK (LC-2) after a further propagation delay Td2 of buses 10 to 12, and a word line selecting signal WL (LC-2) and a sense amplifier activating signal SE (LC-2) are sequentially activated.

Thus, the deviation in the timing of the row select operation between banks #0 and #3 occurs corresponding to the distance from central circuit 5 to the respective banks #0 and #3, as in the case of the semiconductor device shown in FIG. 1.

Then, a read command READ instructing a data read is applied together with an address signal Add from outside. In bank #0, the column select operation and the data read operation are performed according to clock signal CLK (LC-1), command CMD (LC-1), and address signal Add (LC-1), and data Q is read out as internal data Data (LC-1). Data Q from bank #0 is supplied to input/output control circuit 26 via data bus 13, and is externally output via DQ-related pad group 23. The data output operation is performed according to internal clock signal CLK (LC-1) of bank #0.

In the data access to bank #3, the read operation is performed after an additional delay of time Td2 from the read operation in bank #0. When internal data Data (LC-2) is read as data Q according to a column select signal YS (LC-2), the data read from bank #3 is transmitted to input/output control circuit 26 via data bus 13 and repeater 7. Thus, the timing at which data Q from bank #3 is read to the outside is further delayed by time Td3 relative to the timing at which the data is read to the outside from bank #0. If the signal propagation delay of the data bus is time Td2, then delay time Td3 is substantially equal to 2·Td2. In this case, for banks #0 and #3, the data is output to the outside according to the respective internal clock signals CLK (LC-1) and CLK (LC-2). Therefore, data Q are output to the outside after a delay time that corresponds to the position of a selected bank with respect to central circuit 5. The data is output according to a corresponding internal clock signal, and at the same time, a corresponding internal clock signal for data sampling is output in parallel.

Figure 7:
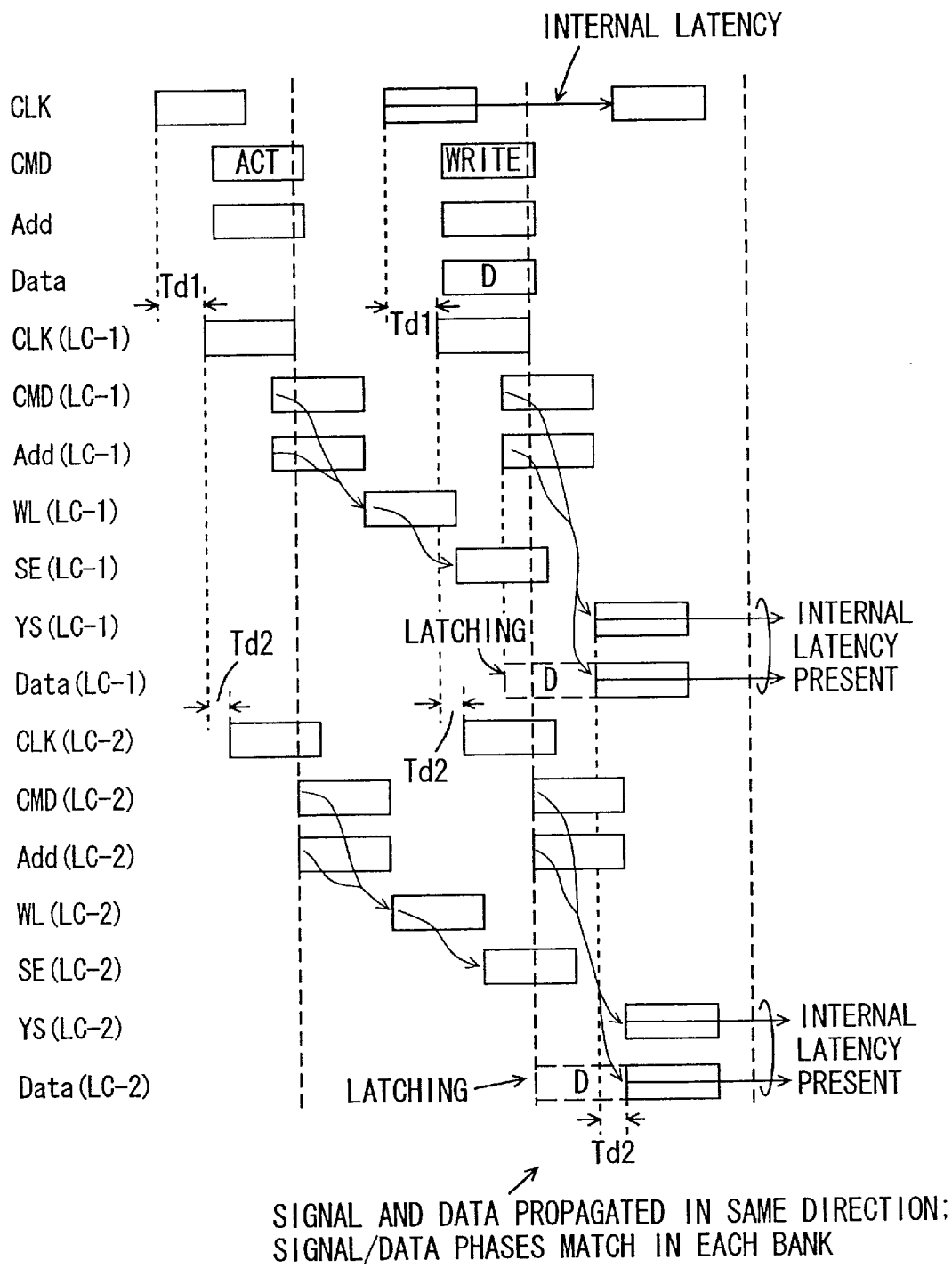
FIG. 7 is a sequence chart showing the signal changes in a data write operation of the semiconductor device shown in FIG. 5.

FIG. 7 is a schematic diagram representing the activation timing of the internal signals in a data write. The operation in the data write of the semiconductor device shown in FIG. 5 will be described below with reference to FIG. 7.

As in the data read operation, an active command ACT is applied, and the row select operation is performed in bank #0 or in bank #3.In this case, signals are transmitted from central circuit 5 to banks #0 and #3 via internal buses 10 to 12. In bank #0, each signal is applied after a delay of time Td1 relative to an external clock signal CLK and the row select operation is performed. On the other hand, in bank #3, signals are transmitted after a further delay of time Td2 from the arrival of the signals at bank #0, and the row select operation is performed.

In the write operation, a write command WRITE instructing a data write is applied, and an address signal Add and write data Data (D) are applied at the same time as write command WRITE. When bank #0 is selected, command CMD (LC-1), address signal Add (LC-1), and internal write data Data (LC-1) are applied. Data Data (LC-1) is latched in bank #0, a column is selected, and column select signal YS (LC-1) is activated. At this time, a write driver is also activated so as to write the data into a selected memory cell according to data Data (LC-1). Signals are transmitted in the same direction to bank #0 via clock bus 10, command bus 11, and address bus 12, and the data applied via data bus 13 from input/output control circuit 23 is also transmitted to bank #0 through substantially the same distance. Thus, internal command CMD (LC-1), address Add (LC-1), and data Data (LC-1) are transmitted to bank #0 at substantially the same time. Therefore, the signals and the data are matched in phase in bank #0 so that the column select operation can be performed with sufficient margin to write the data into a selected memory cell.

On the other hand, write data D is transmitted to bank #3 via data bus 13 from input/output control circuit 26 along the same direction as the signals on the buses 10 to 12. Thus, internal command CMD (LC-2), address signal Add (LC-2), and write data Data (LC-2) are also transmitted to bank #3 substantially at the same time. In bank #3, write data Data (LC-2) is latched, and the column select operation is performed according to internal command CMD (LC-2) and address signal Add (LC-2). Since the data already arrived at bank #3, the data can be written into a selected memory cell with a column select line YS (LC-2) and a write driver activated at the same time.

Thus, in any of the banks #0 to #3, the address signal, the command, and the data are substantially matched in phase in the data write operation so that an accurate write operation can be performed simply by making the signals match in phase only by adjusting the delay in order to reduce the skew with delay circuit 5a and repeat circuit 7a of repeater 7.

When an internal latency exists, the column selection and data write operations are performed after a further delay of the clock numbers of the internal latency from the selection timing and the data write timing shown in FIG. 7. Write data D may be applied after a delay of half a cycle from application of the command as shown in FIG. 3.

Since the write data, the command, and the address signal are matched in phase, the column access is performed to write the data without especially providing the internal latency.

Thus, when DQ-related pad group 23 and peripheral pad group 2 are close together and disposed in the vicinity of central circuit 5, the data write operation can be performed at an accurate timing in each bank simply by adjusting the skews among the signals and the data caused by the variation in the parasitic capacitances of internal signal interconnection lines.

Figure 8:
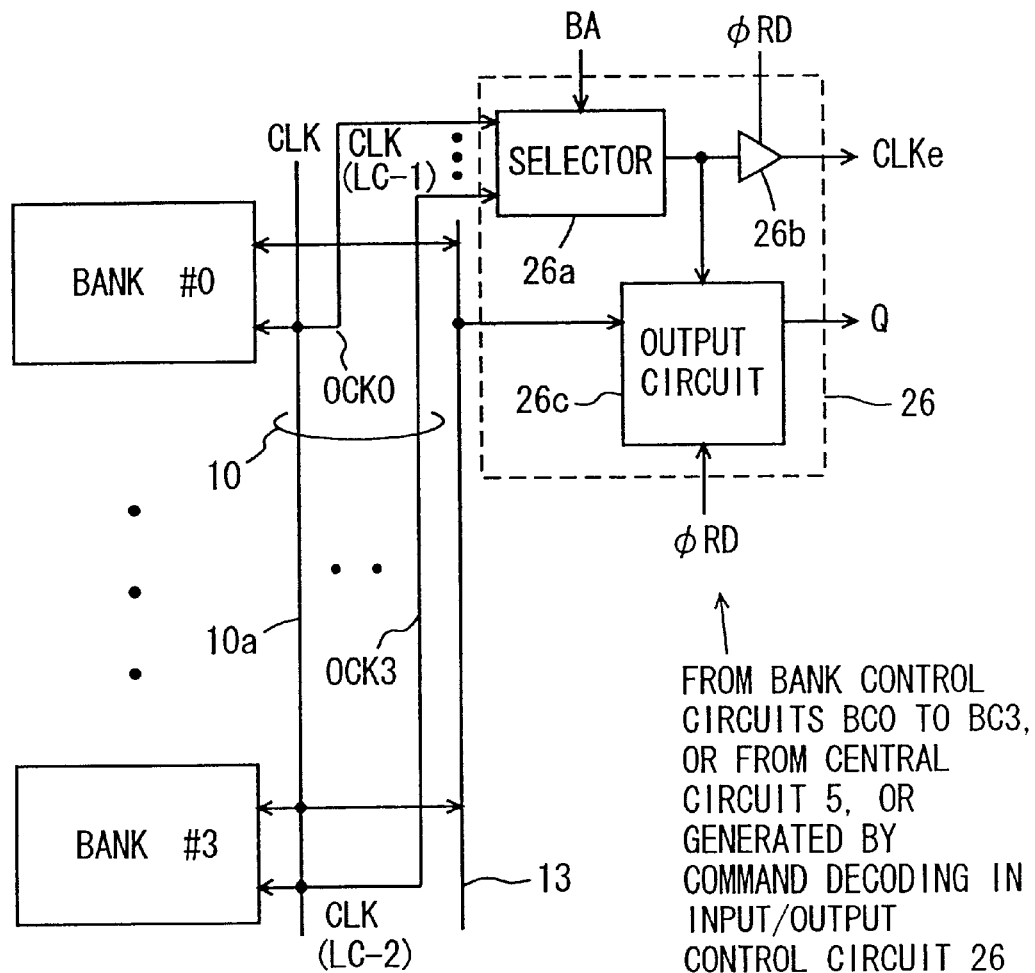
FIG. 8 is a schematic representation of an arrangement of an output control portion and an arrangement of an internal clock path in the semiconductor device shown in FIG. 5.

FIG. 8 is a schematic representation of an arrangement of an output control portion of input/output control circuit 26 of semiconductor device 1 shown in FIG. 5. The arrangement for a data write is provided in each of bank control circuits BC0 to BC3, and the arrangement shown in FIG. 4 above, for instance, can be utilized therefor. When an internal latency is not required, latency shifter 20b in the arrangement shown in FIG. 4 is eliminated.

As shown in FIG. 8, clock bus 10 is coupled to banks #0 to #3. Clock bus 10 includes a clock line 10a for transmitting a clock signal CLK from central circuit 5, and output clock lines OCK0 to OCK3 for returning the respective internal clock signals CLK (LC-1) to CLK (LC-2) of banks #0 to #3 back to input/output control circuit 26. Internal local clock signals CLK (LC-1) to CLK (LC-2) are returned to the input/output control circuit using output clock lines OCK0 to OCK3 so as to perform the data output in response to each respective local clock signal.

These banks #0 to #3 are coupled in common to data bus 13. A repeater 7 is provided to data bus 13 and clock bus 10, however, repeater 7 is not shown in FIG. 8 so as to simplify the drawing.

Input/output control circuit 26 includes a selector 26a for selecting one of output clock lines OCK0 to OCK3 according to a bank address BA, a buffer circuit 26b activated in response to the activation of read operation instruction signal φRD for buffering a clock signal applied from selector 26a and generating an external clock signal CLKe, and an output circuit 26c coupled to data bus 13 and activated in the activation of read operation instruction signal φRD for buffering the data on data bus 13 in synchronization with the clock signal from selector 26a and outputting the buffered data to the outside.

Selector 26a, is formed for example, by a CMOS transfer gate or a tri-state buffer circuit, and selects an output clock line corresponding to the bank designated by bank address BA. The clock signal from selector 26a is transmitted as external clock signal CLKe via buffer circuit 26b.

Figure 9:
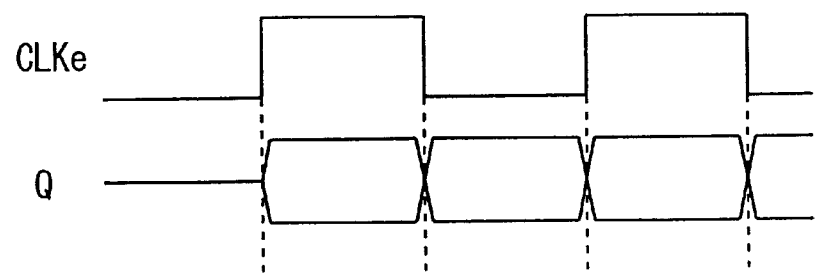
FIG. 9 is a signal waveform diagram representing an operation of the input/output control portion shown in FIG. 8.

Output circuit 26c outputs the data in synchronization with the clock signal from selector 26a in the activation of read operation instruction signal φRD. Therefore, as shown in FIG. 9, the output data Q from output circuit 26c and external clock signal CLKe from buffer circuit 26b are synchronized in phase. Here, FIG. 9 shows the signal waveforms in the case in which data Q is output in a double data rate (DDR) mode. Data Q may be output in a single data rate (SDR) mode. In either case, data Q is output according to a local clock signal CLK (LC-i). When bank #i is selected, the data is read according to local clock signal CLK (LC-i) for bank #i, and external clock signal CLKe for output and read data Q can be matched in phase at all times. Even in the case in which a phase difference is produced in the output timing of the output data depending on the positions of the central circuit and the input/output circuit with respect to the bank, an external processor, for instance, can accurately sample data Q using external clock signal CLKe.

Thus, simply by reducing the skews between the signals using a delay circuit within the semiconductor device, data can be communicated with an external device with accuracy and with sufficient margin.

As for read operation instruction signal φRD, the read operation instruction signal generated in each of bank control circuits BC0 to BC3 may be transmitted to input/output control circuit 26. Alternatively, a command decoder may be provided in central circuit 5, and read operation instruction signal φRD may be generated from central circuit 5 and applied to input/output control circuit 26, or, input/output control circuit 26 itself may have a read command decoder and perform a decode operation according to a command from central circuit 5 to generate the read operation instruction signal φRD. The arrangement of the delay circuit will be described briefly below.

First Arrangement of Delay Circuit

Figure 10:
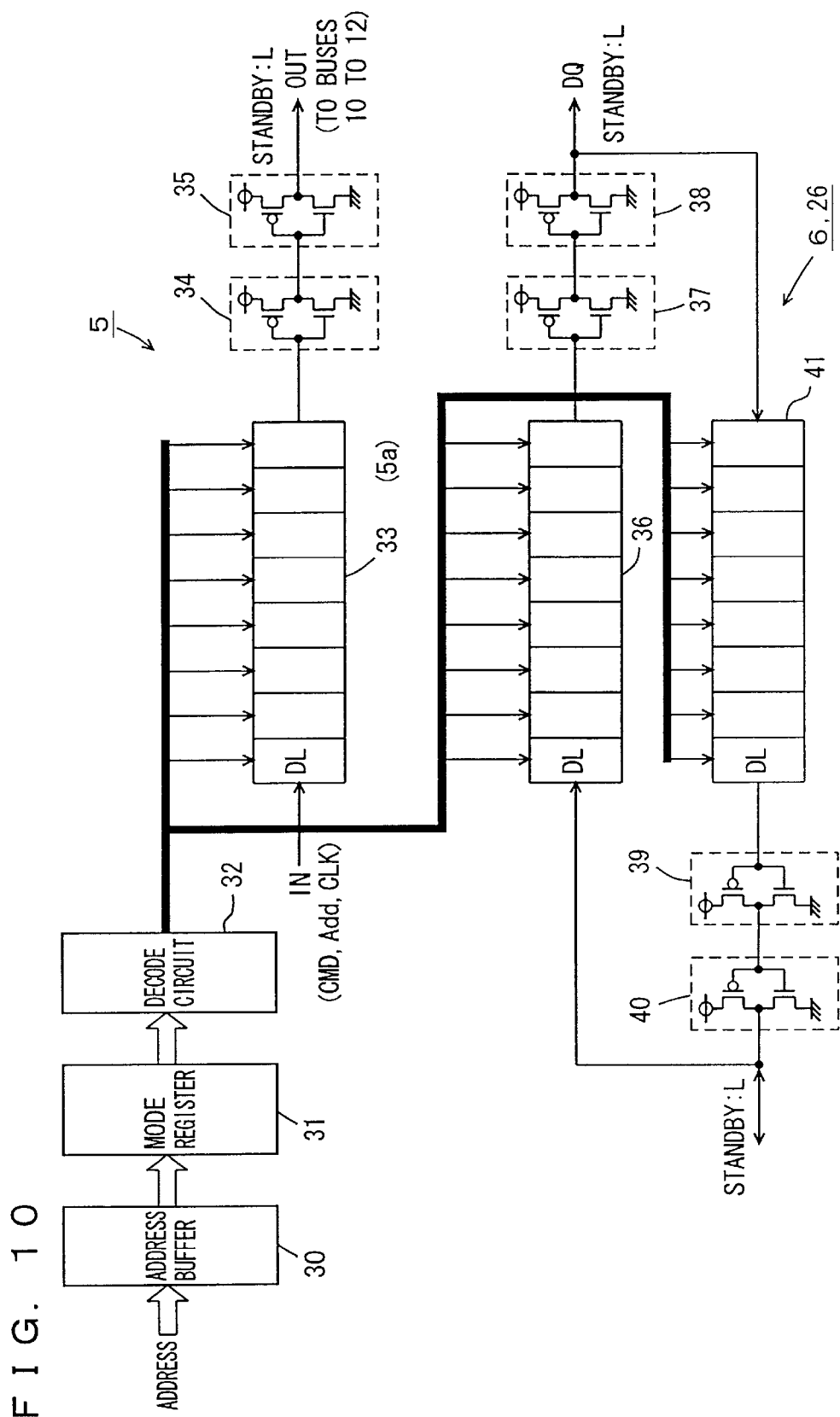
FIG. 10 is a schematic representation of an arrangement of the delay circuit according to the first embodiment of the present invention.

FIG. 10 is a schematic representation of an arrangement of the delay circuit used in the semiconductor device according to the first embodiment of the present invention.

As shown in FIG. 10, a delay circuit is provided in each of central circuit 5 and input/output control circuit 6 (26). Central circuit 5 includes a vernier circuit 33 (corresponding to delay circuit 5a) having a plurality of delay stages DL, and input/output control circuit 6 or 26 includes a read vernier circuit 36 for delaying the read data and a vernier circuit 41 for adjusting the delay time for the write data. These vernier circuits 36 and 41 each have a plurality of delay stages DL.

An address buffer 30 for receiving an external address signal, a mode register 31 for storing prescribed address bits from address buffer 30 in a mode register set mode, and a decode circuit 32 for decoding the address bits stored in mode register 31 and generating a vernier control signal are provided in order to adjust the delay time for vernier circuits 36 and 41. Mode register 31 receives and stores a prescribed bits of an address signal Add from outside via address buffer 30 when a mode register set command is applied. Decode circuit 32 decodes the address bits stored in mode register 31 and generates a control signal for adjusting the delay time in vernier circuits 33, 36, and 41. Vernier circuits 33, 36, and 41 have the numbers of delay stages DL adjusted or have the delay time of each delay stage DL adjusted according to a delay time adjustment signal from decode circuit 32.

A signal IN (one of a command CMD, an address signal Add, and an external clock signal CLK) from outside is applied to vernier circuit 33. In other words, one vernier circuit 33 is provided for each external signal applied via peripheral pad group 2. An output signal from vernier circuit 33 is transmitted to internal buses 10 to 12 via CMOS inverter buffers 34 and 35. CMOS inverter buffers 34 and 35 are cascaded, and buffer the output signal from vernier circuit 33 and transmit the buffered signal on a corresponding internal bus.

Read data from inside is applied via data bus 13 to vernier circuit 36. An output signal from vernier circuit 36 is applied to a data pad via the two-stage, cascaded CMOS inverters 37 and 38.

Vernier circuit 41 receives the write data from outside, delays the received data for a prescribed period of time, generates internal write data via the two-stage cascaded CMOS inverter buffers 39 and 40, and transmits the generated data on internal data bus 13.

The internal skews between a clock signal and each control signal can be adjusted by providing vernier circuits 36 and 41 corresponding to each bit of data and by providing vernier circuit 33 for each external control signal. In addition, by providing vernier circuit 36 for the read data to set the phases of the signal (external clock signal) and the read data to the optimal values, data having a constant phase relation regardless of the distance between an external device such as a processor and the semiconductor device can be transmitted to the external device (a processor or a memory controller).

Furthermore, vernier circuit 41 is provided for the write data so that the internal skew between an internal signal and the write data is set to the minimum value. In the arrangement of the semiconductor device shown in FIG. 1 or in FIG. 5, the skew between the write data and a corresponding internal signal is set to the minimum, and the data write operation is performed at the optimal timing in each of the banks.

In the arrangement shown in FIG. 10, vernier circuits 33, 36, and 41 have their delay times adjusted according to a common output signal from decode circuit 32. These vernier circuits 33, 36, and 41, however, may have their respective delay times adjusted individually by separate decode circuits.

In addition, as for data DQ, the write data and the read data may be transmitted not via common pads but via separate pads (i.e., a separated IO structure may be employed).

Figure 11:
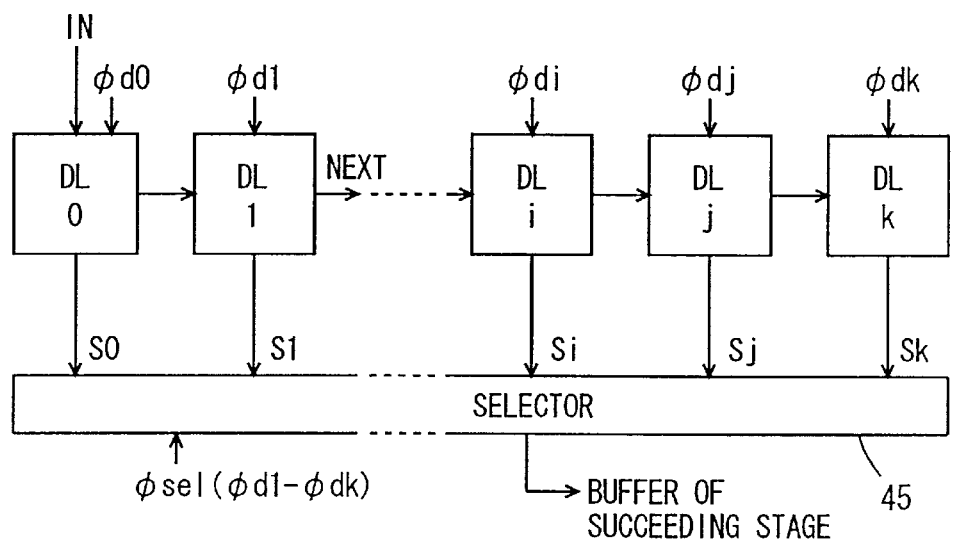
FIG. 11 is a schematic representation of an arrangement of a vernier circuit shown in FIG. 10.

FIG. 11 is a schematic representation of an arrangement of vernier circuits 33, 36, and 41 shown in FIG. 10. Since vernier circuits 33, 36, and 41 have the identical arrangement except for the number of delay stages, FIG. 11 representatively shows one vernier circuit. The vernier circuit includes a plurality of cascaded delay stages DL0 to DLk and a selector 45 for selecting one of output signals S0 to Sk from delay stages DL0 to DLk according to a selecting signal φSEL. An output signal from selector 45 is applied to the buffer of the succeeding stage (for instance, a CMOS inverter buffer 34).

Delay stages DL0 to DLk receive decode signals φd1 to φdk, respectively. Delay stages DL0 to DLk each transmit an output signal from the delay stage of the preceding stage to the succeeding stage when the corresponding decode signal φd1 to φdk is in the active state. When the corresponding one of decode signals φd1 to φdk of delay stages DL0 to DLk is in the inactive state, the signal transmission to the succeeding stage is prohibited (the logic level of an output signal NEXT is fixed).

Selector 45 selects an output signal of the delay stage from which the signal transmission to the succeeding stage is prohibited. Decode signals φd1 to φdk are applied as the delay time adjustment signals from decode circuit 32 shown in FIG. 10 so that the delay time (the number of delay stages) in each of these vernier circuits 33, 36, and 41 can be adjusted.

Figure 12:
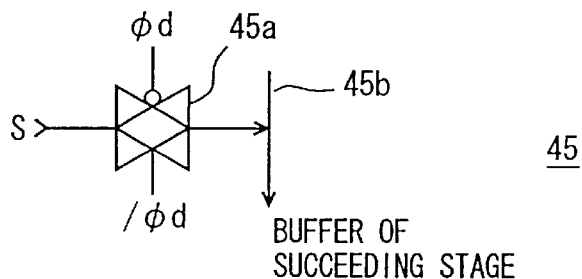
FIG. 12 is a schematic representation of an arrangement of a single stage of selecting circuit within a selector shown in FIG. 11.

FIG. 12 is a diagram illustrating an example of the arrangement of selector 45 shown in FIG. 11. As shown in FIG. 12, selector 45 includes CMOS transmission gate 45a provided to each of delay stages DL0 to DLk. CMOS transmission gate 45a attains the non-conductive state when a decode signal φd that is applied to a corresponding delay stage is active (H level). On the other hand, CMOS transmission gate 45a attains the conductive state when the corresponding decode signal φd is inactive (L level), and an output signal S from the corresponding delay stage is selected and transmitted onto an output line 45b connected to the buffer of the succeeding stage. CMOS transmission gates 45a provided to respective delay stages DL0 to DLk are connected in parallel to output line 45b.

A tri-state buffer circuit may be used in place of CMOS transmission gate 45a in selector 45.

Figure 13:
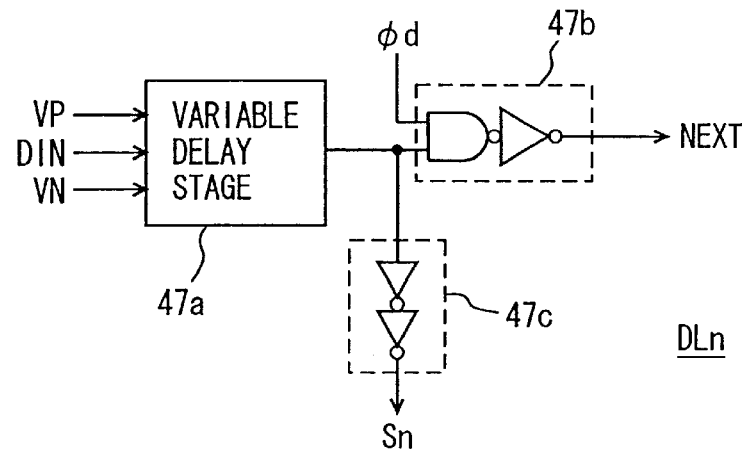
FIG. 13 is a schematic representation of an arrangement of a delay stage shown in FIG. 11.

FIG. 13 is a schematic representation of an arrangement of a delay stage DL shown in FIG. 11. In FIG. 13, a delay stage DLn (n=0–k) includes a variable delay stage 47a having its operating current determined by reference voltages VP and VN for delaying an input signal DIN, an AND circuit 47b receiving an output signal from variable delay stage 47a and a decode signal φd and generating a signal NEXT for the succeeding stage, a buffer circuit 47c for buffering an output signal from variable delay stage 47a and generating an output signal Sn of delay stage DLn. AND circuit 47b equivalently includes an NAND gate receiving decode signal φd and the output signal from variable delay stage 47a, and an inverter inverting an output signal from the NAND gate and generating signal NEXT for the succeeding stage. Buffer circuit 47c includes for instance the two-stage, cascaded inverters.

In delay stage DLn shown in FIG. 13, when decode signal φd is at the L level, output signal NEXT for the succeeding stage is fixed to the L level regardless of the logic level of the output signal from variable delay stage 47a. In other words, the signal transmission to the delay stages downstream to variable delay stage 47a is stopped. Even if decode signal φd is at the H level in each of the delay stages following the succeeding stage, an output signal of a corresponding variable delay stage is fixed at the "L" level so that the delay signal (NEXT) does not change.

On the other hand, when decode signal φd attains the H level, AND circuit 47b allows the output signal from variable delay stage 47a to pass through. Therefore, if decode signals φd0 to φdn from delay stage DLn to delay stage DL0 are all at the H level, input signal IN is transmitted via variable delay stage 47a and is then selected by selector 45, and transmitted to the buffer of the succeeding stage. Thus, if decode signal φd for the delay stage preceding delay stage DLn is at the H level and decode signal φd of delay stage DLn is at the L level, signal Sn from buffer circuit 47c of delay stage DLn is selected as the delay signal.

For instance, in FIG. 11, assume that decode signals φd0 to φdi are at the H level, that decode signal φdj is at the L level, and that decode signal φdk is at the H level. In this case, delay stages DL0 to DLi all transmit a signal from their respective preceding stages. Thus, input signal IN is transmitted via delay stages DL0 to DLi up to delay stage DLj. The output signal of delay stage DLj to delay stage DLk is fixed to the L level. An output signal Sj is changed by variable delay stage 47a included in delay stage DLj. Therefore, when decode signal φdj is set to the L level, a delay signal can be selected that has the delay of the total delay times of the variable delay stages of delay stages DL0 to DLj when the delay times of circuits 47a and 47b are ignored.

In the arrangement shown in FIG. 11, decode signal φd may be set to the inactive state or the L level for each delay stage which is prohibited from transmitting the input signal. In this case, however, a selecting signal must be generated anew so as to select only one CMOS transmission gate 45a according to the decode signal in selector 45 (a gate is provided for detecting the boundary between the H and L levels).

In addition, variable delay stage 47a may be so formed as to receive an output signal from AND circuit 47b and transmits a delay signal to a succeeding delay stage.

Figure 14:
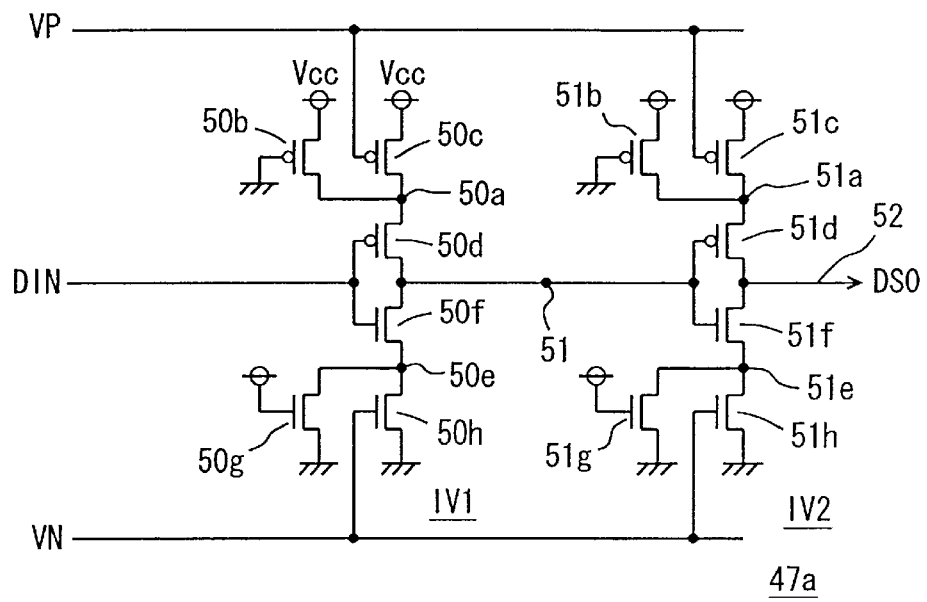
FIG. 14 is a diagram representing an arrangement of a variable delay stage shown in FIG. 13.

FIG. 14 is a diagram representing an arrangement of variable delay stage 47a shown in FIG. 13. In FIG. 14, variable delay stage 47a includes two-stage, cascaded inverter circuits IV1 and IV2. Inverter circuit IV1 includes a P-channel MOS transistor 50b connected between a power-supply node and a node 50a and having a gate coupled to a ground node, a P-channel MOS transistor 50c connected between a power-supply node and node 50a and receiving a reference voltage VP at a gate, a P-channel MOS transistor 50d connected between node 50a and an output node 51 and receiving an input signal DIN at a gate, an N-channel MOS transistor 50f connected between output node 51 and a node 50e and receiving input signal DIN at a gate, an N-channel MOS transistor 50g connected between node 50e and a ground node and receiving a power-supply voltage Vcc at a gate, and an N-channel MOS transistor 50h connected between node 50e and a ground node and receiving a reference voltage VN at a gate.

MOS transistors 50b and 50g are normally on, supply a constant current, and determine the minimum delay time of inverter circuit IV1 that forms delay stage 47a. The delay time is determined according to the overall operating current of inverter circuit IV1 determined by reference voltages VP and VN applied at the respective gates of MOS transistors 50c and 50h.

Inverter circuit IV2 similarly includes P-channel MOS transistors 51b and 51c connected in parallel between a node 51a and a power-supply node and receiving a ground voltage and reference voltage VP at their respective gates, a P-channel MOS transistor 51d and an N-channel MOS transistor 51f connected between node 51a and a node 51e and having their gates connected to node 51, and N-channel MOS transistors 5ig and 5ih each connected between node 51e and a ground node and receiving a power-supply voltage Vcc and reference voltage VN at their respective gates.

In inverter circuit IV2, MOS transistors 51b and 51g operate as current source transistors and determine the minimum operating current of inverter circuit IV2, and MOS transistors 51c and 51h supply the operating current according to reference voltages VP and VN. The delay time of delay stage 47a is determined by these reference voltages VP and VN. If reference voltages VP and VN are at a certain voltage level not dependent on the power-supply voltage, even when the current drivability (driving levels) of MOS transistors 50b and 50g changes according to the fluctuation of the power-supply voltage Vcc, a constant operating current can be stably supplied as a whole, and accordingly, the delay time of delay stage 47a can be set to a constant length of time. Variable delay stage 47a is a delay circuit that is formed equivalently by CMOS inverter buffers.

Figure 15:
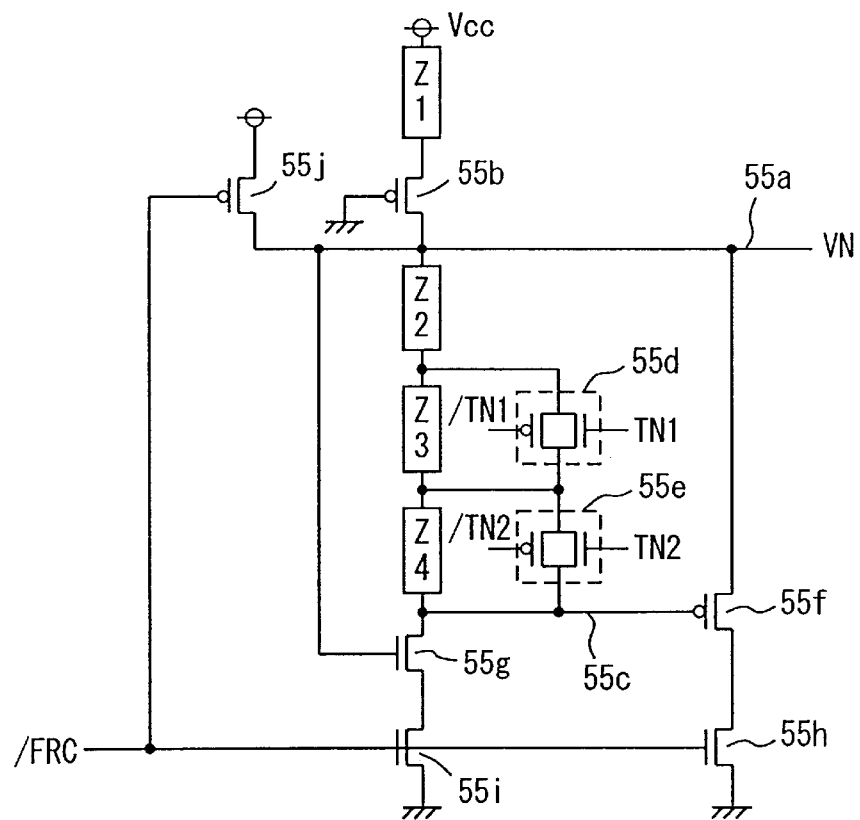
FIG. 15 is a diagram representing an arrangement of a circuit for generating a reference voltage VN shown in FIG. 14.

FIG. 15 is a diagram representing the arrangement of a circuit for generating reference voltage VN shown in FIG. 14. In FIG. 15, a reference voltage generating circuit includes a resistance element Z1 and a P-channel MOS transistor 55b connected in series between a power-supply node and an output node 55a, resistance elements Z2 to Z4 connected in series between output node 55a and a node 55c, CMOS transmission gates 55d and 55e connected in parallel to resistance elements Z3 and Z4, respectively and selectively rendered conductive in response to tuning signals TN1, /TN1, and TN2, /TN2, N-channel MOS transistors 55g and 55i connected in series between node 55c and a ground node, a P-channel MOS transistor 55f having a source coupled to output node 55a and having a gate connected to node 55c, an N-channel MOS transistor 55h connected between MOS transistor 55f and a ground node, and a P-channel MOS transistor 55j connected between a power-supply node and output node 55a for receiving a control signal /FRC at a gate.

P-channel MOS transistor 55b has a gate coupled to a ground node, and is normally in the on state and operates as a current adjusting element. N-channel MOS transistor 55g has a gate coupled to output node 55a, and MOS transistors 55i and 55h receive control signal /FRC at their gates.

When control signal /FRC is at the L level, P-channel MOS transistor 55j attains the on state while MOS transistors 55i and 55h attain the off state, and reference voltage VN from output node 55a attains the power-supply voltage Vcc level. Thus, in this case, the reference voltage for delay adjustment of the delay stage is not generated.

On the other hand, when control signal /FRC is at the H level, P-channel MOS transistor 55j attains the off state, while N-channel MOS transistors 55i and 55h attain the on state so that a path through which a current flows from a power-supply node to a ground node is formed in the reference voltage generating circuit, and the reference voltage is generated. When power-supply voltage Vcc becomes higher than the absolute value of the threshold voltage of P-channel MOS transistor 55b, P-channel MOS transistor 55b attains the on state and supplies a current corresponding to its gate to source voltage. Moreover, N-channel MOS transistor 55g attains the on state when reference voltage VN of output node 55a becomes higher than or equal to the threshold voltage of MOS transistor 55g, and discharges the current from output node 55a into ground node. Reference voltage VN generated from output node 55a is stabilized when the current supplied by MOS transistor 55b and the current discharged by MOS transistors 55g and 55f are balanced.

When reference voltage VN rises according to the rise of power-supply voltage Vcc, the gate to source voltage of MOS transistor 55g becomes large, and the current that flows via MOS transistor 55g is increased, thereby increasing the current of resistance elements Z2 to Z4. In addition, the current supplied by P-channel MOS transistor 55b also increases during the rise of reference voltage VN. At this time, the gate to source voltage of P-channel MOS transistor 55f also becomes large according to the rise of reference voltage VN, and P-channel MOS transistor 55f sinks a large current from output node 55a and lowers the voltage level of reference voltage VN. Thus, the current supplied by P-channel MOS transistor 55b is determined according to its gate to source voltage, and even when its supplying current increases, the current flowing through resistance elements Z2 to Z4 does not change so that reference voltage VN remains constant.

When reference voltage VN is lowered, the gate to source voltage of MOS transistor 55g is also lowered. Thus, the amount of current discharged by MOS transistor 55g is reduced, and reference voltage VN rises.

Therefore, even when reference voltage VN rises according to the rise of power-supply voltage Vcc, the rise of reference voltage VN is suppressed by the current bypassing operation of P-channel MOS transistor 55f so that the amount of current that flows via MOS transistor 55g becomes constant regardless of the level of power-supply voltage Vcc. Accordingly, reference voltage VN maintains a constant voltage level regardless of the level of power-supply voltage Vcc. Thus, reference voltage VN that is stable and independent of the fluctuation of power-supply voltage Vcc can be generated.

Although control signal /FRC in the above description is set to the H level in the operating mode in which the current control of the delay stage is not performed, control signal /FRC may be fixedly set to the L level. In addition, in an operating mode in which a delay circuit is used as a normal buffer circuit, when the internal operation is stopped as in a sleep mode, for instance, control signal /FRC is set to the H level to stop the reference voltage generating operation.

Moreover, tuning signals TN1, /TN1, TN2, and /TN2 are generated by programming of a switching circuit (not shown) in order to adjust reference voltage VN during the trimming step which is the final manufacturing step of the semiconductor device. Tuning signals TN1, /TN1, TN2, and /TN2 in general are widely used in a normal reference voltage generating circuit. When CMOS transmission gates 55d and 55e attain the on state, corresponding resistance elements Z3 and Z4 are short-circuited, and the resistance between output node 55a and MOS transistor 50e becomes small so that the voltage level of reference voltage VN can be lowered.

Figure 16:
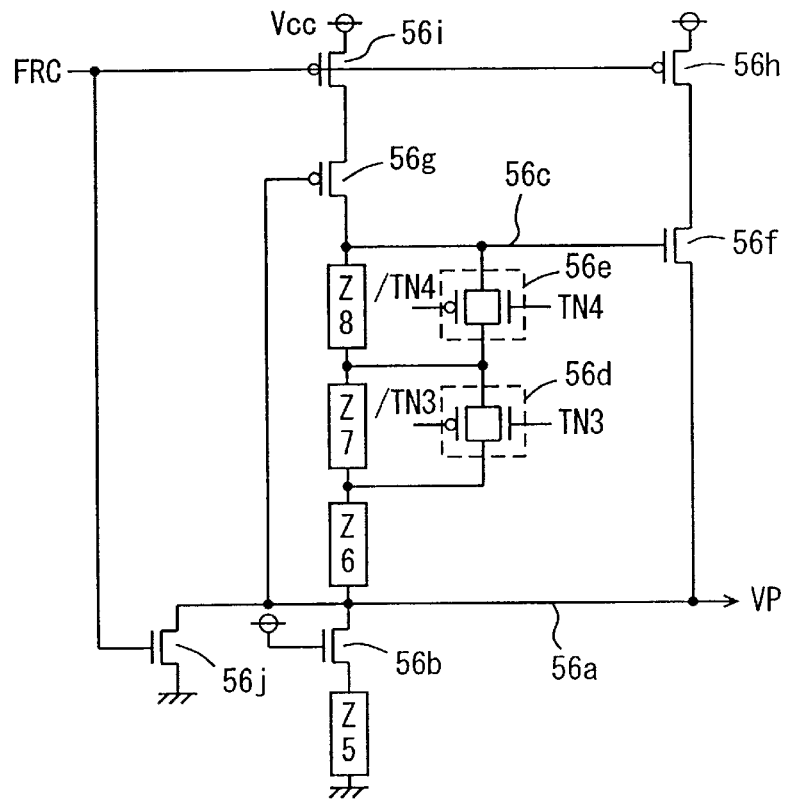
FIG. 16 is a diagram representing an arrangement of a circuit for generating a reference voltage VP shown in FIG. 14.

FIG. 16 is a diagram representing an arrangement of a portion for generating reference voltage VP shown in FIG. 14. In FIG. 16, a circuit for generating reference voltage VP includes a resistance element Z5 and an N-channel MOS transistor 56b connected in series between a ground node and an output node 56a, resistance elements Z6 to Z8 connected in series between output node 56a and a node 56c, and CMOS transmission gates 56d and 56e connected in parallel to resistance elements Z7 and Z8. MOS transistor 56b has a gate connected to a power-supply node and acts as a current-limiting resistance element. Tuning signals TN3, /TN3, and TN4, /TN4 are applied to CMOS transmission gates 56d and 56e, respectively. These tuning signals TN3, /TN3, TN4, and /TN4 may be the same signals as tuning signals TN1, /TN1, TN2, and /TN2, respectively.

The reference voltage generating circuit further includes P-channel MOS transistors 56g and 56i connected in series between node 56c and a power-supply node, an N-channel MOS transistor 56f having a source connected to output node 56a and a gate connected to node 56c, a P-channel MOS transistor 56h connected between a power-supply node and MOS transistor 56f, and an N-channel MOS transistor 56j connected between output node 56a and a ground node. A control signal FRC is applied to the gates of MOS transistors 56i, 56h, and 56j. This control signal FRC is an inverted signal of control signal /FRC shown in FIG. 15 and is employed for the same purpose.

The reference voltage generating circuit shown in FIG. 16 is the equivalent of the reference voltage generating circuit shown in FIG. 15 with the power-supply nodes exchanged for the ground nodes and vise versa and with the conductivity types of the MOS transistors reversed. Thus, a similar operation can be implemented. In other words, when control signal FRC is at the H level, MOS transistors 56*i* and 56*h* attain the off state, while MOS transistor 56*j* attains the on state so that reference voltage VP from output node 56*a* is fixed to the ground voltage. In this state, therefore, MOS transistors 50*c* and 51*c* in the delay circuit shown in FIG. 14 are normally in the on state, and the delay stage operates with the minimum delay time.

When control signal FRC is at the L level, MOS transistors 56*i* and 56*h* attain the on state, and a path through which a current flows from a power-supply node to a ground node is formed in the reference voltage generating circuit. When the power-supply voltage Vcc becomes higher than the absolute value of the threshold voltage of MOS transistor 56*g*, MOS transistor 56*g* attains the on state and supplies the current, causing the voltage level of node 56*c* to rise. If the voltage level of power supply voltage Vcc becomes higher than the threshold voltage of MOS transistor 56*b*, MOS transistor 56*b* attains the on state and a current flows through resistance elements Z5 to Z8. Thus, reference voltage VP is generated on output node 56*a* by the resistance division with these resistance elements Z5 to Z8.

MOS transistors 56*g*, 56*b*, and 56*f* function to cancel the dependency of reference voltage VP on power-supply voltage Vcc. More specifically, when the voltage level of power-supply voltage Vcc rises, the current that flows via MOS transistor 56*g* increases, and accordingly, the voltage level of node 56*c* rises. This increases the current that flows via MOS transistor 56*f*, which causes the voltage level of reference voltage VP to rise. On the other hand, due to this rise in voltage, the gate voltage of MOS transistor 56*g* rises, the conductance of MOS transistor 56*g* is lowered to reduce the supplying current. MOS transistor 56*b* discharges the current from MOS transistors 56*g* and 56*f*. Reference voltage VP is stabilized at the voltage level determined by the current discharged by MOS transistor 56*b* and the resistance value of resistance element Z5. Thus, even when power-supply voltage Vcc rises, the total current flowing through MOS transistors 56*g* and 56*f* are constant so that the current flowing through MOS transistor 56*b* accordingly becomes constant, and reference voltage VP attains a constant voltage level independent of power-supply voltage Vcc.

By utilizing the reference voltages shown in FIGS. 15 and 16, a stable reference voltage independent of power-supply voltage Vcc can be generated and an amount of delay of the delay stage can be maintained constant.

When the operating current of the delay stage is defined using reference voltages VP and VN, the delay stage utilizes power-supply voltage Vcc as an operating power-supply voltage so that the operating speed of the delay stage might be affected by the fluctuation of power-supply voltage Vcc. The arrangement of a delay circuit that realizes a constant delay time in a stable manner without being affected by power-supply voltage Vcc will be described below.

Second Arrangement of Delay Circuit

Figure 17:
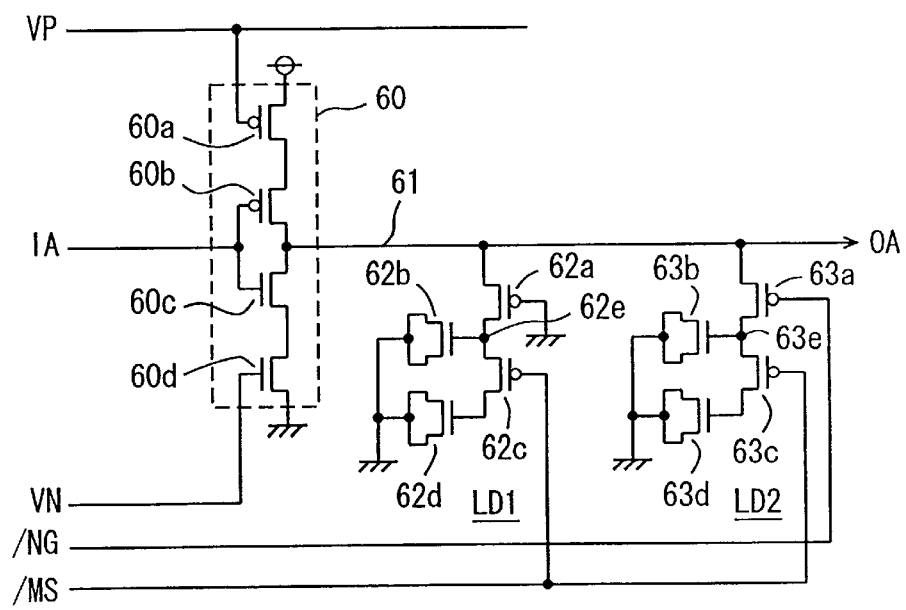
FIG. 17 is a diagram representing a first modification of a delay circuit according to the first embodiment of the present invention.

FIG. 17 is a diagram representing the second arrangement of the delay circuit according to the first embodiment of the present invention. In FIG. 17, the delay circuit includes an inverter circuit 60 having its operating current defined by reference voltages VP and VN and driving an output node 61 according to an input signal IA, a variable output load circuit LD1 coupled to output node 61 and having its capacitance value changed according to the voltage level of output node 61, and a variable output load circuit LD2 selectively functioning as a load for output node 61 by control signals /NG and /MS.

Inverter circuit 60 includes P-channel MOS transistors 60*a* and 60*b* connected in series between a power-supply node and output node 61, and N-channel MOS transistors 60*c* and 60*d* connected in series between output node 61 and a ground node. Reference voltage VP is applied to a gate of P-channel MOS transistor 60*a*, and reference voltage VN is applied to a gate of N-channel MOS transistor 60*d*. Input signal IA is applied to gates of MOS transistors 60*b* and 60*c*.

Variable output load circuit LD1 includes a P-channel MOS transistor 62*a* connected between output node 61 and a node 62*e* and having a gate coupled to a ground node, an MOS capacitor 62*b* connected between node 62*e* and a ground node, a P-channel MOS transistor 62*c* having one conduction node coupled to node 62*e* and receiving a control signal /MS at a gate, and an MOS capacitor 62*d* coupled between the other conduction node of MOS transistor 62*c* and a ground node. MOS capacitors 62*b* and 62*d* are formed by N-channel MOS transistors, and their drains/sources are coupled to a ground node.

Variable output load circuit LD2 includes a P-channel MOS transistor 63*a* connected between output node 61 and a node 63*e* and receiving a control signal /NG at a gate, an MOS capacitor 63*b* connected between MOS transistor 63*a* and a ground node, a P-channel MOS transistor 63*c* having one conduction node coupled to node 63*e* and receiving control signal /MS at a gate, and an MOS capacitor 63*d* connected between the other conduction node of MOS transistor 63*c* and a ground node. Control signal /MS is applied to a gate of MOS transistor 63*c*. MOS capacitors 63*b* and 63*d* are each formed of an MOS transistor, and their drains/sources are coupled to a ground node.

Control signals /NG and /MS are fixed to the H level or the L level according to the purpose for which the delay circuit is used (the position of the memory bank and such) to adjust the load capacitance value for output node 61.

Figure 18:
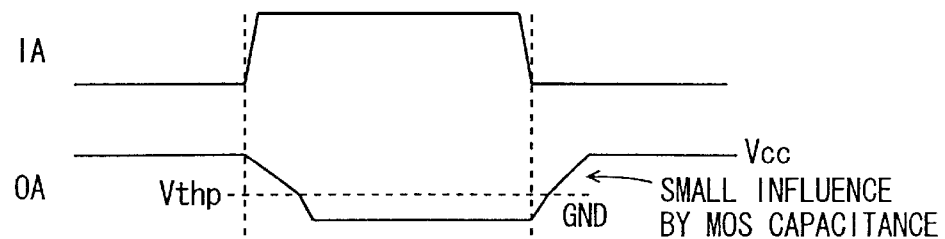
FIG. 18 is a signal waveform diagram representing an operation of the delay circuit shown in FIG. 17.

FIG. 18 is a signal waveform diagram representing an operation of the delay circuit shown in FIG. 17. The operation of the delay circuit shown in FIG. 17 will now be described with reference to FIG. 18. It is assumed that control signals /NG and /MS are both at the H level, and that MOS transistors 62*c*, 63*a*, and 63*c* are all in the off state. In this case, MOS capacitors 62*d*, 63*b*, and 63*d* are normally isolated from output node 61.

The case is considered in which input signal IA is at the L level. In this state, an output signal OA on output node 61 is at a power-supply voltage Vcc level or the H level. When input signal IA rises from the L level to the H level, MOS transistor 60*b* transitions to the off state, while MOS transistor 60*c* transitions to the on state, lowering the voltage level of output node 61. While the voltage level of output signal OA is higher than an absolute value Vthp of the threshold voltage of MOS transistor 62*a*, P-channel MOS transistor 62*a* is in the on state, and MOS capacitor 62*b* is coupled to output node 61 so that the accumulated charge of MOS capacitor 62*b* is discharged via MOS transistors 62*a* and 60*c*. The voltage level of output signal OA at output node 61 becomes lower than or equal to absolute value Vthp of the threshold voltage of the MOS transistor, MOS transistor 62*a* attains the off state and MOS capacitor 62*b* is isolated from output node 61. Thus, output node 61 is discharged at a high speed via MOS transistor 60*c*.

On the other hand, when input signal IA falls from the H level to the L level, output signal OA rises from the L level to the H level. At this time, MOS transistor 62*a* is in the off state until the voltage level of output node 61 exceeds absolute value Vthp of the threshold voltage of MOS transistor 62a, and MOS capacitor 62b is isolated from output node 61 so that the voltage level of output node 61 rises at a relatively high speed. When the voltage level of output node 61 exceeds absolute value Vthp of the threshold voltage of MOS transistor 62a, MOS transistor 62a attains the on state, and MOS capacitor 62b is coupled to output node 61. The load of output node 61 becomes large, and output node 61 is gradually charged at the time constant that is determined by the capacitance value of MOS capacitor 62b and the on-resistance of MOS transistors 62a and 60b.

Therefore, if the power-supply voltage Vcc is 1.0 V, for example, and substantially equal to the absolute value of the threshold voltage of MOS transistor 62a, MOS transistor 62a is in the off state during the voltage level transition of output node 61, and MOS capacitor 62b is isolated from output node 61. When power-supply voltage Vcc is low, the drivability of output inverter circuit 60 on output node 61 becomes low (since the amplitude of input signal IA becomes small). In this state, the output load is small, and therefore, when the output drivability of inverter circuit 60 is reduced due to the lowering of the power supply voltage, output node 61 is discharged/charged with the output load on the output node 61 reduced. Thus, the load on output node 61 can be adjusted according to the voltage level of the power-supply voltage to suppress the fluctuation of the output node driving rate due to the fluctuation in the power-supply voltage level, and as a result, a delay circuit having a delay time that is not dependent on the power-supply voltage Vcc level can be implemented.

When control signal /MS is set to the L level, MOS transistor 62c selectively attains the on state according to the voltage level of output node 61 in variable output load circuit LD1. MOS transistors 62a and 62c attain the on state when the voltage level of output node 61 is higher than absolute value Vthp of the threshold voltage, and both MOS transistors 62a and 62c attain the off state when the voltage level of output node 61 is lower than absolute value Vthp of the threshold voltage. Therefore, MOS capacitors 62b and 62d can be selectively coupled to output node 61 to adjust the delay time when control signal /MS is set at the L level. The same applies to variable output load circuit LD2.

Third Arrangement of Delay Circuit

Figure 19:
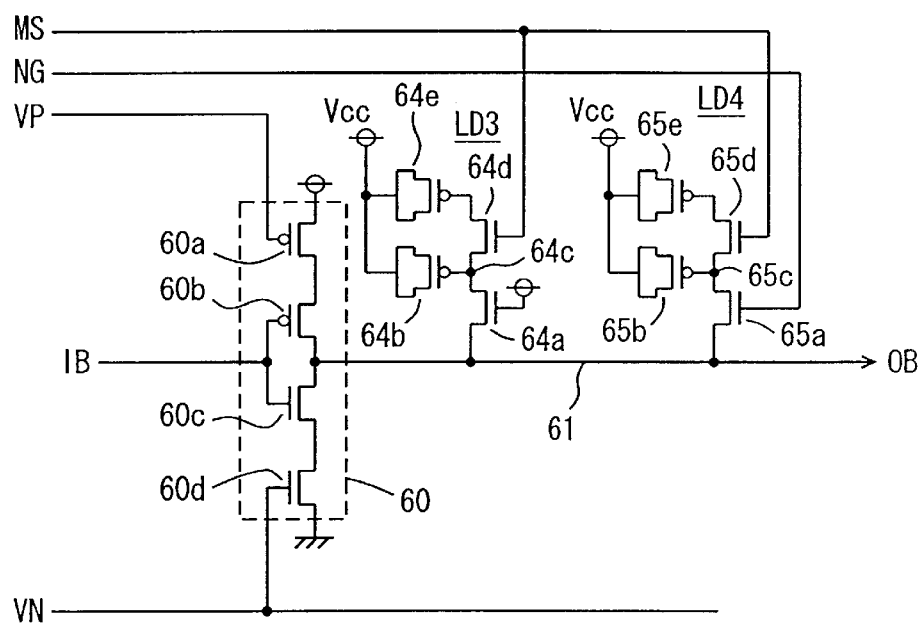
FIG. 19 is a diagram representing an arrangement of a second modification of the delay circuit according to the first embodiment of the present invention.

FIG. 19 is a diagram representing the third arrangement of the delay circuit according to the first embodiment of the present invention. In FIG. 19, an inverter circuit 60 drives an output node 61 according to an input signal IB to generate an output signal OB. Variable output load circuits LD3 and LD4 are coupled in parallel to output node 61. Inverter circuit 60 has the same arrangement as inverter circuit 60 shown in FIG. 17, and corresponding parts are denoted by the same reference numerals. Inverter circuit 60 also has its operating current defined by reference voltages VP and VN.

Variable output load circuit LD3 includes an N-channel MOS transistor 64a connected between output node 61 and a node 64c and having a gate connected to a power-supply node, an MOS capacitor 64b connected between node 64c and a power-supply node, an N-channel MOS transistor 64d having one conduction node coupled to node 64c and receiving a control signal MS at a gate, and MOS capacitor 64e connected between the other conduction node of MOS transistor 64d and a power-supply node. MOS capacitors 64b and 64e are formed using P-channel MOS transistors having their sources/drains coupled to a power-supply node.

Figure 20:
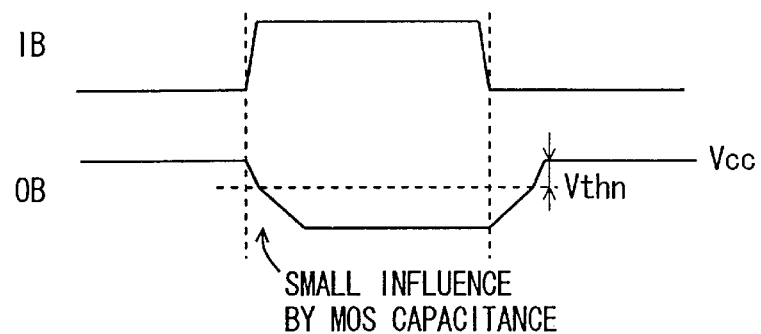
FIG. 20 is a signal waveform diagram representing an operation of the delay circuit shown in FIG. 19.

Variable output load circuit LD4 includes an N-channel MOS transistor 65a connected between output node 61 and a node 65c and receiving a control signal NG at a gate, an MOS capacitor connected between node 65c and a power-supply node, an N-channel MOS transistor 65d having one conduction node connected to node 65c and receiving control signal MS at a gate, and an MOS capacitor 65e connected between the other conduction node of MOS transistor 65d and a power-supply node. MOS capacitors 65b and 65e both are formed using P-channel MOS transistors with their sources/drains coupled to the power-supply node. Now, the operation of the delay circuit shown in FIG. 19 will be described with reference to the signal waveform diagram shown in FIG. 20.

When input signal IB is at the L level, output signal OB is at a power-supply voltage Vcc level or the H level. Now, it is assumed that control signals NG and MS are both at the L level, and that MOS transistors 64b, 65a, and 65b are all in the off state. In this state, MOS transistor 64a is also off so that output node 61 and MOS capacitor 64b are isolated.

When input signal IB rises from the L level to the H level and output node 61 is discharged by MOS transistor 60c, MOS transistor 64a maintains its off state until the voltage level of output signal OB reaches Vcc-Vthn. Here, "Vthn" represents the threshold voltage of MOS transistor 64a. When the voltage level of output signal OB becomes lower than or equal to Vcc-Vthn, MOS transistor 64a attains the on state so that MOS capacitor 64b is coupled to output node 61. MOS capacitor 64b has its gate electrode charged to the H level in the previous cycle, and the accumulated charge of the gate electrode of MOS capacitor 64b is transmitted to output node 61, and output node 61 is slowly discharged to a ground voltage level.

When input signal IB falls from the H level to the L level, output node 61 is at the L level, MOS transistor 64a is in the on state, and MOS capacitor 64b stores the charge of the L level signal in its gate electrode node. Thus, MOS capacitor 64b must be charged when inverter circuit 60 is to drive output node 61, and output signal OB slowly rises in voltage level. When the voltage level of output signal OB from output node 61 reaches Vcc-Vthn, MOS transistor 64a attains the off state, MOS capacitor 64b is isolated from output node 61, and output signal OB attains the H level at a high speed.

Therefore, in the arrangement shown in FIG. 19, a relatively long delay time can be provided when input signal OB falls from the H level to the L level. When an MOS transistor is used as a capacitor, the capacitance value varies depending on the voltage level of the gate electrode. Thus, for instance, when a P-channel MOS transistor is used as an MOS capacitor, the capacitance value becomes the greatest when the gate electrode is at the L level, while the capacitance value becomes the smallest when the gate electrode voltage is at the H level. As a result, the average value is considered to be the output load.

Fourth Arrangement of Delay Circuit

Figure 21:
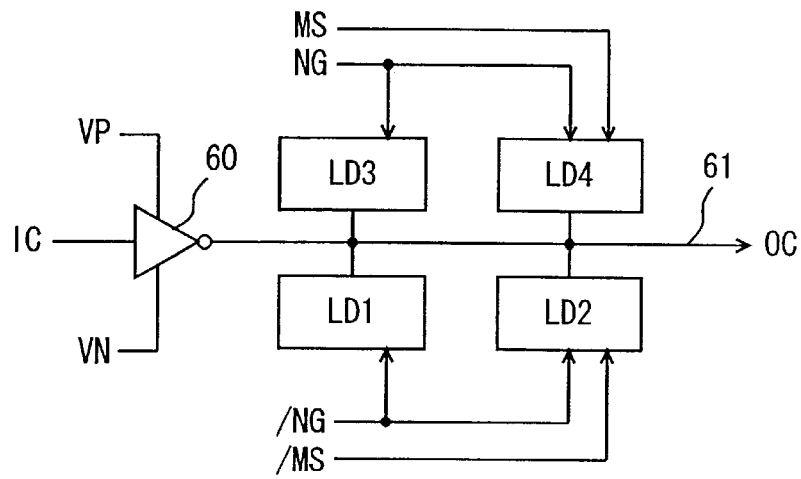
FIG. 21 is a schematic representation of an arrangement of a third modification of the delay circuit according to the first embodiment of the present invention.

FIG. 21 is a schematic representation of a fourth arrangement of the delay circuit according to the first embodiment of the present invention. In FIG. 21, an inverter circuit 60 drives an output node 61 according to an input signal IC to generate an output signal OC. The inverter circuit 60 has its operating current defined by reference voltages VP and VN. Variable output load circuits LD1, LD2, LD3, and LD4 are connected to output node 61. These variable output load circuits LD1, LD2, LD3, and LD4 are the same as the arrangements shown in FIGS. 17 and 19.

Figure 22:
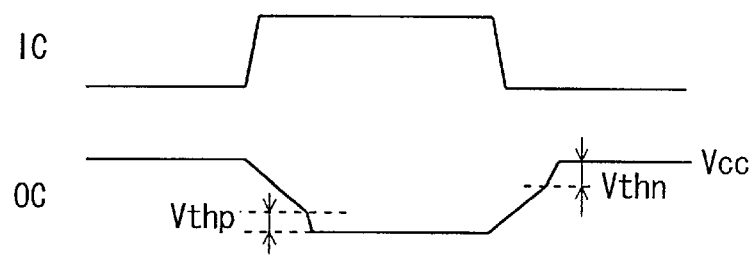
FIG. 22 is a signal waveform diagram representing an operation of the delay circuit shown in FIG. 21.

With the arrangement of the delay circuit shown in FIG. 21, when input signal IC rises from the L level to the H level, as shown in FIG. 22, variable output load circuits LD1 and LD2 cause output signal OC to lower slowly to the voltage level Vthp. When output signal OC falls to voltage Vthp or lower, loads of output load circuits LD1 and LD2 are disconnected from the output node 61, and output node 61 is discharged at a high speed. Upon the rise of input signal IC to the H level, the accumulated charge of the MOS capacitors in variable output circuits LD3 and LD4 is substantially 0 (or Vthp·C) and thus, extremely small, so that they have substantially no influence on the discharging operation.

On the other hand, when input signal IC falls from the H level to the L level, output variable load circuits LD3 and LD4 cause output signal OC to rise slowly until output signal OC is lowered to voltage Vcc-Vthn. Thus, the delay time can be provided to the rise of and at the fall of input signal IC. By utilizing this arrangement, the effect of the change in the capacitance value during the transient response of the MOS capacitor can be suppressed, and the delay times at the rise and at the fall can be stably and reliably produced.

Figure 23:
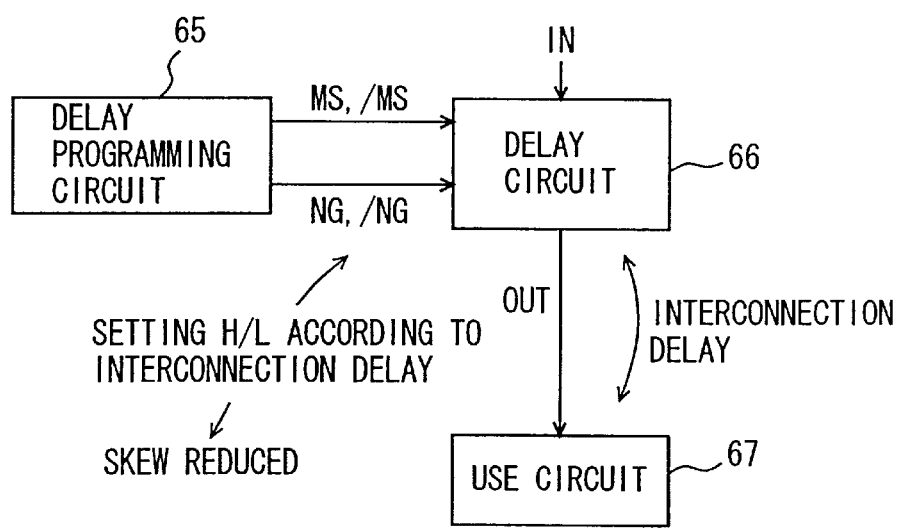
FIG. 23 is a schematic representation of the delay programming of the delay circuit according to the first embodiment of the present invention.

FIG. 23 is a schematic representation of the arrangement of a portion for generating a control signal for output load adjustment. Output load control signals MS, /MS, NG, /NG are applied to a delay circuit 66 from a delay programming circuit 65. Delay circuit 66 delays an input signal IN, generates an output signal OUT, and applies output signal OUT to a use circuit 67. A certain amount of interconnection delay exists between delay circuit 66 and use circuit 67. This interconnection line delay varies due to the variation of manufacturing parameters and the like. According to the interconnection line delay between delay circuit 66 and use circuit 67, the H/L levels of control signals MS, /MS, NG, and /NG from delay programming circuit 65 are set by the programming of a fuse element, for instance. By the programming of the control signals in delay programming circuit 65, the delay time that allows for the interconnection line delay can be provided to delay circuit 66. Accordingly, the skew of each signal can be reduced, and signals that are matched in phase can be applied to use circuit 67. A delay programming circuit 65 is provided correspondingly to each delay circuit 66. Moreover, when use circuit 67 is formed into a bank arrangement as shown in FIG. 1, delay circuit 66 may be provided per bank.

Figure 24:
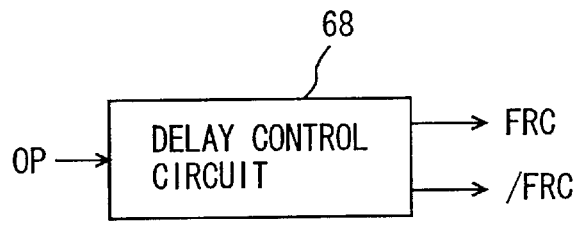
FIG. 24 is a schematic representation of an arrangement of a portion for generating switching control signals FRC and /FRC shown in FIGS. 15 and 16.

FIG. 24 is a schematic representation of the arrangement of a portion for generating control signals FRC and /FRC applied to the reference voltage generating circuits (see FIGS. 17 and 19). In FIG. 24, these control signals FRC and /FRC are generated from delay control circuit 68 that responds to an operating mode instruction signal OP. Operating mode instruction signal OP is a signal that instructs a sleep mode for instance, when the internal operation is stopped and a refresh operation is internally and periodically performed in the case of a DRAM (Dynamic Random Access Memory), for example, and sets control signals FRC and /FRC at the H level and the L level, respectively, and sets reference voltages VN and VP to a power-supply voltage Vcc and a ground voltage GND levels. Thus, the consumed current in the reference voltage generating circuit is reduced. In the delay circuit, the input signal does not change during the sleep mode so that the input/output signal is fixed, and no problem arises due to the shortened delay time. In addition, the refresh operation during the sleep mode does not require a high-speed operation so that there is no need to perform an operation in synchronization with a clock signal, and the generation of a signal skew does not cause a problem.

Alternatively, FRC and /FRC may be used to set the delay time of the delay circuit to the minimum value.

Figure 25:
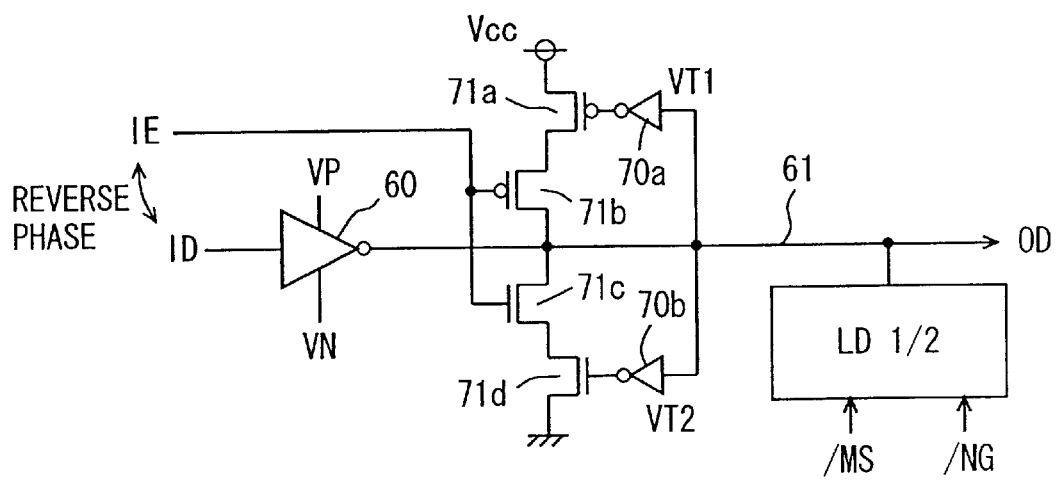
FIG. 25 is a diagram representing an arrangement of a fourth modification of the delay circuit according to the first embodiment of the present invention.

FIG. 25 is a schematic representation of a fifth arrangement of the delay circuit according to the first embodiment of the present invention. In FIG. 25, the delay circuit includes an inverter circuit 60 for driving an output node 61 according to an input signal ID, and a variable output load circuit LD1/2 coupled to output node 61 and having its output load set according to control signals /MS and /NG and having its load changing according to the voltage level of output node 61. The arrangements of inverter circuit 60 and variable output load circuit LD1/2 is the same as those shown in FIG. 17. In other words, inverter circuit 60 has its operating current adjusted by reference voltages VP and VN, and variable output load circuit LD1/2 selectively couples MOS capacitors to output node 61 according to the voltage level of output node 61 by P-channel MOS transistors (62a and 63a).

The delay circuit shown in FIG. 25 further includes an inverter 70a having an input logic threshold VT1 and inverting a signal of output node 61, an inverter 70b having an input logic threshold VT2 and inverting the signal of output node 61, a P-channel MOS transistor 71a having a source coupled to a power-supply node and rendered conductive in response to an output signal from inverter 70a, a P-channel MOS transistor 71b coupled between MOS transistor 71a and output node 61 and receiving an input signal IE at its gate, an N-channel MOS transistor 71d having a source coupled to a ground node and receiving an output signal from inverter 70b at a gate, and an N-channel MOS transistor 71c connected between MOS transistor 71d and output node 61 and receiving input signal IE at a gate.

Input signal IE is a signal having a reverse phase and leading in phase relative to input signal ID. Thus, an inverter is provided in the preceding stage of inverter circuit 60, and an input signal from the inverter at this preceding stage is used as input signal IE. Now, the operation of the delay circuit shown in FIG. 25 will be described in relation to the signal waveform diagram shown in FIG. 26.

When input signal ID is at the L level, input signal IE is at the H level, MOS transistor 71b is in the off state, and MOS transistor 71c is in the on state. In addition, an output signal OD from output node 61 is at the H level, MOS transistor 71a is in the on state, and MOS transistor 71d is in the off state. Input signal IE falls from the H level to the L level, and thereafter, input signal ID rises from the L level to the H level. When input signal IE falls to the L level, MOS transistor 71b attains the on state and MOS transistor 71c attains the off state. In this state, an N-channel MOS transistor (60c, see FIG. 17) attains the on state and discharges output node 61 in inverter circuit 60.

While the voltage level of output signal OD of output node 61 is higher than or equal to voltage Vthp, a MOS capacitor of variable output load circuit LD1/2 is coupled to output node 61, and output signal OD is lowered in voltage level slowly. On the one hand, while output signal OD is lowered slowly, input logic threshold VT2 of inverter circuit 70b is set relatively high, and an output signal from inverter 70b changes to the H level at a fast timing so that the through current of inverter 70b is suppressed. On the other hand, inverter 70a has its input logic threshold VT1 set sufficiently low so that, during the slow discharging of output node 61, an output signal from inverter 70a maintains the L level, and MOS transistor 71a maintains the on state. Therefore, a current is supplied via MOS transistors 71a and 71b to output node 61, and thus, the fall of output signal OD becomes slow.

When output signal OD becomes lower than input logic threshold VT1, the output signal of inverter 70a attains the H level, and MOS transistor 71a attains the offstate. The current supply to output node 61 is cut off, and output signal OD is driven to the L level by inverter circuit 60. If VT1=Vthp, the delay can be made large most effectively.

On the other hand, when input signal ID falls from the H level to the L level, input signal IE already rises from the L level to the H level, and thus, MOS transistor 71b is in the off state, while MOS transistor 61c is in the on state. In this state, inverter circuit 60 drives output node 61 and causes the voltage level of output signal OD to rise. Variable output load circuit LD1/2 has the MOS capacitors charged slowly according to the rise in voltage level of output signal OD at the rise of output signal OD (see FIG. 17) so that output signal OD slowly rises.

In addition, at the rise of output signal OD, the output signal of inverter 70a attains the L level at the point when output signal OD exceeds input logic threshold VT1, and the through current in inverter 70a is suppressed. On the other hand, inverter 70b outputs an H level signal until output signal OD exceeds input logic threshold VT2, and maintains MOS transistor 71d in the on state. Thus, when output signal OD rises to the H level, output node 61 is discharged via MOS transistors 71c and 71d, and output signal OD rises slowly. When output signal OD rises higher than input logic threshold VT2, the output signal of inverter 70b attains the L level, and MOS transistor 71d attains the off state.

In variable output load circuit LD1/2, the capacitance value of the MOS capacitor gradually increases according to the rise of the voltage level at output node 61, thereby causing output signal OD to rise slowly. By this time, the discharging of output signal OD is stopped, and output signal OD rises according to the load of variable output load circuit LD1/2.

Figure 26:
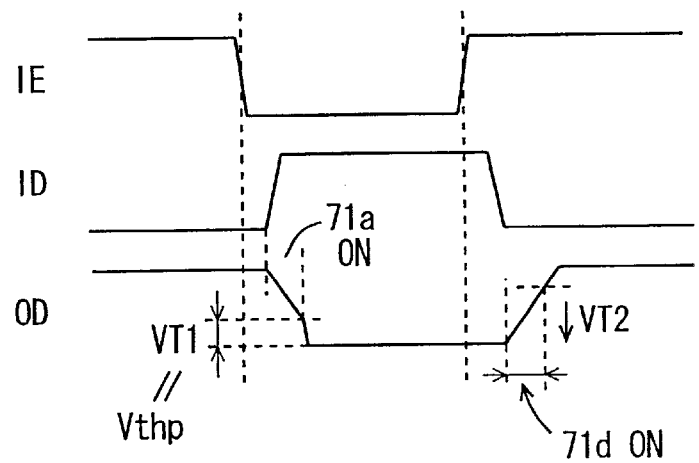
FIG. 26 is a signal waveform diagram representing an operation of the delay circuit shown in FIG. 25.

Thus, as shown in FIG. 26, a current is supplied to output node 61 in the direction that allows suppression of the change of the output signal of inverter circuit 60 until the logic level of output signal OD becomes definite so that output signal OD can be made to rise slowly in voltage level, and the delay time of great magnitude can be obtained.

When the voltage level of power-supply voltage Vcc rises and the drivability of inverter circuit 60 becomes greater, the amount of current that flows through the path of MOS transistors 71a to 71d also increases. Accordingly, the speed at which output signal OD from output node 61 changes can be held at a constant value, thereby the delay time of the delay circuit can be kept constant. Conversely, when the voltage level of power-supply voltage Vcc is lowered and the drivability of inverter circuit 60 becomes smaller, the current drivability of MOS transistors 71a to 71d also decreases so that the changing speed of output signal OD does not change since the smaller drivability on the output signal of inverter circuit 60 results in the smaller drivability in the opposite direction, and the delay time can be kept constant.

First Modification to Fifth Arrangement of Delay Circuit

Figure 27:
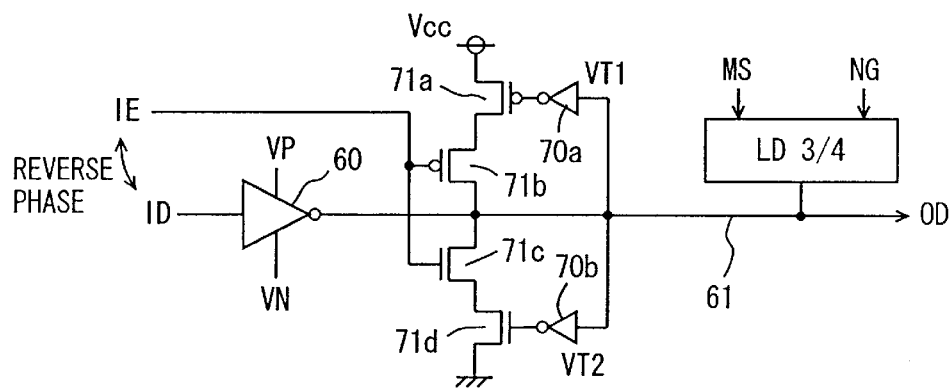
FIG. 27 is a schematic representation of an arrangement of a fifth modification of the delay circuit according to the first embodiment of the present invention.

FIG. 27 is a schematic representation of an arrangement of the first modification to the fifth arrangement of the delay circuit. The arrangement of the delay circuit shown in FIG. 27 differs from the arrangement of the delay circuit shown in FIG. 25 in that variable output load circuit LD1/2 is replaced with variable output load circuit LD3/4. Variable output load circuit LD3/4 corresponds to variable output load circuits LD3 and LD4 shown in FIG. 19. The arrangement in the other parts is the same as that shown in FIG. 25, and corresponding components are denoted by the same reference numerals.

Figure 28:
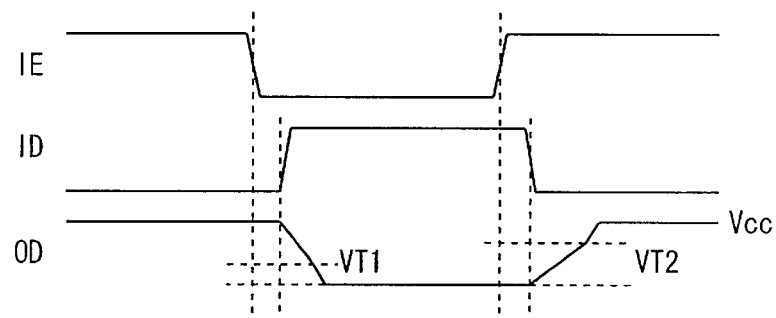
FIG. 28 is a signal waveform diagram representing an operation of the delay circuit shown in FIG. 27.

In the arrangement of the delay circuit shown in FIG. 27, as shown in FIG. 28, when output signal OD rises from the L level to the H level, the output load of variable output load circuit LD3/4 changes. On the other hand, in the change of output signal OD, the capacitance value of the MOS capacitor in variable output load circuit LD3/4 increases with the lowering of output signal OD, and output signal OD from output node 61 is lowered relatively slowly. At this time, like the arrangement shown in FIG. 25, MOS transistors 71a to 71d drive the current in the direction that allows suppression of the change of output signal OD, so that output signal OD changes more slowly over the time longer than the delay time defined by output load circuit LD3/4.

In the arrangement shown in FIG. 27, when the drivability of inverter circuit 60 is lowered in the fluctuation of power-supply voltage Vcc, the drivability of MOS transistors 71a to 71d is accordingly lowered so that the capability to suppress the change becomes low, and thus, the delay time can be prevented from becoming longer. Thus, the delay circuit that has a constant delay time regardless of the fluctuation of power-supply voltage Vcc can be implemented.

Second Modification to Fifth Arrangement of Delay Circuit

Figure 29:
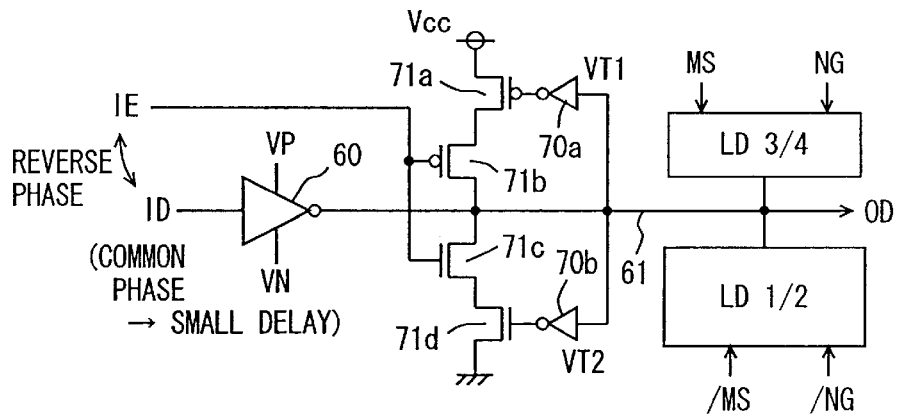
FIG. 29 is a schematic representation of an arrangement of a sixth modification of the delay circuit according to the first embodiment of the present invention.

FIG. 29 is a schematic representation of the arrangement of the second modification of delay circuit 5a according to the first embodiment of the present invention. In FIG. 29, variable output load circuit LD1/2 and LD3/4 are both provided to output node 61. The arrangement in other parts is the same as that shown in FIGS. 25 and 27.

In the arrangement shown in FIG. 29, the changes in the load of output node 61 can be made the same in the rise of and the fall of output signal OD so that the waveforms of output signal OD in the rise and in the fall can be made the same form, and thus, a constant amount of delay time can be provided accurately for both the rise time and the fall time of output signal OD.

In addition, in the arrangement shown in FIG. 29, in the case in which input signals IE and ID are signals of a common phase, when inverter circuit 60 drives output node 61, MOS transistors 71a to 71d drive the node 61 in the same direction so that output signal OD changes at a high speed, and the delay time can be shortened accordingly (provided that input logic thresholds of inverters 70a and 70b is set to VT2 and VT1, respectively).

Second Overall Arrangement of Delay Circuit

Figure 30:
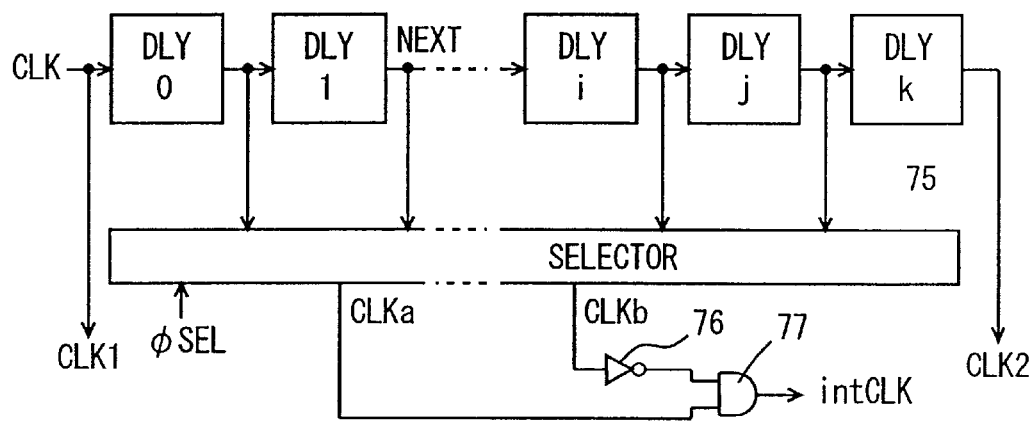
FIG. 30 is a schematic representation of an overall arrangement of the delay circuit according to the first embodiment of the present invention.

FIG. 30 is a schematic representation of the second overall arrangement of the delay circuit according to the first embodiment of the present invention. In FIG. 30, the delay circuit includes a plurality of cascaded delay stages DLY0 to DLYk, a selector 75 for selecting output signals from two delay stages according to selecting signal φSEL, an inverter 76 for inverting a clock signal CLKb selected by selector 75, and an AND circuit 77 receiving an output signal from inverter 76 and another clock signal CLKa selected by selector 75 to generate an internal clock signal intCLK.

Delay stages DLY0 to DLYk each output a received signal after the delay of a prescribed period of time. Any of the delay circuits shown above in relation to FIG. 14 et seq. can be employed as delay stages DLY0 to DLYk.

Figure 31:
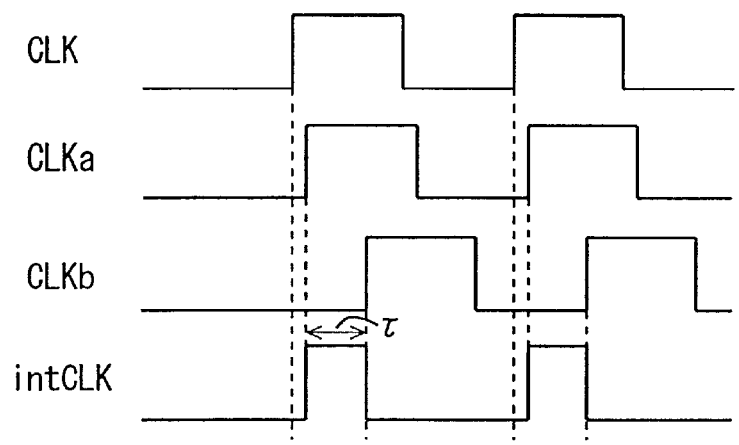
FIG. 31 is a signal waveform diagram representing an operation of the delay circuit shown in FIG. 30.

Selector 75 selects two of the output signals from these delay stages DLY0 to DLYk according to selecting signal φSEL. Now, the operation of the delay circuit shown in FIG. 30 will be described with reference to the signal waveform diagram shown in FIG. 31.

Delay stages DLY0 to DLYk each output a received clock signal CLK after the delay of a prescribed period of time. Suppose that clock signals CLKa and CLKb are selected by selector 75. A pulse signal having an equal pulse width to a delay time τ between clock signals CLKa and CLKb is output as internal clock signal intCLK by inverter 76 and AND circuit 77. Internal clock signal intCLK is a pulse signal having a delay of a prescribed period of time (the delay time of clock signal CLKa) relative to an external clock signal CLK and having a constant time width τ.

Thus, even when the pulse width of external clock signal CLK varies due to a skew and the like, internal clock signal intCLK having a constant pulse width can be generated without being affected by such variation. External clock signal CLK can also be used as an internal clock signal CLK1, for instance, as a clock signal for data input/output. Moreover, a clock signal CLK2 output by the final stage, delay stage DLYk, can be used as a clock signal that provides an operation timing for other peripheral circuitry (circuitry that operate in synchronization with the fall of clock signal CLK) and the like. Here, clock signal CLKa is formed having a constant delay time relative to external clock signal CLK for the following reason. A delay is caused in a buffer circuit and such when internal circuit operates, and variation of the delay time of the clock signal line is caused due to variation of interconnection line capacitance or the like. In order to compensate for such delay time and to reduce the skews, internal clock signal CLKa having a constant delay time relative to external clock signal CLK is employed.

In the case that the pulse width of internal clock signal intCLK is decided, selecting signal φSEL is so generated as to select a clock signal CLKa having a delay time that makes the skew as small as possible and an output signal of a delay stage located downstream by a prescribed number of stages. For instance, in the AC (alternating current) test and the like, a delay clock signal to be selected in the delay circuit is determined such that an internal signal is taken in at the optimal timing. Pulse width τ may be variable, which is achieved by individually selecting the delay stages to be selected.

As described above, according to the first embodiment of the present invention, a delay circuit is provided within a semiconductor device in order to compensate for the changes in interconnection line capacitance and the like and to reduce the skews between the signals, and the signals with reduced skews are transmitted to the internal circuits, so that the internal circuits can be operated with stability.

Moreover, a current is supplied in the direction that allows the change of an output signal from a delay inverter circuit to be suppressed until the logic level of the output signal from the succeeding stage is inverted, so that a constant delay time can be provided even when the power-supply voltage fluctuates. Thus, a delay circuit having a constant delay time regardless of the power-supply voltage and the operating temperature can be implemented.

Further, a reference voltage generating circuit for defining an operating current of a delay inverter circuit includes a current-limiting MOS transistor and a current-bypassing MOS transistor provided to a resistance voltage-dividing circuit, so that a constant amount of current is supplied to the resistance voltage-dividing circuit even when the power-supply voltage fluctuates, and a reference voltage of a constant voltage level independent of power-supply voltage Vcc can be stably generated.

Second Embodiment

Figure 32:
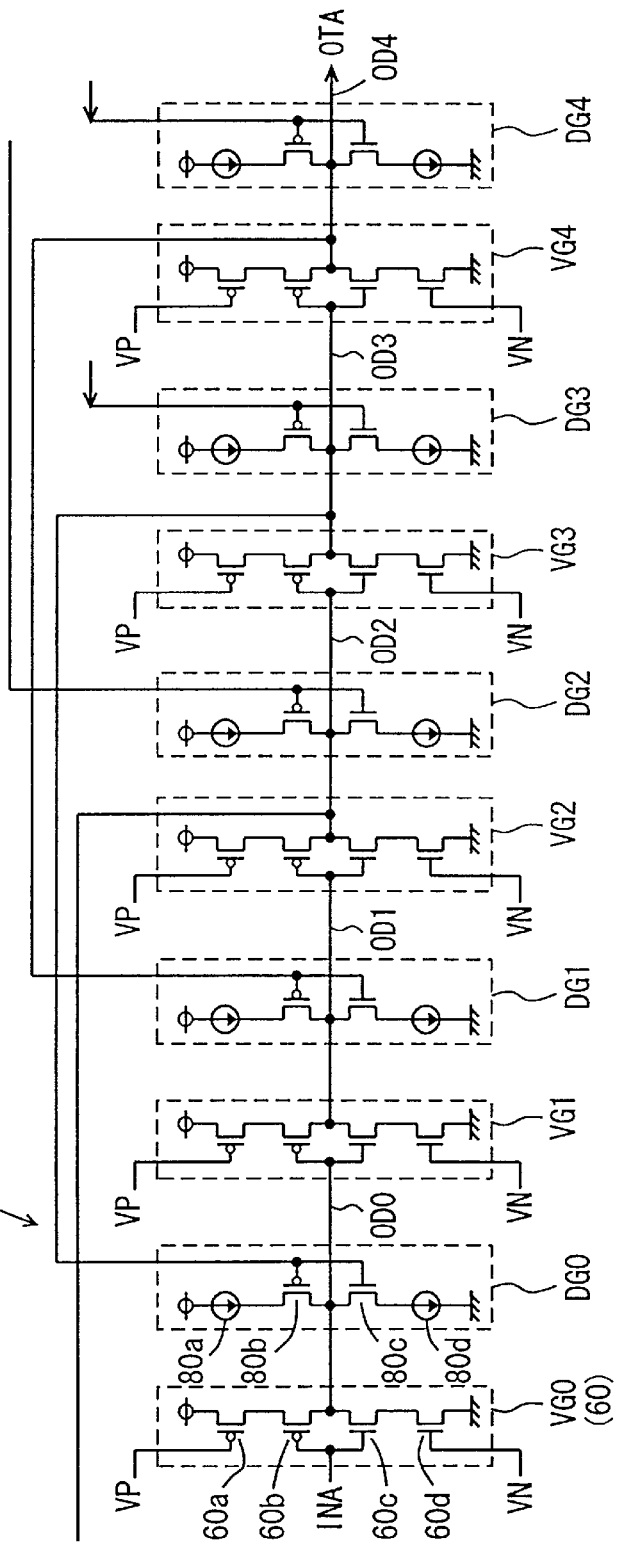
FIG. 32 is a diagram representing an arrangement of a delay circuit according to a second embodiment of the present invention.

FIG. 32 is a diagram representing an arrangement of a delay circuit according to a second embodiment of the present invention. In FIG. 32, the delay circuit includes a plurality of cascaded inverter circuits VG0 to VG4, and current control circuits DG0 to DG4 provided corresponding to the respective output nodes of these inverter circuits VG0 to VG4. This delay circuit is formed with a chain of a plurality of inverters, and a portion of the inverter chain is shown in FIG. 32.

Each of inverter circuits VG0 to VG4 has the same arrangement as inverter circuit 60 shown in FIG. 17 or FIG. 19, and includes MOS transistors 60a and 60d receiving reference voltages VP and VN at their respective gates and MOS transistors 60b and 60c receiving an input signal IN (INA) at their gates. MOS transistors 60a and 60b are P-channel MOS transistors, while MOS transistors 60c and 60d are N-channel MOS transistors.

Current control circuits DG0 to DG4 supply the current to the corresponding output nodes OD0 to OD4 according to output signals of inverters each located downstream by an odd number of stages (three stages in FIG. 32). Here, the term "supply" signifies both charging and discharging. These current control circuits DG0 to DG4 each have the same arrangement so that FIG. 32 representatively shows reference numerals allotted to each component of current control circuit DG0 alone. Current control circuit DG0 includes a current source 80a coupled to a power-supply node, a P-channel MOS transistor 80b coupled between an output node OD0 and current source 80a and receiving a signal of an output node OD3 at a gate, an N-channel MOS transistor 80c coupled to output node OD0 and receiving the signal of output node OD3 at a gate, and a constant-current source 80d coupled between MOS transistor 80c and a ground node. The currents supplied by constant current sources 80a and 80d are adjustable in the range of one to N times.

In the arrangement of the delay stage shown in FIG. 32, the potential change of the corresponding output node is suppressed until the logic level of a reverse-phase signal of an inverter circuit at a subsequent stage is inverted. Thus, the delay time can be significantly increased.

Figure 33:
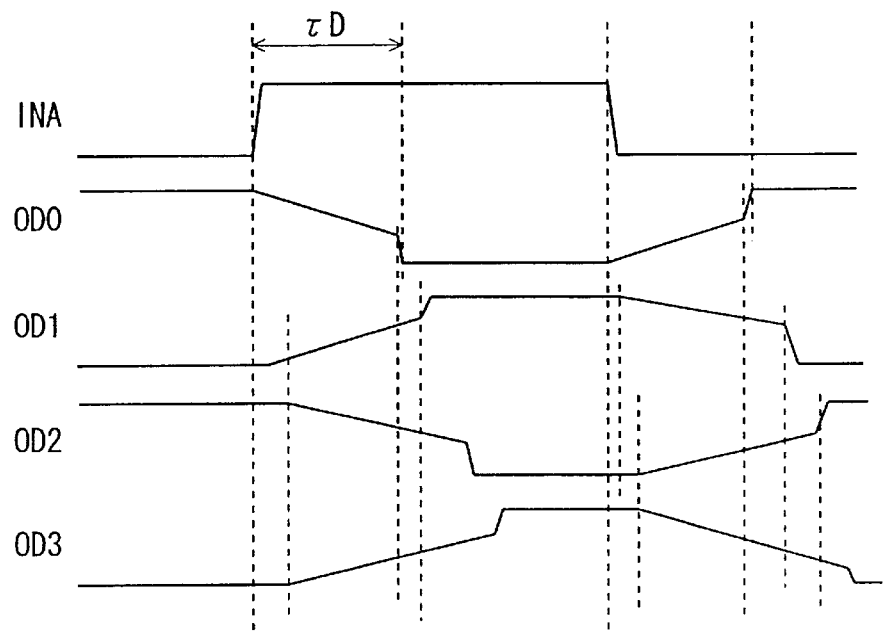
FIG. 33 is a signal waveform diagram representing an operation of the delay circuit shown in FIG. 32.

FIG. 33 is a signal waveform diagram representing an operation of the delay circuit shown in FIG. 32. The operation of the delay circuit shown in FIG. 32 will be briefly described below with reference to FIG. 33.

For the simplicity of description, input signal INA provided to inverter circuit VG0 is provided from the buffer circuit of the initial stage in FIG. 33 and it is assumed that the signal waveform of input signal INA is steep.

When input signal INA rises from the L level to the H level, the signal on output node OD0 of inverter circuit VG0 falls from the H level to the L level. At this time, the output signal from inverter circuit VG3 of the subsequent stage is at the L level so that P-channel MOS transistor 80b in current control circuit DG0 is in the on state, and the current from current source 80a is supplied to output node OD0, and the signal of output node OD0 is lowered slowly.

When the signal of output node OD0 is lowered slowly, the charging P-channel MOS transistor in inverter circuit VG1 of the subsequent stage slowly attains the on state, slowly beginning to charge output node OD1, and the voltage level of output node OD1 rises. This change in voltage is propagated sequentially to an output node OD2 and to an output node OD3, and the respective voltage levels of output nodes OD2 and OD3 change slowly.

When the voltage level of output node OD3 exceeds the input logic threshold of current control circuit DG0, P-channel MOS transistor 80b rapidly attains the off state while MOS transistor 80c rapidly attains the on state in current control circuit DG0 so that output node OD0 is discharged to a ground voltage level at a high speed. This voltage change on output node OD0 is propagated to inverter circuit VG1 of the next stage. Although the current drivability of inverter VG1 on output node OD1 becomes great, current control circuit DG1 supplies the current in the opposite direction until the voltage level of an output node OD4 of the subsequent stage exceeds the input logic threshold of current control circuit DG1, so that the voltage level of output node OD1 changes slowly.

When the voltage level of output node OD4 exceeds the input logic threshold, the current supply in the opposite direction toward output node OD1 of inverter VG1 is stopped, and output node OD1 rises in voltage level to power-supply voltage Vcc level at a high speed. This operation is repeated in inverter circuits VG2, VG3, and VG4, and the voltage levels on the associated output nodes change slowly until the logic levels are inverted at the output nodes of corresponding subsequent inverter circuits, and are thereafter, driven to the L level or the H level at a high speed.

Thus, the voltage change in an output node ODi (i=0 to 4) is suppressed until the logic inversion of an output signal of an inverter circuit of a subsequent stage takes place, so that the delay time of a single stage of inverter circuit VGi can be made significantly longer.

Conversely, when input signal INA falls from the H level to the L level, the voltage level of output node OD0 rises slowly from the L level to the H level. When the voltage level of output node OD3 exceeds the input logic threshold of current control circuit DG0, the voltage level of output node OD0 rises to the H level at a high speed.

With the delay circuit shown in FIG. 32, a delay circuit having a relatively long delay time can be implemented with a smaller number of stages. In addition, even when power-supply voltage Vcc fluctuates and the current drivability on an output node of each inverter circuit changes, the current drivability of the corresponding current control circuit DGi is made smaller as well so that the changing speed of the signals due to inverter circuit VGi and current control circuit DGi can be made substantially constant regardless of power-supply voltage Vcc. As a result, a delay circuit that stably maintains a constant delay time regardless of the fluctuation of power-supply voltage Vcc can be realized.

In the arrangement of the delay circuit shown in FIG. 32, the delay time can be shortened when an output signal of an inverter circuit located downstream by an even number of stages is applied to a current control circuit, i.e., when a signal having a common phase and lagging in phase relative to the input signal is applied to the current control circuit.

Figure 34:
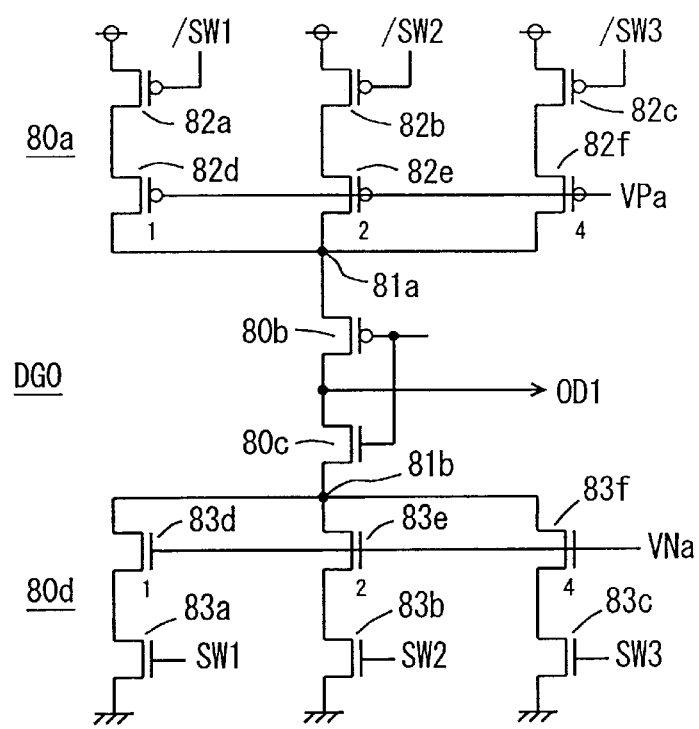
FIG. 34 is a diagram representing an arrangement of an auxiliary drive circuit shown in FIG. 32.

FIG. 34 is a diagram representing an example of the arrangement of current sources 80a and 80d included in current control circuit DG0 shown in FIG. 32. In FIG. 34, a current source 80a includes P-channel MOS transistors 82a and 82d connected in series between a power-supply node and an internal node 81a, P-channel MOS transistors 82b and 82e connected in series between a power-supply node and node 81a, and P-channel MOS transistors 82c and 82f connected in series between a power-supply node and node 81a. MOS transistors 82a, 82b, and 82c receive switching control signals /SW1, /SW2, and /SW3 at their gates, respectively. A reference voltage VPa is applied to the gates of MOS transistors 82d, 82e, and 82f. The ratios of channel width to the channel length of these MOS transistors 82d, 82e, and 82f are set to the ratio of 1:2:4, and their current supplying capabilities become greater in this order.

A current source 80d includes N-channel MOS transistors 83d and 83a connected in series between a node 81b and a ground node, N-channel MOS transistors 83e and 83b connected in series between node 81b and a ground node, and N-channel MOS transistors 83f and 83c connected in series between node 81b and a ground node. MOS transistors 83a, 83b, and 83c receive switching control signals SW1, SW2, and SW3 at their gates, respectively. MOS transistors 83d, 83e, and 83f receive a reference voltage VNa at their gates. The sizes (the ratio of channel width to channel length) of MOS transistors 83d, 83e, and 83f are set to 1:2:4, and their current supplying capabilities become greater in this order.

The current supplying capabilities of current sources 8a and 8d are determined by selectively setting switching control signals SW1 to SW3 and /SW1 to /SW3 to the active state. These switching control signals SW1 to SW3 and /SW1 to /SW3 can be set to appropriate logical values by fuse programming and the like (in the trimming step after the testing step).

By utilizing current sources 80a and 89d as shown in FIG. 34, the delay time of each delay stage of the delay circuit can be set to a desired value.

As seen from the above, according to the second embodiment of the present invention, the supply of the current to an output node of an inverter of a preceding stage is stopped when the logic of a signal of a delay stage of a subsequent stage is inverted, so that the delay time in each delay stage can be set to a constant length regardless of the voltage level of the power-supply voltage, and the delay circuit that operates with stability irrespective of the operating environment can be implemented.

Third Embodiment

Figure 35:
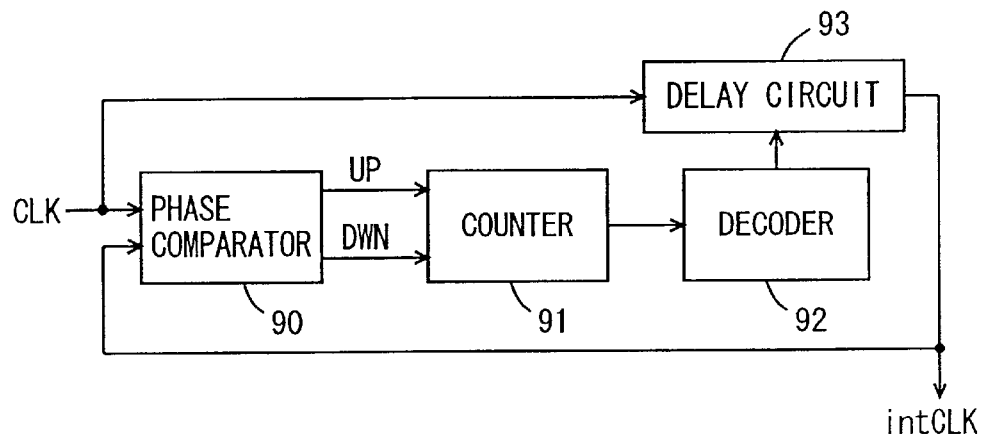
FIG. 35 is a diagram representing an arrangement of a DLL (Delayed Locked Loop) according to a third embodiment of the present invention.

FIG. 35 is a schematic diagram representing an overall arrangement of a digital DLL (Delayed Locked Loop) utilizing a delay circuit according to a third embodiment of the present invention. In FIG. 35, the digital DLL includes a phase comparator 90 for comparing the phases of an internal clock signal intCLK and an external clock signal CLK from an outside, a counter 91 for counting up an instruction signal UP and a down instruction signal DWN from phase comparator 90, a decoder 92 for generating a delay control signal according to the count of counter 91, and a delay circuit 93 for delaying external clock signal CLK to generate internal clock signal intCLK according to the delay control signal from decoder 92.

In the arrangement of the digital DLL, the delay of delay circuit 93 is adjusted such that internal clock signal intCLK is always locked in phase with external clock signal CLK even when the power-supply voltage Vcc fluctuates. Thus, the internal clock signal normally synchronized with the external signal can be generated regardless of the fluctuation of power-supply voltage Vcc, and by determining the timing of the internal operation within the semiconductor memory device, in synchronization with this internal clock signal intCLK as shown in FIG. 1 or FIG. 5, for instance, a semiconductor memory device that operates with stability can be realized.

Figure 36A:
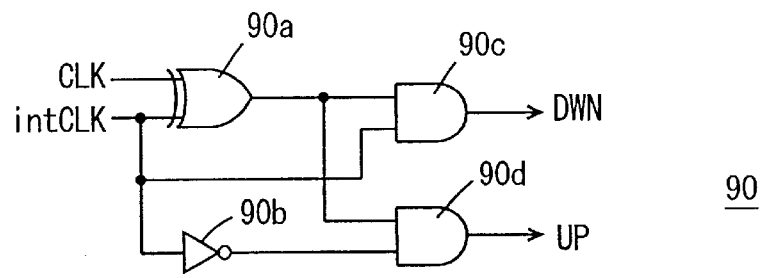
FIG. 36A is a diagram representing an example of an arrangement of a phase comparator shown in FIG. 35.
Figure 36B:
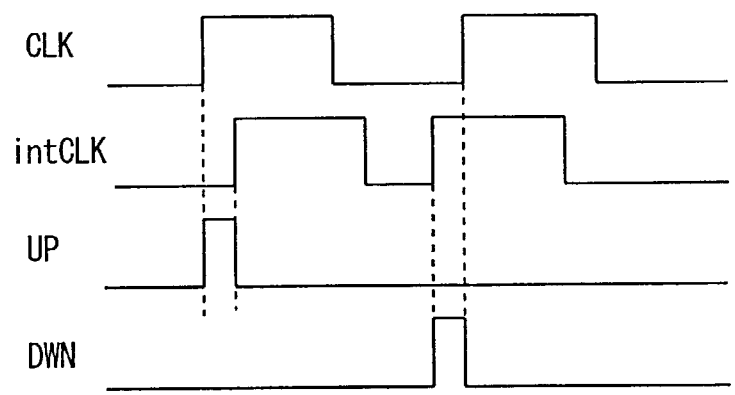
FIG. 36B is a signal waveform diagram representing an operation of the phase comparator shown in FIG. 35.

FIG. 36A is a diagram representing an example of the arrangement of phase comparator 90 shown in FIG. 35. In FIG. 36A, phase comparator 90 includes an EXOR circuit 90a receiving an external clock signal CLK and an internal clock signal intCLK, an inverter circuit 90b receiving internal clock signal intCLK, an AND circuit 90c receiving internal clock signal intCLK and an output signal from EXOR circuit 90a to generate a down instruction signal DWN, and an AND circuit 90d for receiving the output signal from EXOR circuit 90a and an output signal from inverter circuit 90b to generate an up instruction signal UP. EXOR circuit 90a outputs an H level signal when the phase of external clock signal CLK differs from the phase of internal clock signal intCLK. Now, the operation of phase comparator 90 shown in FIG. 36A will be described with reference to the signal waveform chart shown in FIG. 36B.

When external clock signal CLK is leading in phase relative to internal clock signal intCLK, the output signal from EXOR circuit 90a attains the H level for a time period that corresponds to the phase difference. Since internal clock signal intCLK is at the L level, the output signal from inverter circuit 90b is at the H level, and up instruction signal UP from AND circuit 90d accordingly attains the H level for a time period that corresponds to the phase difference.

On the other hand, when internal clock signal intCLK is leading in phase relative to external clock signal CLK, the output signal from inverter circuit 90b is at the L level when the output signal from EXOR circuit 90a is at the H level, and down instruction signal DWN output from AND circuit 90c attains the H level according to the output signal of EXOR circuit 90a.

In other words, when the phase of external clock signal CLK leads the phase of internal clock signal intCLK, up instruction signal UP attains the H level for a time period that corresponds to the phase difference, and instructs to advance the phase of internal clock signal intCLK (i.e., instructing to shorten the delay time). On the other hand, when the phase of internal clock signal intCLK is leading the phase of external clock signal CLK, down instruction signal DWN attains the H level for a time period that corresponds to the phase difference, and instructs to delay the phase of internal clock signal intCLK (i.e., instructing to lengthen the delay time of delay circuit 93).

The time periods of up instruction signal UP and down instruction signal DWN are counted by counter 91, and decoder 92 generates a delay control signal according to the time periods and adjusts the delay time of delay circuit 93.

Figure 37:
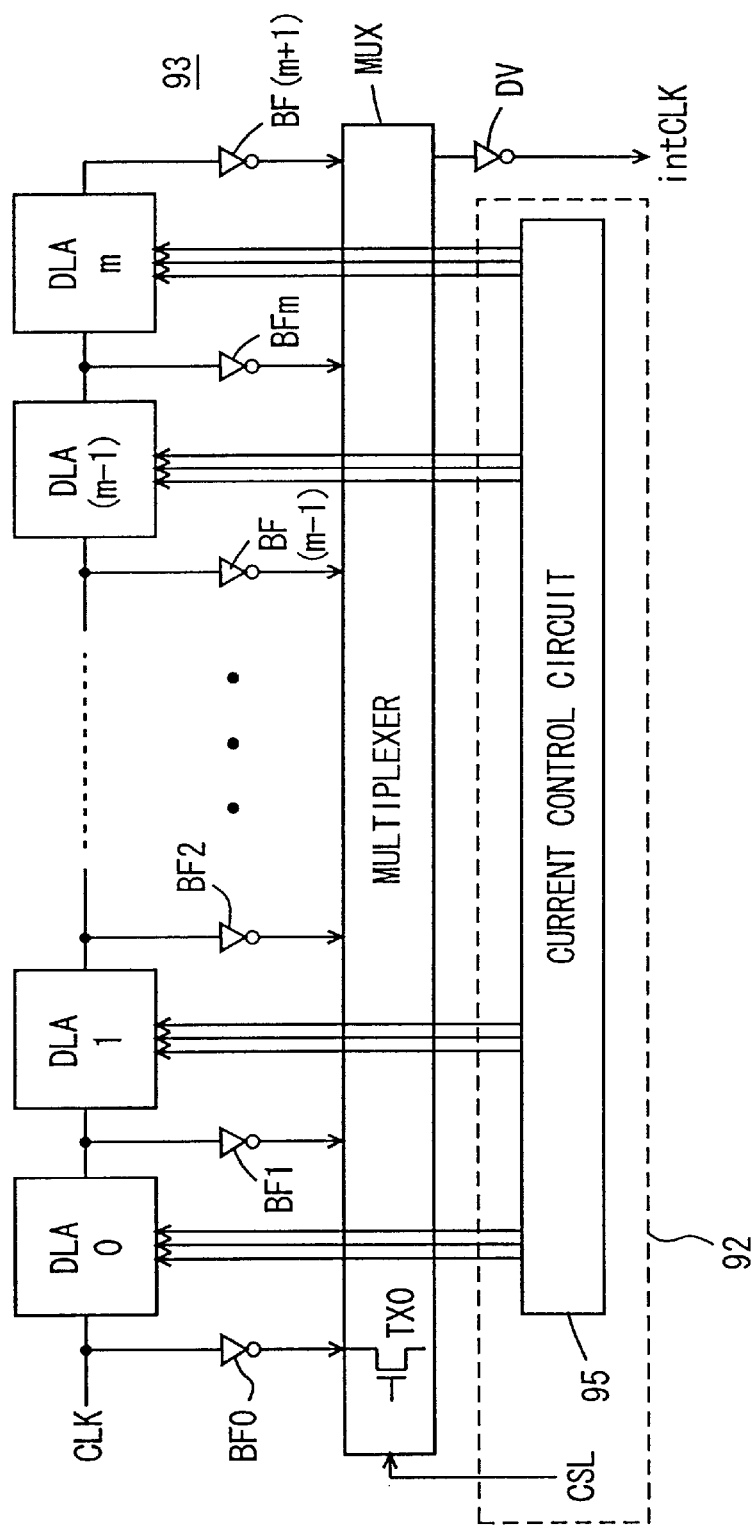
FIG. 37 is a schematic representation of an arrangement of the delay circuit shown in FIG. 35.

FIG. 37 is a schematic representation of the arrangement of delay circuit 93 shown in FIG. 35. In FIG. 37, delay circuit 93 includes a plurality of cascaded delay stages DLA0 to DLAm, inverter buffers BF1 to BF (m+1) provided corresponding to the respective output nodes of delay stages DLA0 to DLAm for inverting and buffering the signals of the respective output nodes, an inverter buffer BF0 for buffering and inverting an input clock signal CLK, a multiplexer MUX for selecting one of output signals of inverter buffers BF0 to BF (m+1) according to a selecting signal CSL from decoder 92, and a clock driver DV for buffering a clock signal selected by multiplexer MUX and generating an internal clock signal intCLK. Clock driver DV is formed of an inverter circuit. Any of the signals inverted by inverter buffers BF0 to BF (m+1) is further inverted by clock driver DV so as to generate internal clock signal intCLK that is locked in phase and common in phase with external clock signal CLK.

The delay time of each of delay stages DLA0 to DLAm can be adjusted according to output signals from a current control circuit 95 included in decoder 92. One of output signals of delay stages DLA0 to DLAm or external clock signal CLK is selected by multiplexer MUX, and then, an internal clock signal roughly locked in phase is selected. Thereafter, the currents of delay stages DLA0 to DLAm are controlled according to current control signals from decoder 92 so as to fine-adjust the delay time, and thus the phase lock is established between external clock signal CLK and internal clock signal intCLK. During the operation in which the phase lock is established, the two stages of coarse adjustment and fine adjustment are employed so that internal clock signal intCLK locked in phase with external clock signal CLK can be generated at a high speed.

Figure 38:
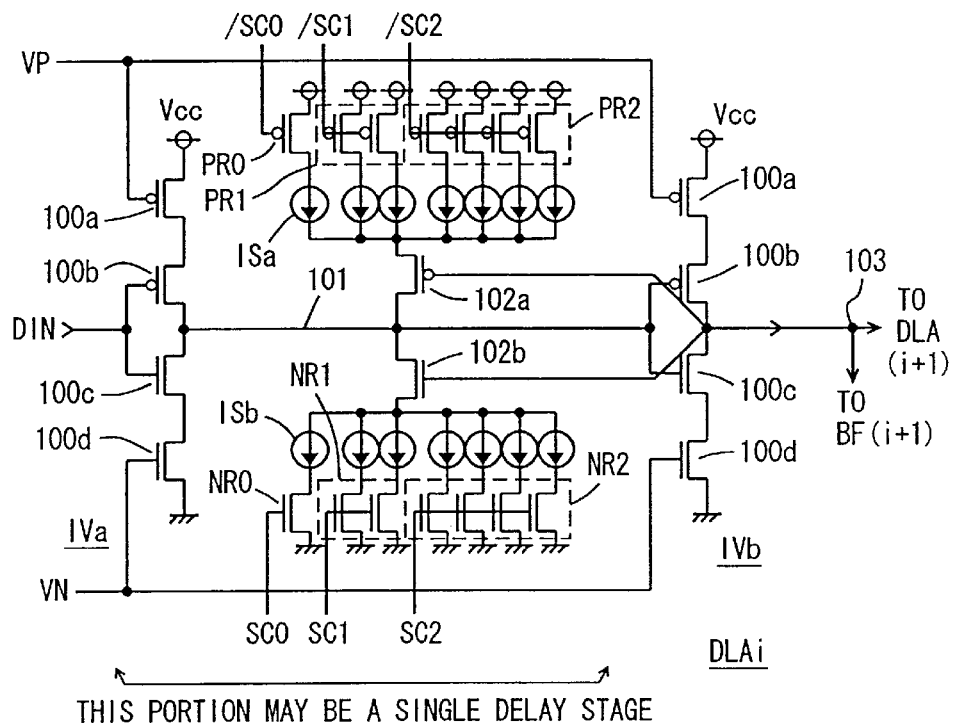
FIG. 38 is a diagram representing an arrangement of a delay stage shown in FIG. 37.

FIG. 38 is a schematic representation of the arrangement of a delay stage DLAi (i=0 to m) shown in FIG. 37. In FIG. 38, delay stage DLAi includes an input stage inverter circuit IVa and an output stage inverter circuit IVb. An output signal of output stage inverter circuit IVb is applied to a corresponding inverter buffer BF (i+1) and to the next delay stage DLA (i+1).

Inverter circuits IVa and IVb have the same arrangement, and corresponding parts are denoted by the same reference numerals. Inverter circuit IVa includes P-channel MOS transistors 100a and 100b connected in series between a power-supply node and a node 101, and N-channel MOS transistors 100c and 100d connected in series between node 101 and a ground node. Reference voltages VP and VN are applied to the gates of MOS transistors 100a and 100d, respectively. An output signal DIN from a delay stage of the immediately preceding stage is applied to the gates of MOS transistors 100b and 100c. In inverter circuit IVb, the gates of MOS transistors 100b and 100c are coupled to node 101.

Delay stage DLAi further includes a plurality of current sources ISa connected in parallel with one another, current source selecting switches PR0 to PR2 provided corresponding to the respective current sources ISa and selectively attaining the on state in response to switching control signals /SC0, /SC1, and /SC2, and a P-channel MOS transistor 102a rendered conductive, when an output signal at output node 103 is at the L level, for coupling a current sources ISa to node 101. These current sources ISa have the same current supplying capability, and current source selecting switches PR0, PR1, and PR2 couple one current source ISa, two current sources ISa, and four current source(s) ISa to a power-supply node, respectively. Thus, current source selecting switches PR0 to PR2 are selectively turned on to enable the adjustment of the amount of current supplied by MOS transistor 102a in a binary notation form.

Delay stage DLAi further includes current sources ISb connected in parallel with one another, current source selecting switches NR0, NR1, and NR2 provided to current sources ISb and selectively rendered conductive in response to switching control signals SC0 to SC2, and an N-channel MOS transistor 102b rendered conductive, when an output signal at output node 103 is at the H level, for coupling a current source(s) ISb to node 101. These current source selecting switches NR0, NR1, and NR2 also couple one current source ISb, two current sources ISb, and four current sources ISb to the ground node, respectively. These switching control signals SC0 to SC2 and /SC0 to /SC2 are provided from decoder 92 shown in FIG. 35.

Delay stage DLAi shown in FIG. 38 is equivalent to the arrangement previously shown in FIG. 32. Thus, a current source(s) ISa or ISb supplies a current in the direction that allows suppression of the change of an output signal from inverter circuit IVb until the logic level of the output signal from inverter circuit IVb is inverted, thereby increasing the delay time. As the amount of current that is charged/discharged via MOS transistors 102a and 102b is decreased, the delay time of delay stage DLAi becomes shorter. On the other hand, an increase amount of current that flows via MOS transistors 102a and 102b, slow-downs the changing speed of an output signal from inverter circuit IVa to lengthen the delay time. The delay time of delay circuit 93 shown in FIG. 35 is fine-adjusted by individually setting the delay time for each delay stage DLAi.

Figure 39:
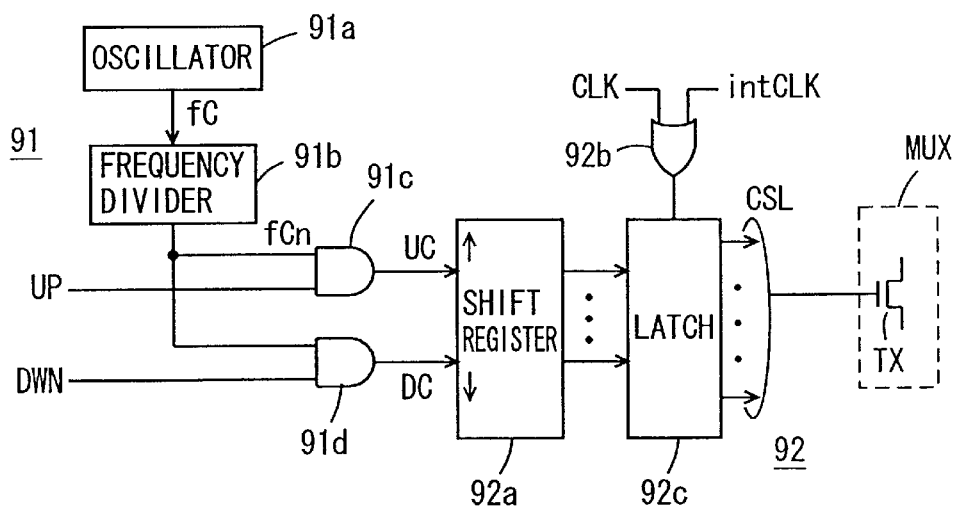
FIG. 39 is a schematic representation of the arrangement of a counter and a decoder shown in FIG. 35.

FIG. 39 is a schematic representation of the arrangements of counter 91 and of decoder 92 shown in FIG. 35. FIG. 39 only shows the arrangement of the portion of decoder 92 related to coarse adjustment, and does not show current control circuit 95 for performing fine adjustment.

In FIG. 39, counter 91 includes an oscillator 91a for generating an oscillation signal fc having a prescribed period, a frequency divider 91b for frequency-dividing oscillation signal fc from oscillator 91a to generate a frequency-divided signal fcn, an AND circuit 91c receiving frequency-divided signal fcn output from frequency divider 91b and an up instruction signal UP, and an AND circuit 91d receiving frequency-divided signal fcn and a down instruction signal DWN. The precision of the delay time in the coarse adjustment is defined by frequency-divided signal fcn from frequency divider 91b.

Decoder 92 includes a bi-directional shift register 92a for performing a shifting operation in one direction according to an output signal UC from AND circuit 91c and for performing a shifting operation in the other direction according to an output signal DC from AND circuit 91d, an OR circuit 92b for receiving clock signals CLK and intCLK, and a latch circuit 92c for taking in an output signal from shift register 92a when an output signal of OR circuit 92b is at the H level and outputting the signal taken in as a selecting signal CSL when the output signal of OR circuit 92b attains the L level. Selecting signal CSL from latch circuit 92c is applied to a gate of each respective selecting gate TX included in multiplexer MUX.

Shift register 92a has output nodes corresponding to the respective selecting gates TX included in multiplexer MUX, and performs a shifting operation in a direction of shortening the delay time according to output signal UC from AND circuit 91c and performs a shifting operation in a direction of increasing the number of delay stages according to output signal DC from AND circuit 91d. Thus, bi-directional shift register 92a performs the shifting operations in opposite directions using output signal UC and DC as shift clock signals. In its default state, shift register 92a is set to select an output signal of an intermediate stage (DLA ((m+½))) of delay stages DLA0 to DLAm in the delay circuit. The remaining selecting signals are all at the L level. The shifting operation causes one selecting signal alone to attain the active state, and the position of the selected delay stage is shifted according to the lead/lag of the phase.

Figure 40:
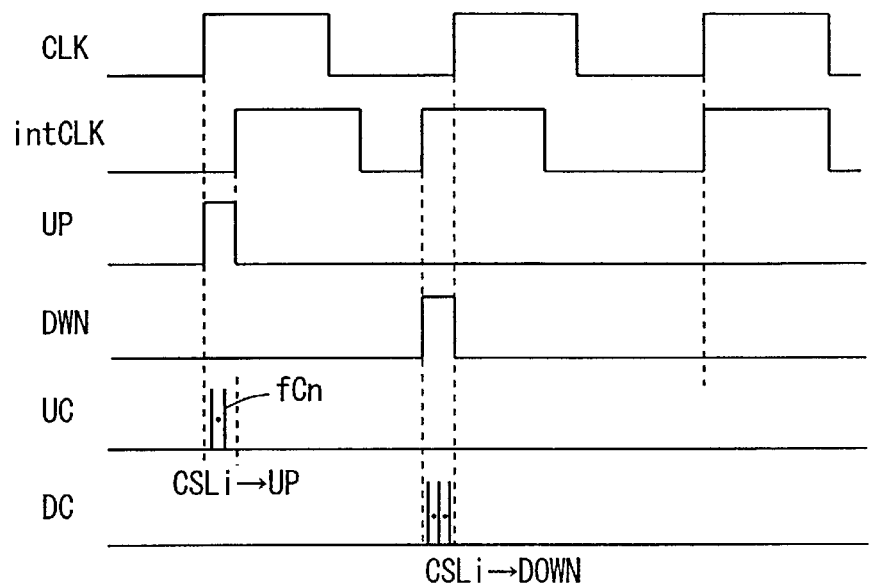
FIG. 40 is a signal waveform diagram representing an operation of a circuit shown in FIG. 39.

FIG. 40 is a signal waveform diagram representing an operation of counter 91 shown in FIG. 39. As shown in FIG. 40, when external clock signal CLK is leading in phase relative to internal clock signal intCLK, up instruction signal UP attains the H level. Thus, at this time, output signal UC from AND circuit 91c changes according to frequency-divided signal fcn, and bi-directional shift register 92a performs the shifting operation according to output signal UC, thereby shifting a selecting signal CSLi in the up (UP) direction and shortening the delay time.

On the other hand, when external clock signal CLK is lagging in phase relative to internal clock signal intCLK, down instruction signal DWN attains the H level, and an output signal from AND circuit 91d changes according to frequency-divided signal fcn. Then, bi-directional shift register 92a performs the shifting operation according to output signal DC from AND circuit 91d, thereby shifting selecting signal CSLi in the down (DOWN) direction.

Therefore, internal clock signal intCLK and external clock signal CLK can be matched in phase in the precision of a period of frequency-divided signal fcn.

Bi-directional shift register 92a is formed using a normal bi-directional shift register.

Figure 41:
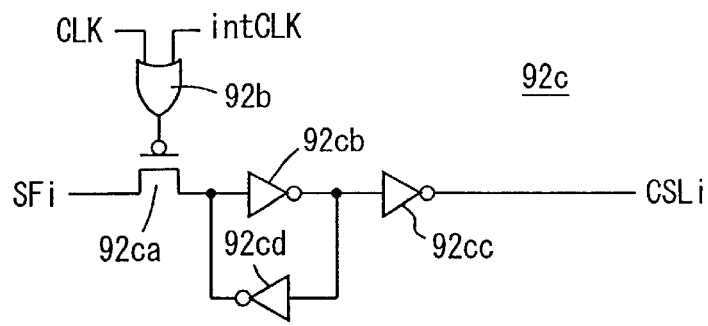
FIG. 41 is a diagram representing an arrangement of a single latch stage shown in FIG. 39.
Figure 42:
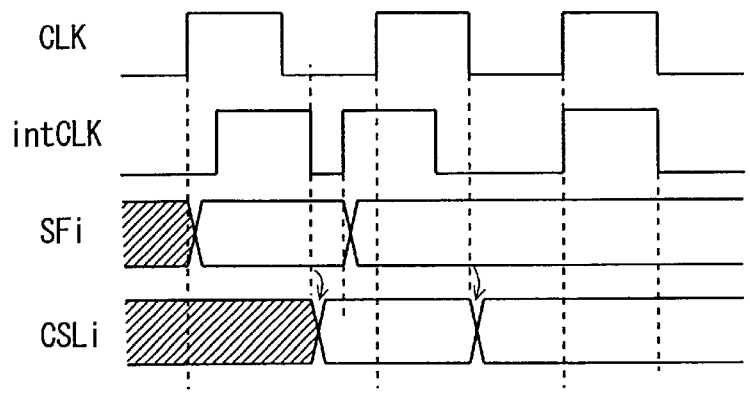
FIG. 42 is a signal waveform diagram representing an operation of the latch stage shown in FIG. 41.

FIG. 41 is a diagram representing an example of the arrangement of latch circuit 92c shown in FIG. 39. In FIG. 41, latch circuit 92c includes a transmission gate 92ca rendered conductive, when the output signal from OR circuit 92b is at the L level, for allowing an output signal SFi of bi-directional shift register 92a to pass through, an inverter circuit 92cb for inverting a signal applied via transmission gate 92ca, an inverter circuit 92cc for inverting an output signal from inverter circuit 92cb to generate a delay stage selecting signal CSLi, and an inverter circuit 92cd for inverting an output signal from inverter circuit 92cb and transmitting the inverted signal to an input of inverter circuit 92b. Inverter circuits 92cb and 92cd form an inverter latch. Now, the operation of latch circuit 92c shown in FIG. 41 will be described with reference to the signal waveform diagram shown in FIG. 42.

When clock signal CLK is leading in phase relative to internal clock signal intCLK, output signal SFi of shift register 92a changes according to the up instruction signal and in synchronization with the rise of external clock signal CLK. The output signal SFi from shift register 92a attains the definite state when both clock signals CLK and intCLK attain the L level. At this time, the output signal from OR circuit 92b attains the L level, transmission gate 92ca is rendered conductive, and the state of delay stage selecting signal CSLi changes and becomes definite. When one of the clock signals CLK and intCLK is at the H level, the output signal of OR circuit 92b is at the H level, and transmission gate 92ca is in the non-conductive state. Delay stage selecting signal CSLi is latched and its state does not undergo a change.

When external clock signal CLK is lagging in phase to internal clock signal intCLK, a down instruction signal is generated according to the rise of internal clock signal intCLK, and output signal SFi of the shift register changes according to the down instruction signal. Thereafter, when clock signals CLK and intCLK both attain the L level, transmission gate 92ca is rendered conductive, and delay stage selecting signal CSLi changes in state and latched according to output signal SFi of bi-directional shift register 92a.

Therefore, the bi-directional shift register performs the shifting operations according to signals UC and DC shown in FIG. 40, and after the completion of the shifting operation, latch circuit 92c is in the state of taking in and latching of an applied signal. Thus, delay stage selecting signal CSLi can be generated with accuracy.

Figure 43:
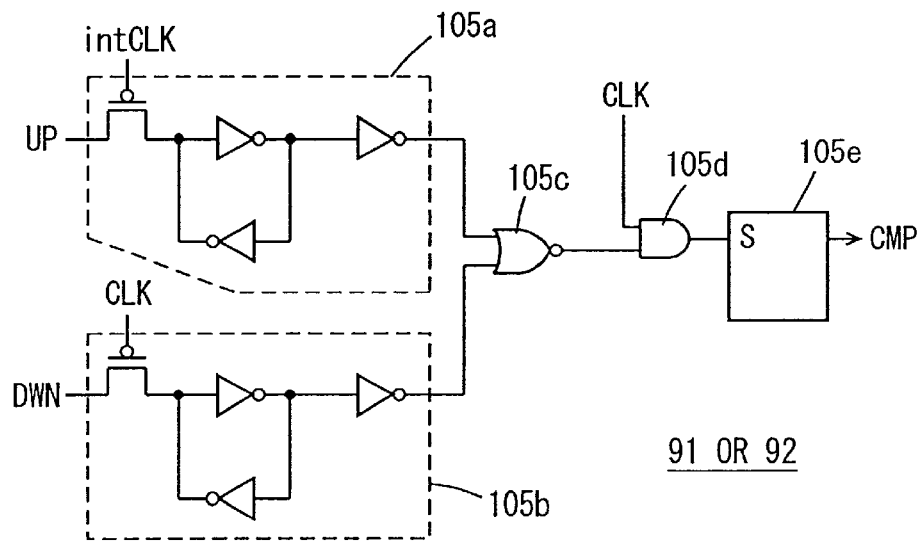
FIG. 43 is a schematic representation of an arrangement of a coarse adjustment completion detecting portion in the DLL according to the third embodiment of the present invention.

FIG. 43 is a schematic representation of the arrangement of a coarse adjustment completion detecting portion. The coarse adjustment completion detecting portion shown in FIG. 43 may be provided in counter 91 or in decoder 92. In FIG. 43, the coarse adjustment completion detecting portion includes a latch circuit 105a for taking in and latching an up instruction signal UP when internal clock signal intCLK is at the L level, a latch circuit 105b for taking in and latching a down instruction signal DWN when external clock signal CLK is at the L level, an NOR circuit 105c receiving output signals from latch circuits 105a and 105b, an AND circuit 105d receiving an output signal from NOR circuit 105c and external clock signal CLK, and a set/reset flip-flop 105e set, when an output signal from AND circuit 105d is at the H level, for outputting a completion detecting signal CMP.

Figure 44:
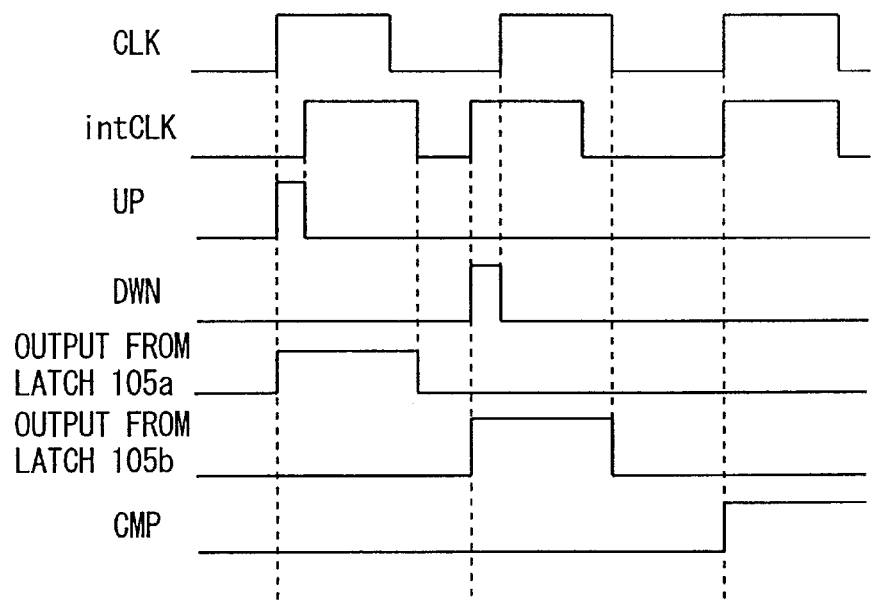
FIG. 44 is a signal waveform diagram representing an operation of a circuit shown in FIG. 43.

Latch circuit 105a attains the latching state when internal clock signal intCLK is at the H level, while latch circuit 105b attains the latching state when external clock signal CLK is at the H level. Now, the operation of the coarse adjustment completion detecting portion shown in FIG. 43 will be described with reference to the signal waveform diagram shown in FIG. 44.

When external clock signal CLK is leading in phase relative to internal clock signal intCLK, up instruction signal UP attains the H level. When up instruction signal UP is at the H level, internal clock signal intCLK is at the L level, and latch circuit 105a takes in up instruction signal UP. When internal clock signal intCLK attains the H level, latch circuit 105a attains the latching state. Down instruction signal DWN is at the L level, and an output signal from latch circuit 105b maintains the L level. When external clock signal CLK is at the H level, an output signal from NOR circuit 105c is at the L level, and accordingly, an output signal from AND circuit 105d is at the L level so that set/reset flip-flop 105e maintains the reset state.

When external clock signal CLK is lagging in phase relative to internal clock signal intCLK, down instruction signal DWN attains the H level. External clock signal CLK is at the L level while down instruction signal DWN is at the H level. When latch circuit 105b takes in and latches the down instruction signal and external clock signal CLK attains the H level, latch circuit 105b attains the latching state. When external clock signal CLK is at the H level, the output signal from NOR circuit 105c is at the L level, and thus, the output signal from AND circuit 105d is also at the L level, and set/reset flip-flop 105e maintains the reset state.

When up instruction signal UP and down instruction signal DWN are both at the L level and when external clock signal CLK and internal clock signal intCLK are matched in phase, output signals from latch circuits 105a and 105b are at the L level. Thus, when an output signal of NOR circuit 105c attains the H level, and external clock signal CLK attains the H level, the output signal from AND circuit 105d attains the H level, and set/reset flip-flop 105e is set so that coarse adjustment completion detecting signal CMP attains the H level.

Set/reset flip-flop 105e may be reset by a system reset signal, or may be reset after a prescribed number of clock cycles, thereby allowing the fine adjustment after the completion of the coarse adjustment operation.

Instead of set/reset flip-flop 105e, such circuitry may be employed that is configured so as to detect that the output signal from AND circuit 105d is at the H-level over a prescribed number of successive clock cycles. By utilizing the arrangement in which the number of H level outputs of AND circuit 105d is counted while clock signal CLK is at the H level and the count is reset when the output signal of AND circuit 105d is at the L level, the phase matching of external clock signal CLK and internal clock signal intCLK can be detected over a prescribed number of successive clock cycles in the coarse adjustment operation.

In addition, the coarse adjustment detecting operation may be performed intermittently at prescribed time intervals over a prescribed number of clock cycles at the power on of the semiconductor device, and the fine adjustment operation may be performed after the prescribed number of clock cycles.

FIG. 45 is a schematic representation of the arrangement of current control circuit 95 shown in FIG. 37. In FIG. 45, current control circuit 95 includes an AND circuit 95a receiving coarse adjustment completion detecting signal CMP, an up instruction signal UP, and oscillation signal fc of oscillator 91a shown in FIG. 39; an AND circuit 95b receiving coarse adjustment completion detecting signal CMP, oscillation signal fc, and a down instruction signal DWN; a counter 95c for counting output signals from AND circuit 95a; a counter 95d for counting output signals from AND circuit 95b; and a decoder 95e for generating current control signals SC0 to SC2 according to output signals from counters 95c and 95d. Counters 95c and 95d have their counts reset in response to the rise of external clock signal /CLK (i.e. the fall of external clock signal CLK). Decoder 95e attains the latching state in response to the fall of external clock signal CLK (i.e. the fall of the complementary external clock signal /CLK).

The frequency of oscillation signal fc is higher than that of frequency-divided signal fcn used to generate a coarse adjustment delay selecting signal so that the phase difference between external clock signal CLK and internal clock signal intCLK is detected with higher precision. Counters 95c and 95d count the number of oscillation signals fc contained within the H level periods of these up instruction signal UP and down instruction signal DWN. Decoder 95e performs the decode operation and adjusts a corresponding amount of current according to the count of counter 95c and the count of counter 95d.

FIG. 46 is a schematic representation of the arrangement of decoder 95e shown in FIG. 45. In FIG. 46, decoder 95e includes a latch circuit 95ea for performing a latching operation in response to the rise of complementary external clock signal /CLK, an adder 95eb for performing the addition of latched data of latch circuit 95ea and the counts from counters 95d and 95c, and a pseudo-gray code decoder 95ec for decoding the count of adder 95eb. Pseudo-gray code decoder 95ec outputs current control signals SC0 to SC2. Adder 95eb adds an output signal from latch circuit 95ea and an output count from counter 95d and subtracts the count from counter 95c. Thus, upon activation of up instruction signal UP, the output value of adder 95eb becomes small, and therefore, pseudo-gray code decoder 95ec generates a current control signal in the direction of reducing the current, whereby the delay time is shortened. On the other hand, when down instruction signal DWN attains the active state, adder 95eb adds the output count of latch circuit 95ea and the count of counter 95d. Consequently, decode signals (current control signals) SC0 to SC2 from pseudo-gray code decoder 95ec change in the direction of increasing the current value (that is, changes in the direction of lengthening the delay time).

FIG. 47 is a diagram showing, in a table the decode operation of pseudo-gray code decoder 95ec. As shown in FIG. 47, pseudo-gray code decoder 95ec decodes the added value of adder 95eb such that the same current control signal of at least one bit in two successively adjacent values is "1." For instance, in each of binary values 1 and 2, current control signal SC0 is "1." In binary values 4 and 5, both current control signals SC1 and SC2 are "1." Holding a current control signal of at least one bit in the "1" state in the two successive binary values can prevent all the current selecting switches in the current sources from being inverted in state at a time, so that the rapid change in current and the resultant large delay time variation can be suppressed.

With a binary value "0," current control signals SC0 to SC3 would all become 0 and no current would flow through the current source so that this value is not employed. As a default value, the delay time of the delay circuit is set at a center value, "4" (binary value), for instance, and the increase and the decrease of the delay time with the current control signals are carried out with this default value being the center. Thus, in the arrangement shown in FIG. 46, latch circuit 95ea holds a pseudo-gray code value set in a preceding cycle, and the increase and the decrease of the delay time are carried out using the pseudo-gray code value in the preceding cycle as a base and a new pseudo-gray code is produced. Therefore, the default value at first serves as a starting value, and pseudo-gray code decoder 95ec sequentially changes the pseudo-gray code. The setting of default value at latch circuit 95ea is achieved by latching the data from a register circuit (now shown) into latch circuit 95ea upon power on.

By utilizing the pseudo-gray code, the changes in the states of current source transistors PR0 to PR2 and NR0 to NR2 in the delay stage shown in FIG. 38 can be minimized as much as possible, a large current change can be prevented, and the amount of current change per step during fine adjustment can be made small.

The count of 10 or greater which is to be applied to pseudo-gray code decoder 95ec can be easily implemented setting the value of a current control signal SC4 to "1."

First Modification

Figure 48:
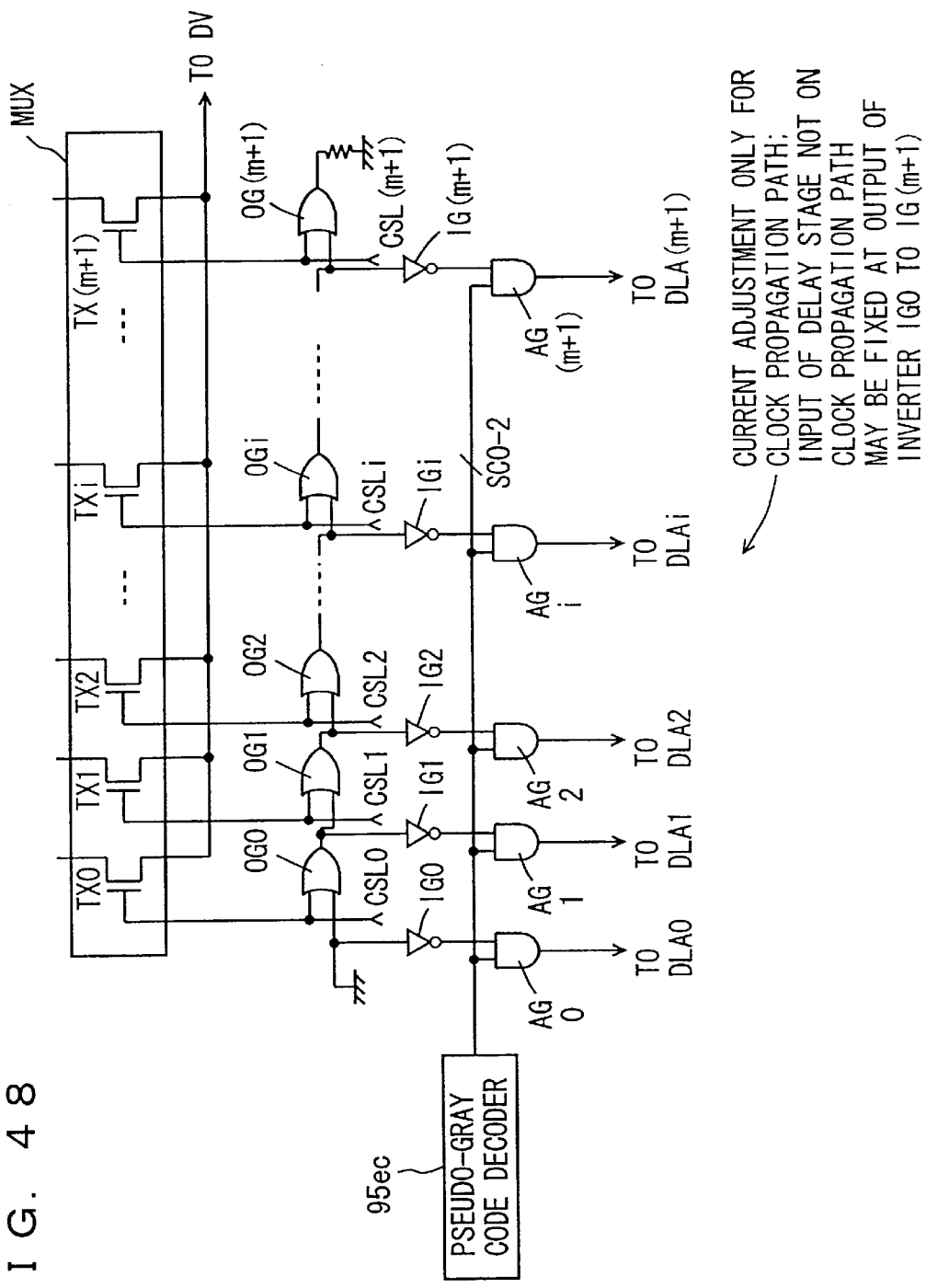
FIG. 48 is a diagram representing a modification of a delay circuit of a DLL circuit according to the third embodiment of the present invention.

FIG. 48 is a schematic diagram representing the arrangement of the first modification of the delay circuit according to the third embodiment of the present invention. In FIG. 48, multiplexer MUX includes transfer gates TX0 to TX (m+1) corresponding to the respective delay stages DLA0 to DLA (m+1). These transfer gates TX0 to TX (m+1) are selectively set to the conductive state according to delay stage selecting signals CSL0 to CSL (m+1) generated in the coarse adjustment operation. OR circuits OG0 to OG (m+1) are provided to delay stages DLA0 to DLA (m+1), respectively. These OR circuits OG0 to OG (m+1) each receive a corresponding one of the delay stage selecting signals CSL0 to CSL (m+1) and an output signal from the OR circuit of the preceding stage. OR circuit OG0 of the initial stage has no preceding OR circuit, and receives a ground voltage instead. Inverter circuits IG1 to IG (m+1) are provided to the respective OR circuits OG0 to OGm and each receiving an output signal from a corresponding OR circuit. An inverter circuit IG0 receiving a ground voltage is provided corresponding to delay circuit DLA0.

Furthermore, AND circuits AG0 to AG (m+1), each receiving current control signals SC0 to SC2 from pseudo-gray code decoder 95ec at a first input gate and receiving a corresponding one of output signals from inverter circuits IG0 to IG (m+1) at a second input, are provided to inverter circuits IG0 to IG (m+1), respectively. The output signal (plural bits) from each of these AND circuits AG0 to AG (m+1) are provided as current control signals for the corresponding delay stages DLA0 to DLA (m+1).

In the arrangement shown in FIG. 48, a single transfer gate Txi is rendered conductive in multiplexer MUX. When delay stage selecting signal CSLi is at the H level, an output signal from OR circuit OGi attains the H level, and output signals from OR circuits OG (i+1) to OGm of the succeeding stages all attain the H level. At this time, output signals from corresponding inverter circuits IG (i+1) to IG (m+1) all attain the L level, output signals from AND circuits AG (i+1) to AG (m+1) are fixed to the L level, and the transmission of current control signals SC0 to SC2 is prohibited. On the other hand, output signals from inverter circuits IG0 to IGi corresponding to AND circuits AG0 to AGi, provided corresponding to delay stages through which the clock signal is propagated, are at the H level. AND circuits AG0 to AGi transmit current control signals SC0 to SC2 from pseudo-gray code decoder 95ec to the respective delay stages DLA0 to DLAi, and a current adjustment is performed in the delay stages which transmit the clock signal.

Thus the current adjustment can be performed only where it is necessary so that current consumption can be reduced.

In the arrangement shown in FIG. 48, output signals from inverter circuits IG0 to IG (m+1) may be used to fix an input signal of a delay stage not on the clock propagation path to the H or L level. This is easily achieved by providing an NOR circuit receiving an output signal from a corresponding inverter circuit and an output signal from a preceding delay stage to an input portion of each delay stage. For instance, in the delay stage shown in FIG. 38, inverter circuit IVb may be replaced by an NOR circuit. In this case, however, the gate delay time of the NOR circuit should be made sufficiently shorter than the delay time of the delay stage.

Further, in the delay circuit shown in the third embodiment, the fine adjustment of the delay time may be performed in a unit of the delay stage included in the clock propagation path. More specifically, when the instruction signal is successively applied, a selected delay stage is shifted upstream stage by stage to shorten the delay time by the corresponding amount. On the other hand, when the down instruction signal is successively applied, a selected shift register for the delay stage in the clock propagation path is shifted downstream stage by stage to extend the delay time of the corresponding delay stages step by step. This operation is repeatedly performed within the clock propagation path. When the uppermost stream or the down-most stream is reached in the clock propagation path, coarse adjustment is driven to increase or decrease the clock propagation path by one stage. In this case, the fine adjustment of the phase can be performed on a basis of a step of delay time of each delay stage, so that a more precise phase adjustment can be effected.

The bit number of current control signals is not required to be 3 as in the above example. The bit number would be appropriately determined according to the amount of delay time realized by the delay stages used.

Second Modification

FIG. 49 is a schematic representation of a further arrangement of current control circuit 95 of the delay circuit according to the third embodiment of the present invention. In FIG. 49, current control circuit 95 includes an up-down counter 150 for counting the numbers of up instruction signal UP and down instruction signal DWN from a phase comparator, and a decoder 151 for decoding an output count CNT and generating multibit current source control signals SRCT and DRCT. Although, here, up-down counter 150 counts up instruction signal UP and down instruction signal DWN received from the phase comparator, it may be arranged such that up-down counter 150 counts the number of the oscillation signal from the previous described oscillation circuit. Thus, up-down counter 150 may be formed to count the count signals UC and DC of FIG. 39 above.

Decoder 151 decodes multibit count CNT from up-down counter 150 into a control signal in the pseudo-gray code notation.

FIG. 50 is a schematic representation of the arrangement of delay stage DLAi. Delay stage DLAi includes two-stage cascaded inverters IVa and IVb, a current source 152 having its supplying current adjusted by current source control signal SRCT, a current source 153 having the amount of its discharging current adjusted according to current source control signal DRCT, and MOS transistors 102a and 102b for coupling current sources 152 and 153 to an output node of inverter circuit IVa according to an output signal from inverter IVb.

The current values of current sources 152 and 153 are individually adjusted, and current Ic supplied by the current source driving the output node of inverter IVa is set to the value of Ia–Ib, to determine the charging current of the output node of inverter circuit IVa.

FIG. 51 is a diagram showing, in a table, the truth values of the decode operation of decoder 151 shown in FIG. 49. Count CNT from up-down counter 150 is in binary notation. Current source control signal SRCT increments in value according to the (pseudo) gray code notation. On the other hand, current source control signal DRCT has its bit value so set as to satisfy the relation of CNT=SRCT–DRCT. Current source control signal DRCT also is in pseudo-gray code notation. For instance, when count CNT is "0010," current control signals SRCT and DRCT are "0110" and "0101," respectively. In current source control signal SRCT, the value of at least one bit is always retained at "1" in two successive binary values, and thus, a supplying current Ia of current source 152 is prevented from varying rapidly, as in the case of the pseudo-gray code notation previously described. In addition, by utilizing the gray code notation for current source control signal SRCT, simultaneous turn-off of all switching transistors included in current source 152 can be prevented so that supplied current Ic to the output node can be adjusted with stability.

There is a case in which current source control signal DRCT is set to "0000." In this case, a driving current Ib of current source 153 becomes equivalently "0." The output node of inverter circuit IVa, however, is discharged by the discharging N-channel MOS transistor of inverter circuit IVa, and supplied current Ic to the output node is determined by current Ia supplied by current source 152.

Figures 52, 53:
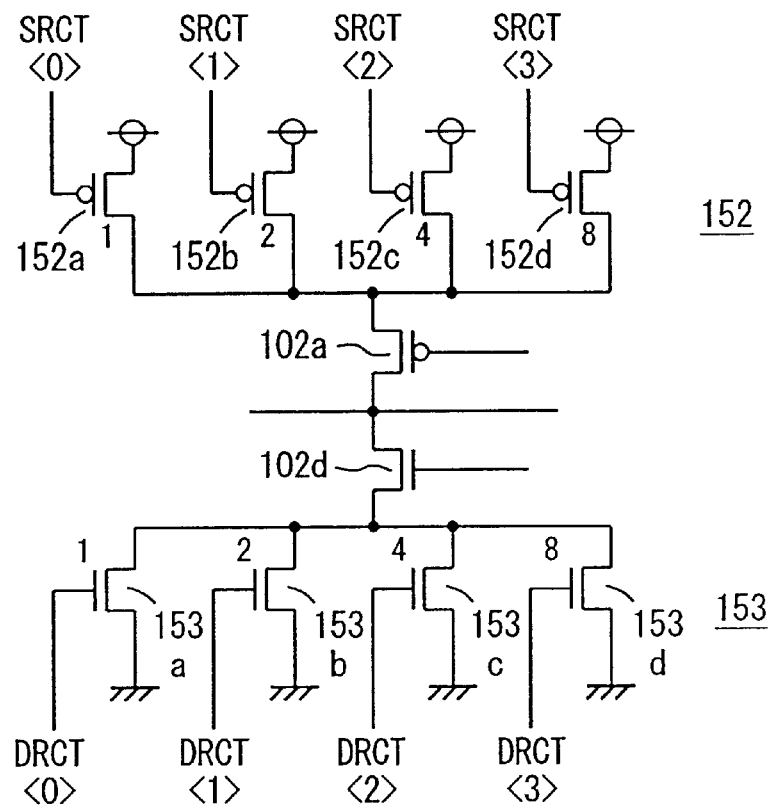
FIG. 52 is a diagram showing a more specific arrangement of a current source shown in FIG. 50.
FIG. 53 is a diagram showing, in a table, the correspondences between the truth values shown in FIG. 51 and current source control signals shown in FIG. 52.

FIG. 52 is a diagram showing a more specific arrangement of current sources 152 and 153 shown in FIG. 50. In FIG. 52, current source 152 includes P-channel MOS transistors 152a to 152d connected in parallel with one another and receiving current source control signals SRCT<0> to SRCT<3> at the respective gates. The sizes (the ratio of channel width to channel length) of these MOS transistors 152a to 152d are set to 1:2:4:8. On the other hand, current source 153 includes N-channel MOS transistors 153a to 153d connected in parallel with one another between MOS transistor 102b and a ground node and receiving current source control signals DRCT<0> to DRCT<3> at the respective gates. The sizes of these MOS transistors 153a to 153d are set to 1:2:4:8. By sequentially doubling the sizes of these MOS transistors 152a to 152d and 153a to 153d, the driving currents of these current sources 152 and 153 can be set in amplitude to the currents represented in binary notation.

FIG. 53 is a diagram showing an example of the correspondence between count CNT and current source control signals. FIG. 53 shows the logic levels of current source control signals SRCT<3> to SRCT<0> and DRCT<3> to DRCT<0>. Since current source control signals SRCT<3> to SRCT<0> control the on/off of P-channel MOS transistors 152a to 152d, a "1" corresponds to the L level in the truth table in FIG. 51. On the other hand, current source control signal DRCT drives N-channel MOS transistors 153a to 153d so that "1" corresponds to the H level according to the truth table shown in FIG. 51. By setting these current source control signals SRCT<3> to SRCT<0> and DRCT<3> to DRCT<0> according to the truth table shown in FIG. 51, the amounts of the currents driven by current sources 152 and 153 can be adjusted to a value set by count CNT. Current source control signal, SRCT<3> to SRCT<0>, is in gray code notation, and thus, when one of MOS transistors 152a to 152d is on, it remains in the on state upon transition to a next state, so that no rapid current change occurs in current source 152.

In addition, a constant-current source transistor normally in the on state to supply a constant current may be provided in each of current source 152 current source 153. In this case, current sources 152 and 153 supply a current and of default value in combination even when count CNT is 0.

Figure 54:
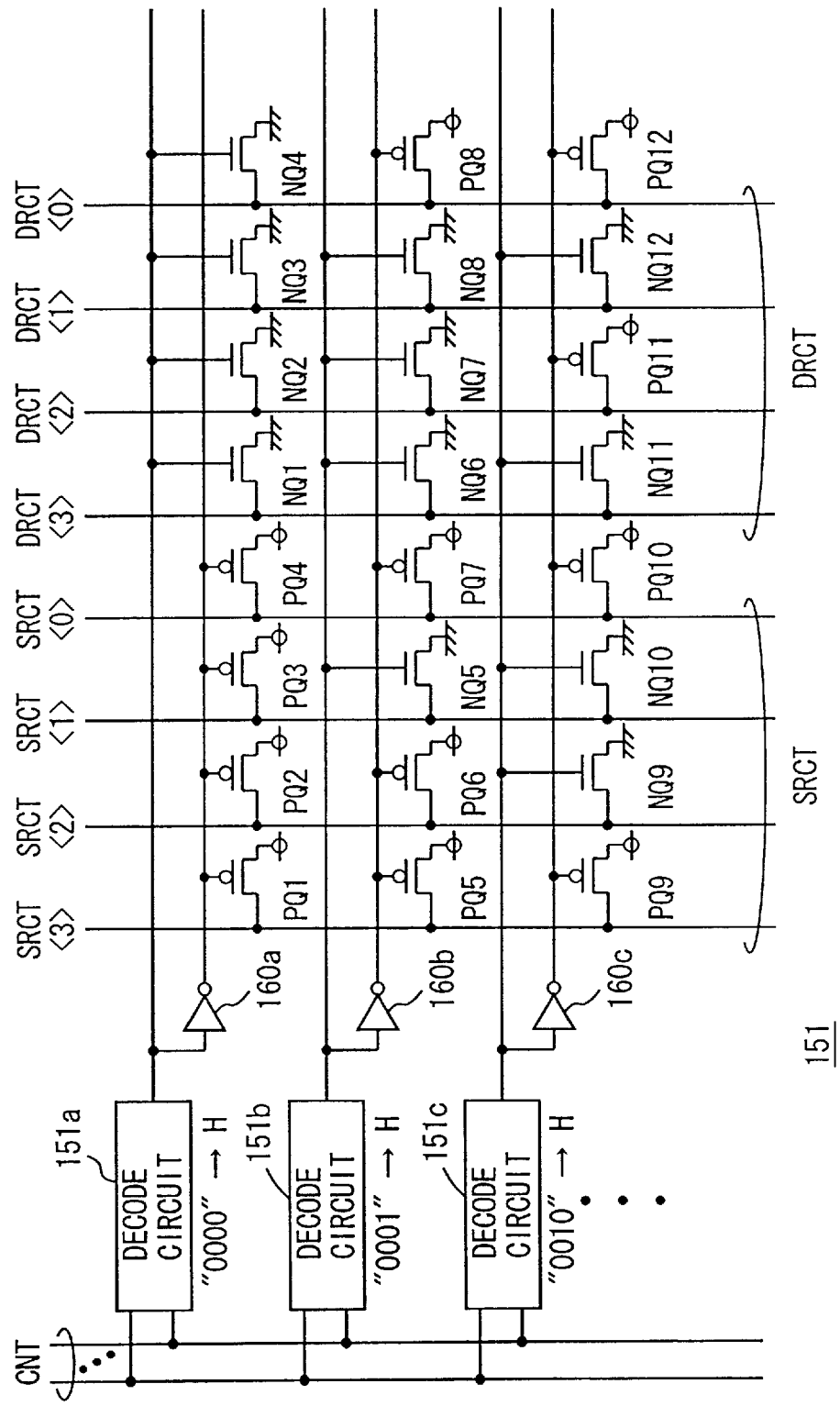
FIG. 54 is a diagram showing a more specific arrangement of the decoder shown in FIG. 49.
Figure 55:
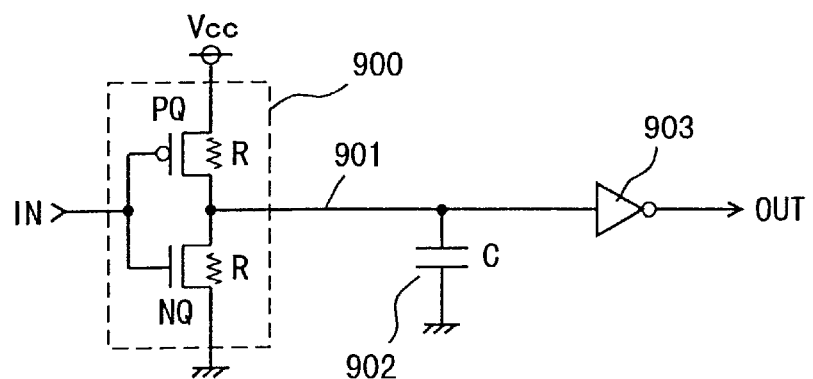
FIG. 55 is a diagram representing an arrangement of a conventional delay circuit.
Figure 56:
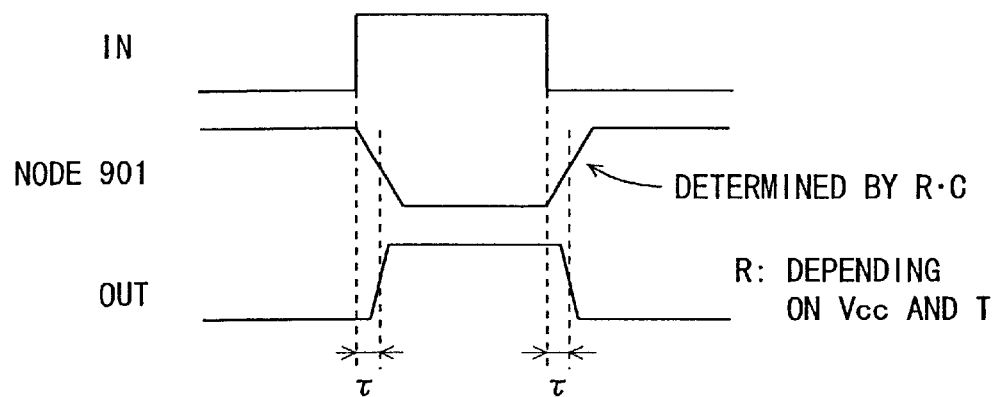
FIG. 56 is a signal waveform diagram representing an operation of the delay circuit shown in FIG. 55.

FIG. 54 is a schematic representation of the arrangement of decoder 151 shown in FIG. 49. In FIG. 54, decoder 151 includes decode circuits 151a, 151b, 151c, and so on provided corresponding to the respective binary values of count CNT, inverter circuits 160a, 160b, and 160c for inverting output signals from decode circuits 151a, 151b, 151c, and so on, and MOS transistors PQ1 to PQ12 and NQ1 to NQ12 provided to these decode circuits 151a, 151b, 151c and inverters 160a, 160b, and 160c for generating current source control signals SRCT<3> to SRCT<0> and DRCT<3> to DRCT<0>.

Decode circuits 151a, 151b, 151c output an H level signal when counts CNT from the up-down counter are binary value "0", "1", and "2", respectively. Thus, these decode circuits 151a, 151b, 151c, and so on, are formed by AND-type decode circuits for example. In the transistor array, P-channel MOS transistors PQ1 to PQ12 have their sources connected to power-supply nodes, N-channel MOS transistors NQ1 to NQ12 have their sources connected to ground nodes. The gates of MOS transistors PQ1 to PQ12 and NQ1 to NQ12 are connected such that the states of the current source control signals satisfy the truth values of FIG. 51. An output signal of decode circuit 151a is applied to the gates of MOS transistors NQ1 to NQ4, and an output signal of inverter circuit 160a is applied to the gates of MOS transistors PQ1 to PQ4. An output signal from decode circuit 151b is applied to MOS transistors NQ5 to NQ8, and an output signal of inverter 160b is applied to MOS transistors PQ5 to PQ8. An output signal from decode circuit 151c is applied to the gates of MOS transistors NQ9 to NQ12, and an output signal of inverter 160c is applied to MOS transistors PQ9 to PQ12.

A signal line that drives control signal SRCT<3> is driven by MOS transistors PQ1, PQ5, and PQ9, and control signal SRCT<2> is driven by MOS transistors PQ2, PQ6, and NQ9. Current source control signal SRCT<1> is driven by MOS transistors PQ3, NQ5, and NQ10. Control signal SRCT<0> is driven by MOS transistors PQ4, PQ7, and PQ10. Control signal DRCT<3> is driven by MOS transistors NQ1, NQ6, and NQ11. Current source control signal DRCT<2> is driven by MOS transistors NQ2, NQ7, and PQ11. Control signal DRCT<1> is driven by MOS transistors NQ3, NQ8, and NQ12. Control signal DRCT<0> is driven by MOS transistors NQ4, PQ8, and PQ12.

For instance, when decode circuit 151b outputs an H level signal, MOS transistors NQ5 to NQ8 attain the on state, while MOS transistors PQ5 to PQ8 similarly attain the on state. The remaining MOS transistors PQ1 to PQ4, PQ9 to PQ12, NQ1 to NQ4, and NQ9 to NQ12 all maintain the off state since output signals from decode circuits 151a and 151c are at the L level. Accordingly, current source control signals SRCT<3:0> and DRCT<3:0> become "1101" and "0001," respectively. Thus, the truth table shown in FIG. 51 can be realized. In the transistor array shown in FIG. 54, a single P-channel MOS transistor and a single N-channel MOS transistor have their positions changed between the case where the output signal from decode circuit 151a is at the H level and the case where the output signal from decode circuit 151b is at the H level. Therefore, in this transistor array, all the states of MOS transistors never change at the same time with respect to the current control signals SRCT <3:0> and DRCT <3:0> so that rapid changes can be suppressed and current source control signals SRCT<3:0> and DRCT<3:0> can be stably generated, resulting in a stable current source control.

The extension of the transistor array can be easily realized by further extending the decode circuits and by utilizing four P-channel MOS transistors and four N-channel MOS transistors and disposing the MOS transistors such that the truth values shown in FIG. 49 are achieved.

Thus, according to the present invention, the change of an output signal from an inverter delay circuit of a preceding stage is suppressed until an output signal from an inverter delay circuit of a subsequent stage is inverted in logic level. Thus, the delay circuit having a constant delay time can be achieved regardless of fluctuations of the operating environment such as the power-supply voltage. Accordingly, the skews between internal signals, even that one caused by interconnection delay and the like, can be reduced using the present delay circuit, and a semiconductor device can be implemented that operates with stability regardless of the operating environment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A delay circuit, comprising:
   a drive circuit for driving an output node according to a first input signal, an output signal at said output node from said drive circuit changing between a first voltage level and a second voltage level;
   a capacitance element;
   a delay control circuit coupled between said output node and said capacitance element for isolating said capacitance element from said output node when the signal on said output node is between said first voltage level and a prescribed voltage level that is between said first voltage level and a second voltage level, and for coupling said capacitance element to said output node when the signal on said output node is between said prescribed voltage level and said second voltage level; and
   an auxiliary drive circuit for driving said output node according to a second input signal when activated, said auxiliary drive circuit being activated in response to the signal on said output node to drive said output node in a direction opposite to a driving direction of said drive circuit, and said auxiliary drive circuit being inactivated when the signal on said output node is between said first voltage level and said prescribed voltage level.

2. The delay circuit according to claim 1, wherein said auxiliary drive circuit includes:
   first and second insulated gate type field effect transistors of a first conductivity type connected in series between said output node and a first power-supply node;
   third and second insulated gate type field effect transistors of a second conductivity type connected in series between said output node and a second power-supply node;
   a first inverter having a first input logic threshold for inverting the signal at said output node and applying the inverted signal to a gate of said first insulated gate type field effect transistor; and
   a second inverter having a second input logic threshold different from said first input logic threshold for inverting the signal at said output node and applying the inverted signal to a gate of said third insulated gate type field effect transistor, said second input signal being applied to gates of the second and fourth insulated gate type field effect transistors.

3. The delay circuit according to claim 1, wherein said second signal is common and leading in phase to the first signal.

4. The delay circuit according to claim 1, wherein said second signal is reverse and leading in phase to the first signal.

5. A delay circuit, comprising:
   a plurality of cascaded inverter circuits; and
   a plurality of auxiliary circuits, provided corresponding to the output nodes of said plurality of cascaded inverter circuits, each for driving the output node of a corresponding inverter circuit in response to the output signal of an inverter circuit located downstream by an odd number of stages from said corresponding inverter circuit.

6. The delay circuit according to claim 5, wherein each of said plurality of auxiliary circuits comprises an inverter circuit.

7. A delay circuit, comprising:
   a first inverter;
   a second inverter for inverting an output signal from said first inverter; and
   a variable current source for supplying, to an output node of said first inverter, a current in a direction preventing change of the output signal from said first inverter in response to an output signal from said second inverter, said variable current source including a plurality of current supplying elements connected in parallel with one another, said plurality of current supplying elements being rendered conductive selectively by a multibit control signal of a pseudo-gray code notation, in said pseudo-gray code notation, in any two successive numeric values of multibits, logical values of a same digit of at least one bit being held at "1."

* * * * *